(12) United States Patent
Oga et al.

(10) Patent No.: US 11,515,300 B2
(45) Date of Patent: Nov. 29, 2022

(54) SEMICONDUCTOR MEMORY DEVICE

(71) Applicant: Kioxia Corporation, Tokyo (JP)

(72) Inventors: Atsushi Oga, Yokkaichi Mie (JP);
Natsuki Fukuda, Yokkaichi Mie (JP);
Moto Yabuki, Bunkyo Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/016,827

(22) Filed: Sep. 10, 2020

(65) Prior Publication Data
US 2021/0288038 A1 Sep. 16, 2021

(30) Foreign Application Priority Data

Mar. 12, 2020 (JP) .............................. JP2020-043224

(51) Int. Cl.
| | | |
|---|---|---|
| H01L 25/18 | (2006.01) | |
| H01L 23/00 | (2006.01) | |
| H01L 27/11582 | (2017.01) | |
| H01L 21/762 | (2006.01) | |

(52) U.S. Cl.
CPC ........ *H01L 25/18* (2013.01); *H01L 21/76224* (2013.01); *H01L 24/05* (2013.01); *H01L 24/08* (2013.01); *H01L 27/11582* (2013.01); *H01L 2224/05554* (2013.01); *H01L 2224/05647* (2013.01); *H01L 2224/0615* (2013.01); *H01L 2224/08145* (2013.01); *H01L 2924/14511* (2013.01)

(58) Field of Classification Search
CPC ... H01L 25/18; H01L 21/76224; H01L 24/05; H01L 24/08; H01L 27/11582
See application file for complete search history.

(56) References Cited

U.S. PATENT DOCUMENTS

| | | | |
|---|---|---|---|
| 9,558,945 B2 | 1/2017 | Fukuzumi | |
| 10,276,585 B2 | 4/2019 | Utsumi | |
| 10,727,215 B1* | 7/2020 | Zhang | ................ G11C 16/0483 |
| 11,211,394 B2* | 12/2021 | Xu | ..................... H01L 27/11565 |
| 2015/0380428 A1 | 12/2015 | Matsuda | |

(Continued)

FOREIGN PATENT DOCUMENTS

| | | |
|---|---|---|
| JP | 2016-62901 A | 4/2016 |
| JP | 2018-026518 A | 2/2018 |
| JP | 2018-142654 A | 9/2018 |

*Primary Examiner* — Nathan W Ha
(74) *Attorney, Agent, or Firm* — Foley & Lardner LLP

(57) ABSTRACT

A semiconductor memory device includes a first chip and a second chip. The first chip includes a semiconductor substrate and a plurality of transistors disposed on a surface of the semiconductor substrate. The second chip includes a plurality of first conductive layers, a plurality of first semiconductor layers, and a plurality of memory cells disposed in intersection portions of the plurality of first conductive layers and the plurality of first semiconductor layers. The second chip includes a second semiconductor layer farther from the semiconductor substrate than the plurality of first conductive layers. The second semiconductor layer is connected to the plurality of first semiconductor layers and a first insulating layer that includes a part farther from the semiconductor substrate than a surface on a side opposite to the semiconductor substrate of the second semiconductor layer and a part closer to the semiconductor substrate than the surface.

14 Claims, 48 Drawing Sheets

(56) References Cited

U.S. PATENT DOCUMENTS

| | | | |
|---|---|---|---|
| 2018/0323213 A1 | 11/2018 | Arai | |
| 2020/0251443 A1* | 8/2020 | Kanakamedala | ............................ H01L 21/31144 |
| 2020/0279841 A1* | 9/2020 | Sanuki | .................. H01L 23/481 |
| 2020/0279862 A1* | 9/2020 | Rajashekhar | ..... H01L 27/11575 |
| 2020/0279863 A1* | 9/2020 | Liu | .................... H01L 27/11556 |
| 2020/0286875 A1* | 9/2020 | Nishida | ............. H01L 27/11573 |
| 2020/0295037 A1* | 9/2020 | Iijima | ..................... H01L 24/09 |
| 2020/0303408 A1* | 9/2020 | Yoshimizu | .............. H01L 24/08 |
| 2020/0350329 A1* | 11/2020 | Kanamori | ......... H01L 27/11582 |
| 2020/0402992 A1* | 12/2020 | Otsu | .................. H01L 27/1157 |
| 2021/0028111 A1* | 1/2021 | Kai | ..................... H01L 23/5226 |
| 2021/0036008 A1* | 2/2021 | Yun | .................... H01L 27/11582 |
| 2021/0057427 A1* | 2/2021 | Oh | ........................... H01L 24/80 |
| 2021/0210504 A1* | 7/2021 | Otsu | ................. H01L 27/11582 |

* cited by examiner

SEMICONDUCTOR MEMORY DEVICE

CROSS-REFERENCE TO RELATED APPLICATIONS

This application is based upon and claims the benefit of Japanese Patent Application No. 2020-043224, filed on Mar. 12, 2020, the entire contents of which are incorporated herein by reference.

BACKGROUND

Field

Embodiments described herein relate generally to a semiconductor memory device.

Description of the Related Art

There has been known a semiconductor memory device that includes a first chip and a second chip connected to one another.

DETAILED DESCRIPTION

Figure 1:
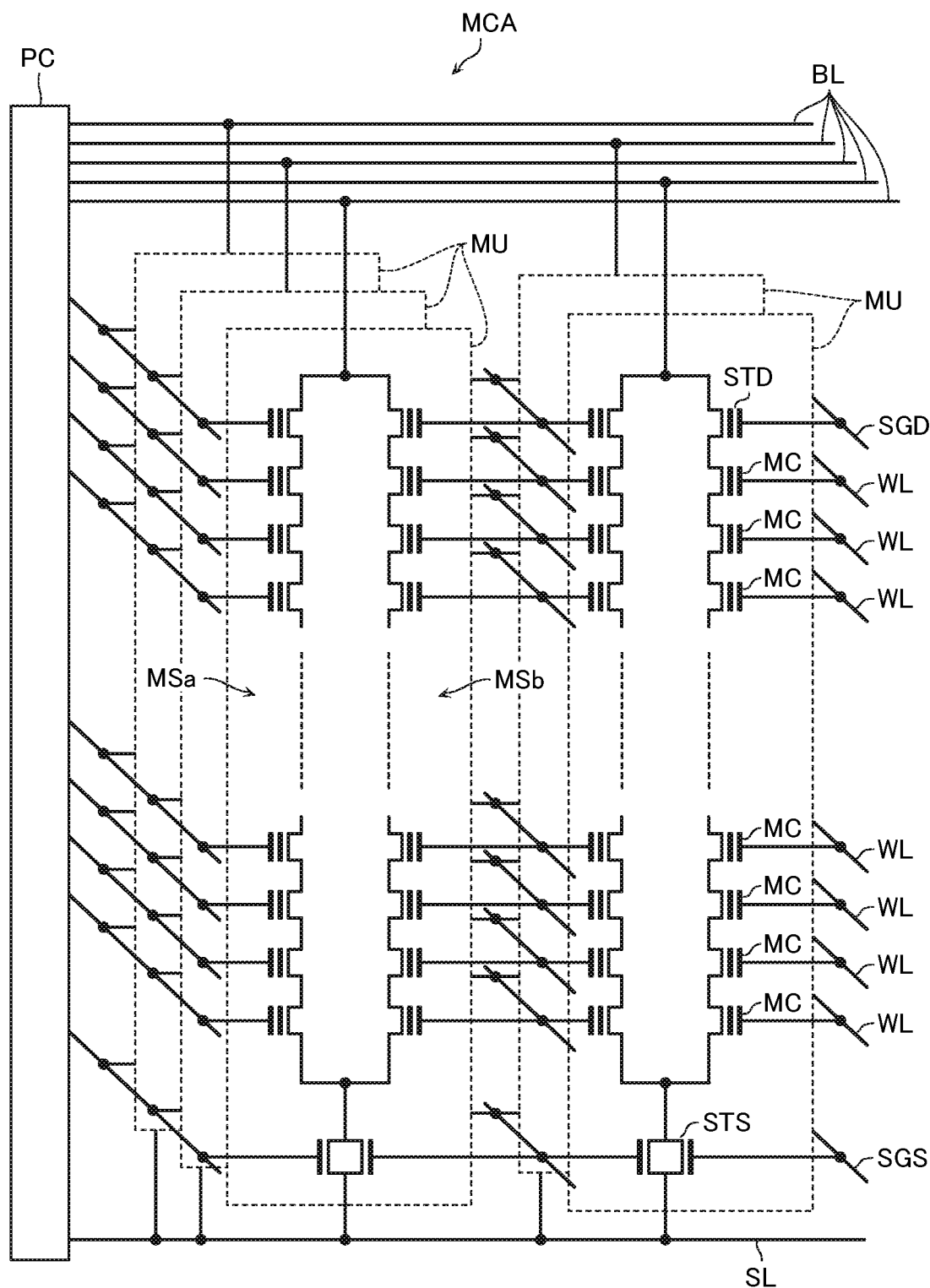
FIG. 1 is a schematic equivalent circuit diagram of a semiconductor memory device according to a first embodiment.

A semiconductor memory device according to one embodiment includes a first chip and a second chip connected to one another. The first chip includes: a semiconductor substrate; and a plurality of transistors disposed on a surface of the semiconductor substrate. The second chip includes: a plurality of first conductive layers arranged in a first direction intersecting with the surface of the semiconductor substrate, the plurality of first conductive layers extending in a second direction intersecting with the first direction; a plurality of first semiconductor layers arranged in the second direction and extending in the first direction, the plurality of first semiconductor layers including a first region and a second region, the first region being opposed to the plurality of first conductive layers, the second region being farther from the semiconductor substrate than the plurality of first conductive layers; a plurality of memory cells disposed in intersection portions of the plurality of first conductive layers and the first region of the plurality of first semiconductor layers; a second semiconductor layer that is farther from the semiconductor substrate than the plurality of first conductive layers, the second semiconductor layer being connected to the second region of the plurality of first semiconductor layers and extending in the second direction; and a first insulating layer that includes a first part and a second part, the first part being farther from the semiconductor substrate than a surface on a side opposite to the semiconductor substrate of the second semiconductor layer, the second part being closer to the semiconductor substrate than the surface on the side opposite to the semiconductor substrate of the second semiconductor layer.

Next, the semiconductor memory devices according to embodiments are described in detail with reference to the accompanying drawings. The following embodiments are only examples, and are not described for the purpose of limiting the present invention.

The respective drawings are schematic, and a part of a configuration or the like is sometimes omitted. Common reference numerals may be given to parts common to the respective embodiments to omit the descriptions.

In this specification, a predetermined direction parallel to a surface of a substrate is referred to as an X-direction, a direction parallel to the surface of the substrate and perpendicular to the X-direction is referred to as a Y-direction, and a direction perpendicular to the surface of the substrate is referred to as a Z-direction.

In this specification, a direction along a predetermined surface may be referred to as a first direction, a direction along this predetermined surface and intersecting with the first direction may be referred to as a second direction, and a direction intersecting with this predetermined surface may be referred to as a third direction. These first direction, second direction, and third direction may correspond to any of the X-direction, the Y-direction, and the Z-direction or need not to correspond to these directions.

Expressions such as "above" and "below" in this specification are based on the substrate. For example, a direction away from the substrate along the first direction is referred to as above and a direction approaching the substrate along the first direction is referred to as below. A lower surface and a lower end of a certain configuration mean a surface and an end portion on the substrate side of this configuration. A top surface and an upper end of a certain configuration mean a surface and an end portion on a side opposite to the substrate of this configuration. A surface intersecting with the second direction or the third direction is referred to as a side surface or the like.

In this specification, when referring to a "width" or a "thickness" in the predetermined direction of a configuration, a member, or the like, this may mean a width or a thickness in a cross-sectional surface or the like observed by Scanning electron microscopy (SEM), Transmission electron microscopy (TEM), or the like.

First Embodiment

[Configuration]

FIG. 1 is a schematic equivalent circuit diagram of a semiconductor memory device according to the first embodiment.

The semiconductor memory device according to the embodiment includes a memory cell array MCA and a peripheral circuit PC controlling the memory cell array MCA.

The memory cell array MCA includes a plurality of memory units MU. The plurality of memory units MU each include two memory strings MSa, MSb electrically independent from one another. One ends of these memory strings MSa, MSb are each connected to a drain-side select transistor STD and connected to a common bit line BL via the drain-side select transistors STD. The other ends of the memory strings MSa, MSb are connected to a common source-side select transistor STS and connected to a common source line SL via the source-side select transistor STS.

The memory strings MSa, MSb each include a plurality of memory cells MC connected in series. The memory cell MC is a field-effect type transistor that includes a semiconductor layer, a gate insulating layer, and a gate electrode. The semiconductor layer functions as a channel region. The gate insulating layer includes an electric charge accumulating film that can store data. A threshold voltage of the memory cell MC changes according to an amount of electric charge in the electric charge accumulating film. The gate electrode is apart of a word line WL.

The select transistor (STD, STS) is a field-effect type transistor that includes a semiconductor layer, a gate insulating layer, and a gate electrode. The semiconductor layer functions as a channel region. The gate electrode of the drain-side select transistor STD is a part of the drain-side select gate line SGD. The gate electrode of the source-side select transistor STS is a part of a source-side select gate line SGS.

The peripheral circuit PC generates voltages required to, for example, a read operation, a write operation, and an erase operation and applies the voltages to the bit line BL, the source line SL, the word line WL, and the select gate line (SGD, SGS). The peripheral circuit PC includes, for example, a row decoder, a sense amplifier module, a voltage generation circuit, a sequencer, circuits for various kinds of registers and the like. For example, the peripheral circuit PC includes a plurality of transistors and wirings disposed on a chip different from that of the memory cell array MCA.

[Exemplary Configuration of Memory Die MD]

Figure 2:
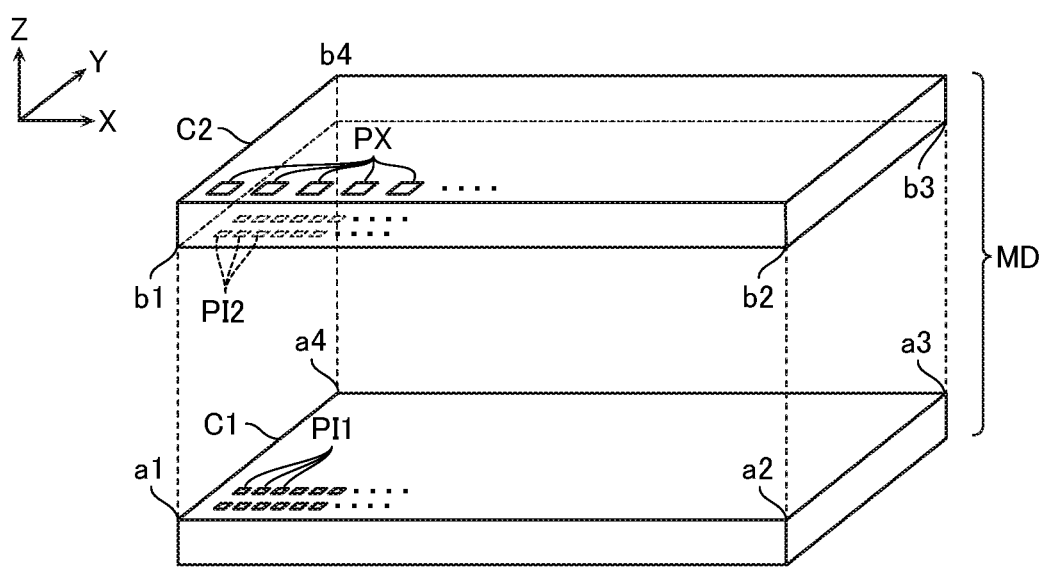
FIG. 2 is a schematic perspective view of the semiconductor memory device.

FIG. 2 is a schematic perspective view illustrating an exemplary configuration of the semiconductor memory device according to the embodiment. The semiconductor memory device according to the embodiment includes the memory die MD. The memory die MD includes a first chip C1 and a second chip C2. The first chip C1 includes the peripheral circuit PC (FIG. 1). The second chip C2 includes the memory cell array MCA (FIG. 1).

Hereinafter, in the first chip C1, a surface on which a plurality of first bonding electrodes PI1 are disposed is referred to as a front surface and a surface on a side opposite to the front surface is referred to as a back surface. In the second chip C2, a surface on which a plurality of second bonding electrodes PI2 are disposed is referred to as a front surface and a surface on which a plurality of external pad electrodes PX are disposed is referred to as a back surface. The front surface of the first chip C1 is disposed above the back surface of the first chip C1, and the back surface of the second chip C2 is disposed above the front surface of the second chip C2.

The first chip C1 and the second chip C2 are arranged such that the front surface of the first chip C1 is opposed to the front surface of the second chip C2. The plurality of first bonding electrodes PI1 are disposed on the front surface of the first chip C1. The plurality of second bonding electrodes PI2 are disposed on the front surface of the second chip C2. The plurality of external pad electrodes PX are disposed on the back surface of the second chip C2. The respective plurality of second bonding electrodes PI2 are disposed corresponding to the plurality of first bonding electrodes PI1 and arranged at positions bondable to the plurality of first bonding electrodes PI1. The first bonding electrodes PI1 and the second bonding electrodes PI2 function as bonding electrodes that bond the first chip C1 and the second chip C2 together and electrically conduct the first chip C1 and the second chip C2. The first bonding electrode PI1 and the second bonding electrode PI2 contain, for example, a conductive material, such as copper (Cu).

In the example of FIG. 2, corner portions a1, a2, a3, a4 of the first chip C1 correspond to corner portions b1, b2, b3, b4 of the second chip C2, respectively.

Figure 3:
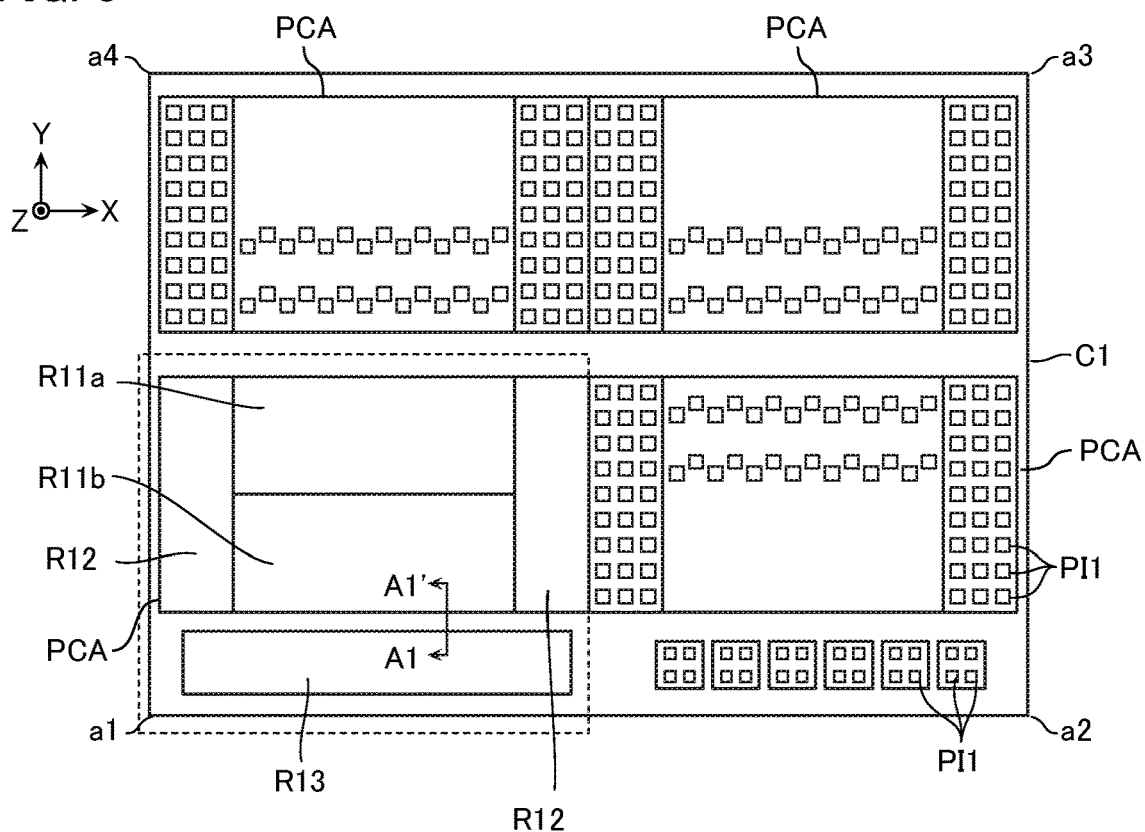
FIG. 3 is a schematic plan view of the semiconductor memory device.
Figure 4:
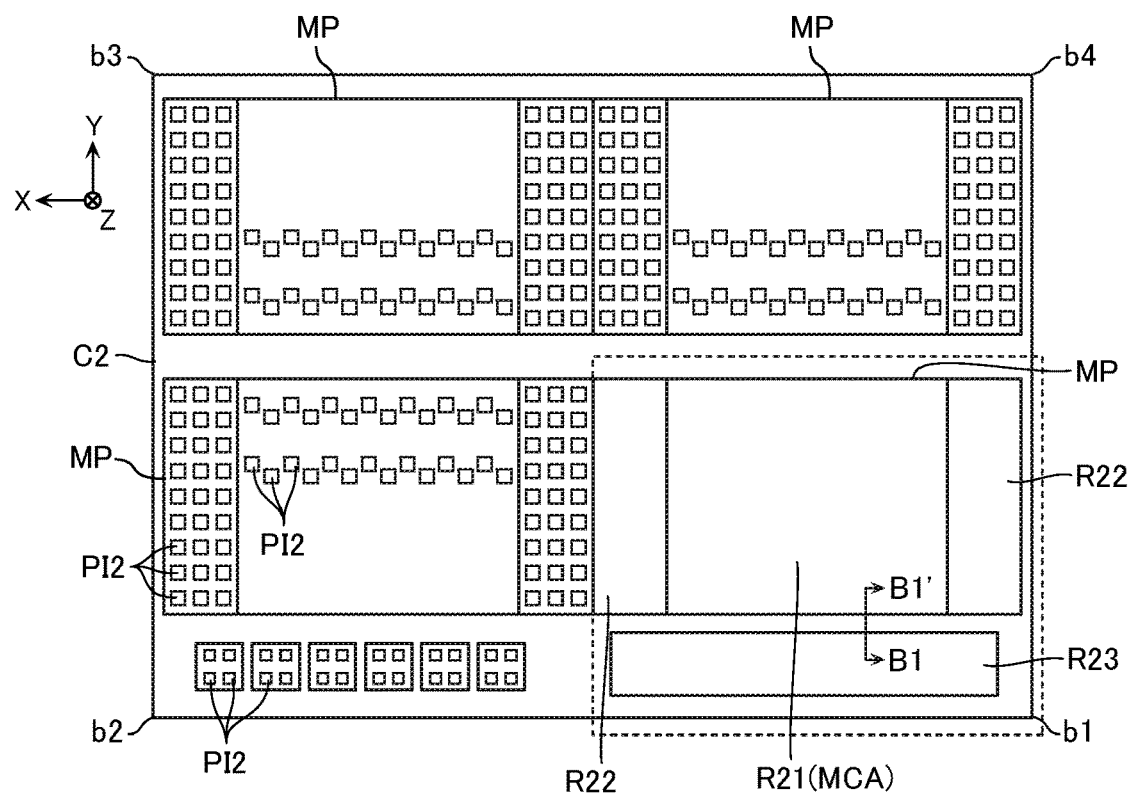
FIG. 4 is a schematic bottom view of the semiconductor memory device.

FIG. 3 is a schematic plan view illustrating an exemplary configuration of the first chip C1. A part surrounded by the dotted line at the lower left of FIG. 3 illustrates a structure inside the front surface of the first chip C1 on which the plurality of first bonding electrodes PI1 are disposed. FIG. 4 is a schematic bottom view illustrating an exemplary configuration of the second chip C2. Apart surrounded by the dotted line at the lower right of FIG. 4 illustrates a structure inside the front surface of the second chip C2 on which the plurality of second bonding electrodes PI2 are disposed.

Figure 5A:
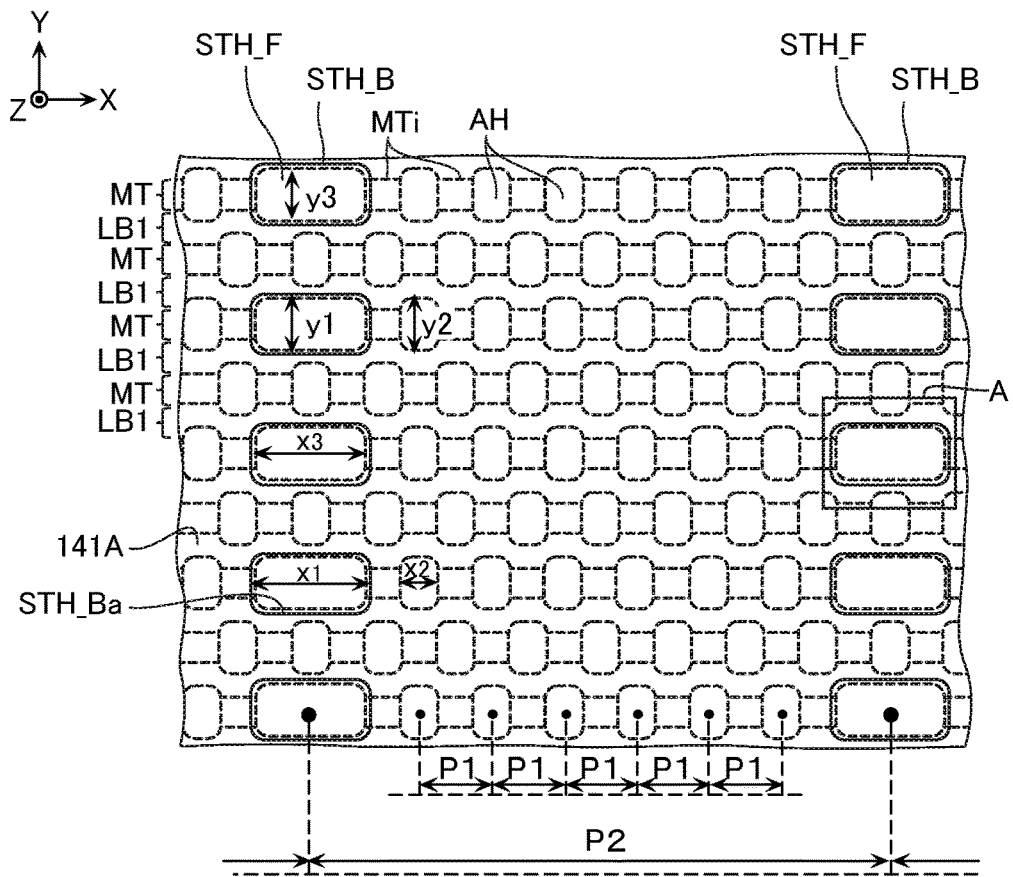
FIG. 5A is a schematic plan view of the semiconductor memory device.
Figure 5B:
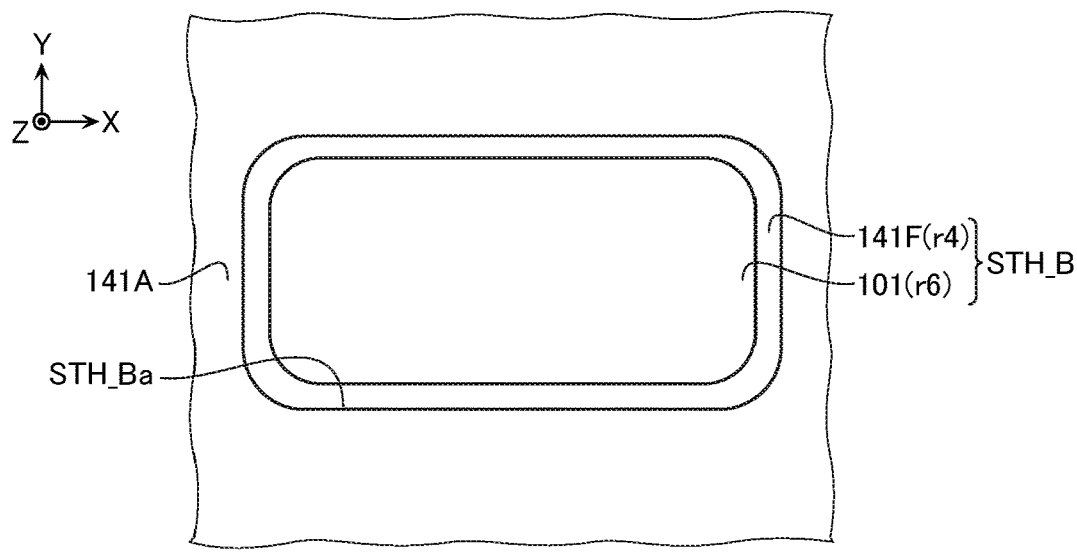
FIG. 5B is a schematic plan view illustrating an enlarged part in FIG. 5A.
Figure 5C:
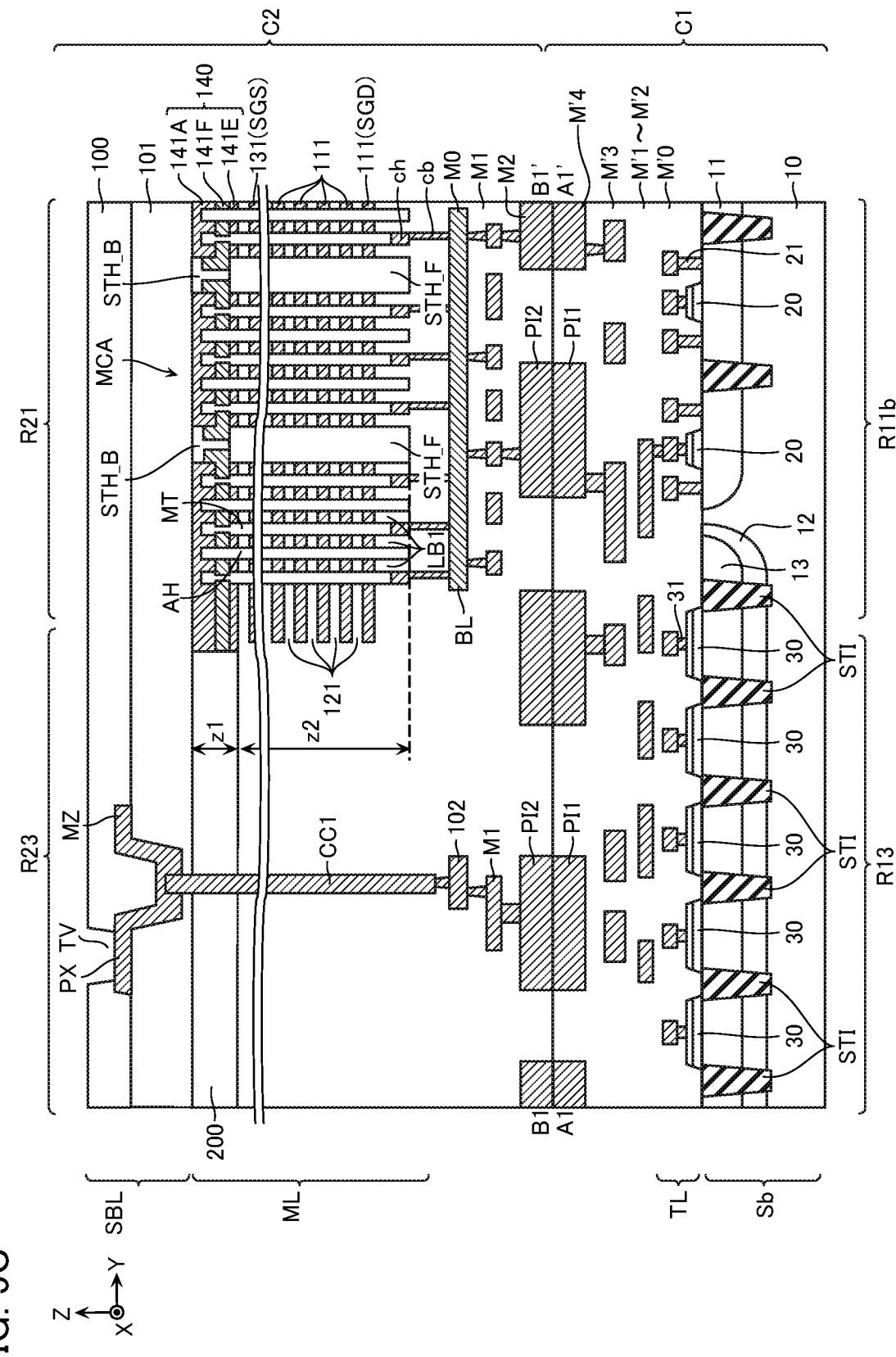
FIG. 5C is a schematic cross-sectional view corresponding to the line A1-A1' in FIG. 3 and the line B1-B1' in FIG. 4.
Figure 6A:
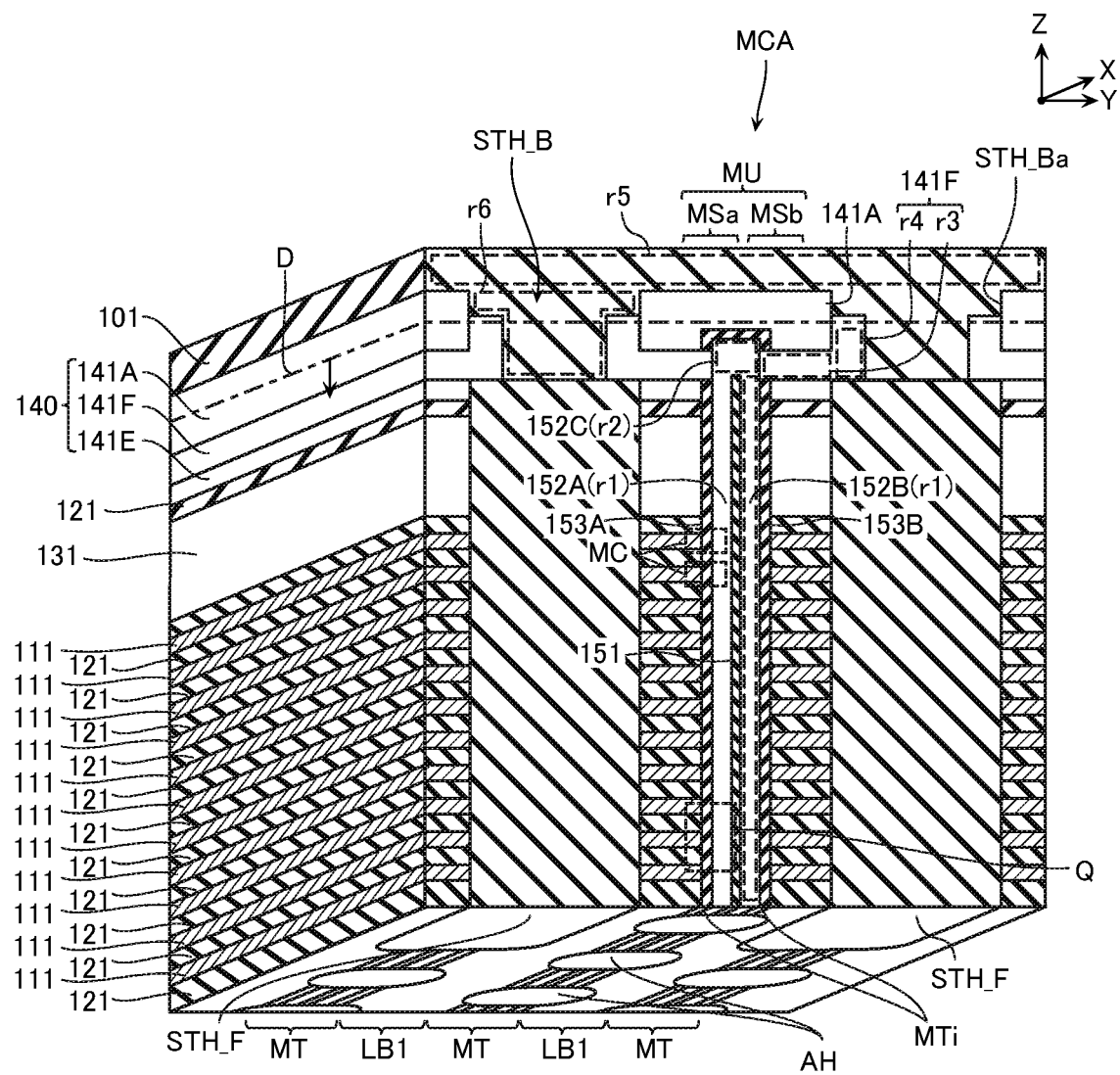
FIG. 6A is a schematic perspective view of the semiconductor memory device.
Figure 6B:
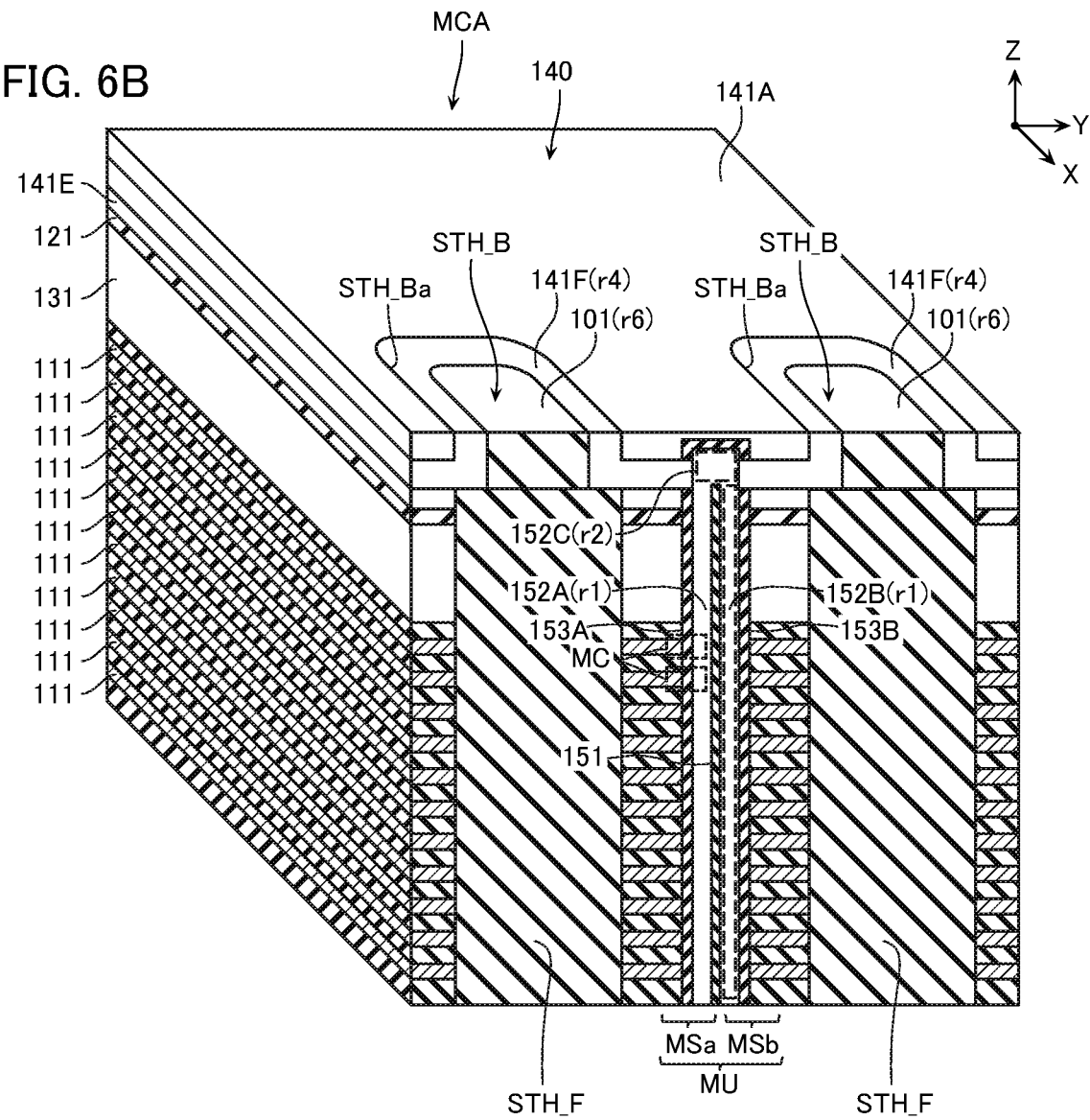
FIG. 6B is a schematic perspective view of the semiconductor memory device.
Figure 7:
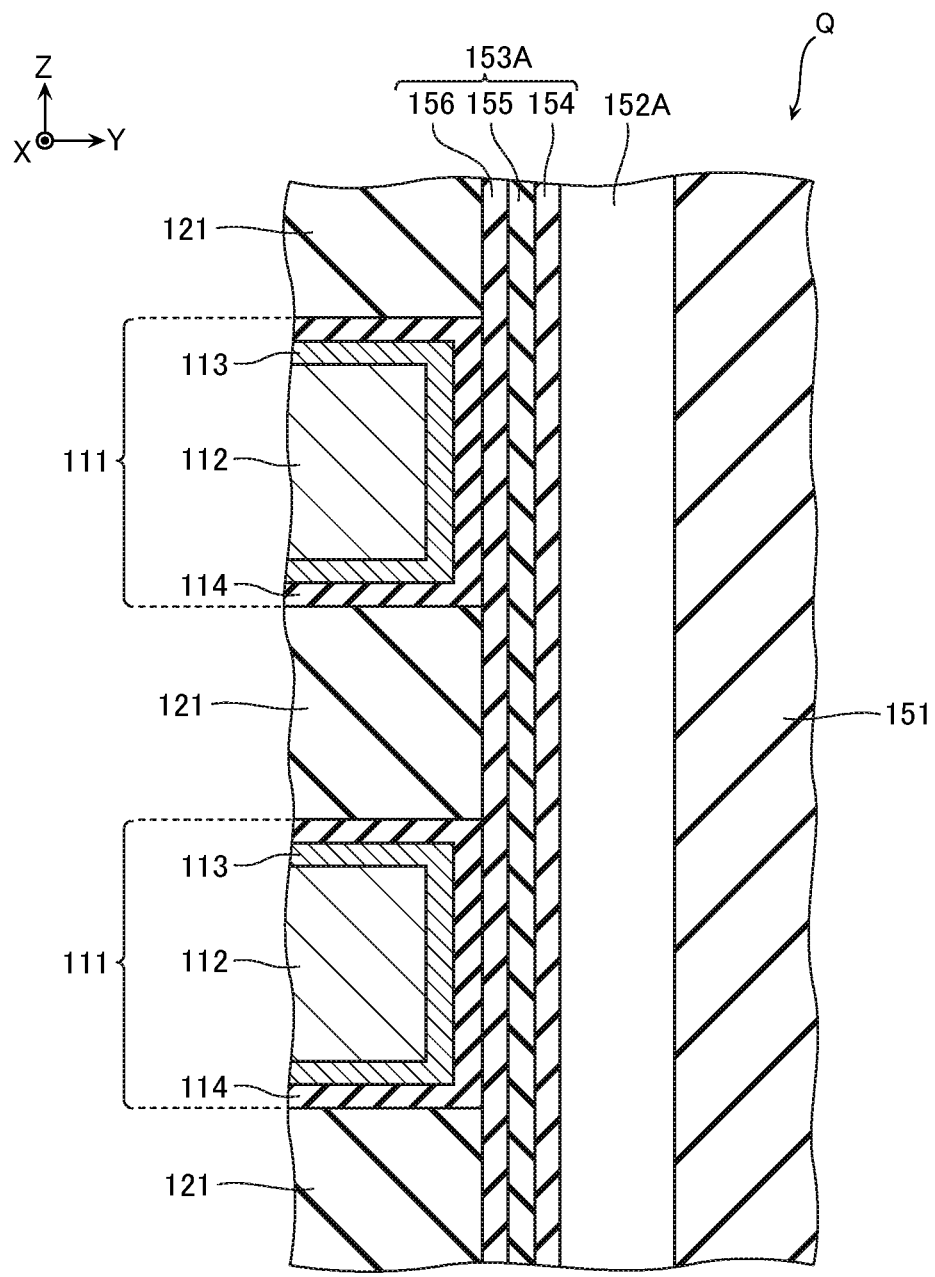
FIG. 7 is an enlarged view of a part indicated by Q in FIG. 6A.

FIG. 5A is a schematic X-Y cross-sectional view illustrating a part of a configuration of the second chip C2. FIG. 5B is an enlarged view of a part indicated by A in FIG. 5A. FIG. 5C is a schematic cross-sectional view corresponding to the line A1-A1' in FIG. 3 and the line B1-B1' in FIG. 4 and illustrates a cross-sectional surface when the structure illustrated in FIG. 3 and FIG. 4 is taken along each line and viewed in the arrow direction. FIG. 6A and FIG. 6B are schematic perspective views enlarging a part of the memory cell array MCA. Note that FIG. 5A and FIG. 5B and a top surface of the structure illustrated in FIG. 6B correspond to a cross-sectional surface taking the structure illustrated in FIG. 6A along the one dot chain line indicated by D in FIG. 6A and viewed in the arrow direction. FIG. 7 is an enlarged view of a part indicated by Q in FIG. 6A.

[First Chip C1]

For example, as illustrated in FIG. 3, the first chip C1 includes four peripheral circuit areas PCA arranged in the X-direction and the Y-direction. The peripheral circuit area PCA includes a region R11a and a region R11b arranged in the Y-direction, and regions R12 disposed on one end side and the other end side in the X-direction of the region R11a and the region R11b. The first chip C1 includes a region R13.

For example, as illustrated in FIG. 5C, the first chip C1 includes a semiconductor substrate layer Sb, a transistor layer TL disposed above the semiconductor substrate layer Sb, and a plurality of wiring layers M'0, M'1, M'2, M'3, M'4 disposed above the transistor layer TL.

For example, the semiconductor substrate layer Sb includes a P-type semiconductor region 10, a P-type well layer 11 disposed above apart of the P-type semiconductor region 10, an N-type well layer 12, and a P-type well layer 13 disposed above apart of the P-type semiconductor region 10 and the N-type well layer 12. For example, the P-type semiconductor region 10 and the P-type well layers 11, 13 are semiconductor regions of single-crystal silicon (Si) or the like containing P-type impurities, such as boron (B). For example, the N-type well layer 12 is a semiconductor region containing N-type impurities, such as phosphorus (P). On a part of the surface of the semiconductor substrate layer Sb, insulating regions STI, such as silicon oxide, are disposed.

The transistor layer TL includes, for example, a plurality of transistors 20 disposed in the regions R11a, R11b (FIG. 3), and a plurality of contacts 21 connected to the plurality of transistors 20. Among the plurality of transistors 20 and contacts 21, the transistors 20 and the contacts 21 disposed in the region R11a (FIG. 3) constitute the sense amplifier modules. Among the plurality of transistors 20 and contacts 21, the transistors 20 and the contacts 21 disposed in the region R11b (FIG. 3) constitute a part of the peripheral circuit PC.

The transistor layer TL includes, for example, a plurality of transistors 30 and a plurality of contacts 31 connected to the plurality of transistors 30 disposed in the region R13. The plurality of transistors 30 and contacts 31 constitute a part of the peripheral circuit PC.

The transistor layer TL constitutes a switch circuit in the row decoder as a part of the peripheral circuit PC with the plurality of transistors and contacts disposed in the region R12 (FIG. 3).

The wiring layer M'0 is disposed above the transistor layer TL. The wiring layer M'0 is a wiring layer containing, for example, a conductive material, such as tungsten (W). The wiring layer M'1 is disposed above the wiring layer M'0. The wiring layer M'1 is a wiring layer containing, for example, a conductive material, such as copper (Cu). Although FIG. 5C omits the illustration, the wiring layer M'2 is disposed above the wiring layer M'1. The wiring layer M'2 is a wiring layer containing, for example, a conductive material, such as copper (Cu). The wiring layer M'3 is a wiring layer containing, for example, a conductive material, such as copper (Cu) or aluminum (Al). The wiring layer M'4 is a wiring layer containing, for example, a conductive material, such as copper (Cu), and includes the plurality of first bonding electrodes PI1.

[Second Chip C2]

For example, as illustrated in FIG. 4, the second chip C2 includes four memory planes MP arranged in the X-direction and the Y-direction corresponding to the peripheral circuit area PCA. The memory plane MP includes the memory cell array MCA. The memory plane MP includes a region R21 disposed in a region opposed to the region R11a and the region R11b and regions R22 disposed in regions opposed to the regions R12. The second chip C2 includes a region R23 disposed in a region on one end side in the Y-direction relative to the four memory planes MP and disposed in a region opposed to the region R13.

For example, as illustrated in FIG. 5C, the second chip C2 includes a substrate layer SBL, a memory layer ML disposed below the substrate layer SBL, and a plurality of wiring layers M0, M1, M2 disposed below the memory layer ML.

The substrate layer SBL includes an insulating layer 100 disposed on the back surface of the second chip C2 and an insulating layer 101 disposed below the insulating layer 100. The insulating layer 100 and the insulating layer 101 include, for example, an insulating single layer film, such as silicon oxide ($SiO_2$) or silicon nitride ($Si_3O_4$), or a stacked film formed of a plurality of insulating layers, such as silicon oxide and silicon nitride. The insulating layer 100 functions as a passivation film on the back surface side of the second chip C2.

For example, as illustrated in FIG. 5C, the substrate layer SBL includes a back side wiring MZ disposed in the insulating layer 100 and the insulating layer 101 in the region R23. The back side wiring MZ is a wiring layer containing, for example, a conductive material, such as aluminum (Al). Apart of the back side wiring MZ is exposed to the outside of the memory die MD via an opening TV disposed in the insulating layer 100 to function as the external pad electrode PX.

As illustrated in FIG. 5C, the memory layer ML includes, for example, a plurality of through electrodes CC1 disposed in the region R23. The through electrode CC1 has an upper end connected to the back side wiring MZ and a lower end connected to a wiring 102 in the wiring layer M0. The through electrode CC1 functions as a connection electrode between the first chip C1 and the external pad electrode PX. The through electrode CC1 contains, for example, a conductive material, such as tungsten (W).

The wiring layer M0 is disposed below the memory layer ML. The wiring layer M0 is a wiring layer containing, for example, a conductive material, such as copper (Cu). The wiring layer M0 includes, for example, the bit line BL and the wiring 102. The wiring layer M1 is disposed below the wiring layer M0. The wiring layer M1 is a wiring layer containing, for example, a conductive material, such as copper (Cu) or aluminum (Al). The wiring layer M2 is disposed below the wiring layer M1. The wiring layer M2 is a wiring layer containing, for example, a conductive material, such as copper (Cu) and includes the plurality of second bonding electrodes PI2.

[Memory Cell Array MCA]

For example, as illustrated in FIG. 5C, the memory layer ML includes the memory cell array MCA disposed in the region R21. For example, as illustrated in FIG. 5A and FIG. 5C, the memory cell array MCA includes a plurality of stacked structures LB1 arranged in the Y-direction, memory trench structures MT disposed between the stacked structures LB1, and a semiconductor layer 140 disposed above the stacked structures LB1 and the memory trench structures MT.

For example, as illustrated in FIG. 6A, the stacked structure LB1 includes a plurality of conductive layers 111 arranged in the Z-direction, a plurality of insulating layers 121 disposed between the plurality of conductive layers 111, and a conductive layer 131 disposed above the plurality of conductive layers 111.

The conductive layers 111 are substantially plate-shaped conductive layers extending in the X-direction and arranged in the Z-direction. Apart of the plurality of conductive layers 111 function as the word lines WL (FIG. 1) and the gate electrodes of the plurality of memory cells MC (FIG. 1) connected to the word lines WL. Among the plurality of conductive layers 111, one or the plurality of conductive layers 111 disposed on the lower side further functions as the drain-side select gate line SGD (FIG. 1) and the gate electrodes of the plurality of drain-side select transistors STD (FIG. 1) connected to the drain-side select gate line SGD.

The insulating layer 121 functions as a layer that insulates between the plurality of conductive layers 111. The insulating layer 121 may contain, for example, an insulating material, such as silicon oxide ($SiO_2$).

The conductive layer 131 functions as the source-side select gate line SGS (FIG. 1) and the gate electrodes of the plurality of source-side select transistors STS (FIG. 1) connected to the source-side select gate line SGS. The conductive layer 131 may contain, for example, polycrystalline silicon or the like containing impurities, such as phosphorus or boron.

For example, as illustrated in FIG. 5A and FIG. 6A, the memory trench structures MT have a substantially plate-shaped structure arranged in the Y-direction and extending in the Z-direction and the X-direction and include the plurality of memory cells MC.

For example, as illustrated in FIG. 5A, the memory trench structure MT includes a plurality of stacked structures MTi arranged in the X-direction and a plurality of hole structures AH arranged in the X-direction. Additionally, the even-numbered or odd-numbered memory trench structure MT counted from one side in the Y-direction includes a plurality of hole structures STH_F arranged in the X-direction.

The stacked structures MTi each function as the memory unit MU (FIG. 1). For example, as illustrated in FIG. 6A, the stacked structure MTi includes a semiconductor layer 152A and a semiconductor layer 152B extending in the Z-direction, a gate insulating layer 153A disposed between the semiconductor layer 152A and the conductive layers 111, agate insulating layer 153B disposed between the semiconductor layer 152B and the conductive layers 111, a semiconductor layer 152C connected to upper ends of the semiconductor layer 152A and the semiconductor layer 152B, and an insulating layer 151, such as silicon oxide ($SiO_2$), embedded between the semiconductor layer 152A and the semiconductor layer 152B.

The semiconductor layer 152A is opposed to the plurality of conductive layers 111 and the conductive layer 131 and functions as a channel region of the plurality of memory cells MC corresponding to the memory string MSa (FIG. 1), the drain-side select transistors STD, and the source-side select transistor STS.

The semiconductor layer 152B is opposed to the plurality of conductive layers 111 and the conductive layer 131 and functions as a channel region of the plurality of memory cells MC corresponding to the memory string MSb (FIG. 1), the drain-side select transistors STD, and the source-side select transistor STS.

Note that, in the following description, the semiconductor layer 152A, 152B may be referred to as, for example, a "region r1" of the semiconductor layer. In following description, the semiconductor layer 152C may be referred to as, for example, a "region r2" of the semiconductor layer.

The hole structure AH, STH_F includes, for example, an insulating layer, such as silicon oxide ($SiO_2$). For example, as illustrated in FIG. 5A, the hole structures AH are arrayed at a first period P1 in the X-direction. The hole structures STH_F are arrayed at a second period P2 in the X-direction. The second period P2 is larger than the first period P1. The hole structures AH are arranged in a staggered pattern such that positions in the X-direction of the hole structures AH differ between in the two memory trench structures MT adjacent in the Y-direction. The hole structures STH_F are arrayed in a matrix in the X-direction and the Y-direction. FIG. 5A denotes widths in the X-direction and the Y-direction of the hole structure STH_F as a width x1 and a width y1, respectively, and denotes widths in the X-direction and the Y-direction of the hole structure AH as a width x2 and a width y2, respectively. The width x1 is larger than the widths y1, y2. The widths y1, y2 have a similar size. The widths y1, y2 are larger than the width x2.

For example, as illustrated in FIG. 6A and FIG. 6B, the semiconductor layer 140 includes a semiconductor layer 141E, a semiconductor layer 141F disposed above the semiconductor layer 141E, and a semiconductor layer 141A disposed above the semiconductor layer 141E. The semiconductor layer 141A, the semiconductor layer 141E, and the semiconductor layer 141F function as a part of the source line SL (FIG. 1). The semiconductor layer 141A, the semiconductor layer 141E, and the semiconductor layer 141F may contain, for example, polycrystalline silicon or the like containing impurities, such as phosphorus.

The semiconductor layers 141E are arranged in the Y-direction corresponding to the plurality of stacked structures LB1 arranged in the Y-direction and extend in the X-direction corresponding to the stacked structures LB1.

For example, as illustrated in FIG. 6A, the semiconductor layer 141F includes a substantially plate-shaped region r3 extending in the X-direction and the Y-direction and a region r4 disposed at a position corresponding to a hole STH_Ba described below. The region r3 has a top surface in contact with the semiconductor layer 141A and a lower surface in contact with the semiconductor layer 141E. In the example of FIG. 6A, the region r4 is in contact with an inner peripheral surface of the hole STH_Ba described below.

For example, as illustrated in FIG. 6A and FIG. 6B, the semiconductor layer 141A includes the holes STH_Ba. For example, as illustrated in FIG. 5A, the holes STH_Ba are arranged in the X-direction and the Y-direction on a predetermined X-Y cross-sectional surface. For example, as illustrated in FIG. 5B and FIG. 6B, at least one of the region r4 of the semiconductor layer 141F and a part of the insulating layer 101 is disposed inside the hole STH_Ba. Additionally, on the X-Y cross-sectional surface as illustrated in FIG. 5B, outer peripheral surfaces of these configurations are surrounded by an inner peripheral surface of the hole STH_Ba disposed in the semiconductor layer 141F. For example, as illustrated in the drawing, when the semiconductor layer 141F is disposed inside the hole STH_Ba, the inner peripheral surface of the hole STH_Ba (side surfaces of the semiconductor layer 141F) may be in contact with the outer peripheral surface of the semiconductor layer 141F. When the semiconductor layer 141F is not disposed inside the hole STH_Ba, the inner peripheral surface of the hole STH_Ba may be in contact with the outer peripheral surface of a part of the insulating layer 101. In the following description, the structure disposed inside the hole STH_Ba may be referred to as, for example, a "hole structure STH_B."

As illustrated in FIG. 6A as an example, the insulating layer 101 includes a substantially plate-shaped region r5 extending in the X-direction and the Y-direction and a region r6 disposed at a position corresponding to the hole STH_Ba. The region r5 has a lower surface in contact with the semiconductor layer 141A. The region r6 projects below and is connected to the semiconductor layer 141F, the semiconductor layer 141E, and the hole structure STH_F. In the example of FIG. 6A and FIG. 6B, the region r6 is in contact with the inner peripheral surface of the hole STH_Ba.

As illustrated in FIG. 5A, when viewed in the Z-direction, the plurality of hole structures STH_B are disposed at positions overlapping with the hole structures STH_F. Widths x3, y3 in the X-direction and the Y-direction of the hole structure STH_B have sizes similar to those of the widths x1, y1 in the X-direction and the Y-direction of the hole structure STH_F, respectively.

As illustrated in FIG. 5C, the hole structure STH_B has a width z1 in the Z-direction. The hole structure AH and the hole structure STH_F have a width z2 in the Z-direction. The width z1 is smaller than the width z2.

FIG. 7 illustrates an enlarged view of a part indicated by Q in FIG. 6A. The conductive layer 111 includes a conductive film 112, a barrier metal film 113 that covers a top surface, a lower surface, and a side surface of the conductive film 112, and a high-dielectric insulating layer 114 that covers a top surface, a lower surface, and a side surface of the barrier metal film 113. The conductive film 112 is, for example, a metal film, such as tungsten (W). The barrier metal film 113 is, for example, a metal film, such as titanium nitride (TiN). The high-dielectric insulating layer 114 is, for example, a metal oxide film, such as alumina ($Al_2O_3$).

The gate insulating layer 153A includes a tunnel insulating layer 154, such as silicon oxide ($SiO_2$), an electric charge accumulating film 155, such as silicon nitride (SiN), and a block insulating layer 156, such as silicon oxide ($SiO_2$). The tunnel insulating layer 154, the electric charge accumulating film 155, and the block insulating layer 156 extend in the Z-direction. Note that the gate insulating layer 153B (FIG. 6A) has a configuration similar to that of the gate insulating layer 153A.

[Manufacturing Method]

Next, the method for manufacturing the semiconductor memory device according to the embodiment will be described. The method for manufacturing the semiconductor memory device according to the embodiment manufactures, for example, a first wafer W1 (see FIG. 21) that includes the configuration of the first chip C1 and a second wafer W2 (see FIG. 21) the includes the configuration of the second chip C2. Next, the first wafer W1 and the second wafer W2 are bonded (see FIG. 22), a back surface process is performed on the second wafer W2, and a configuration formed by this process is chipped by means such as dicing.

For example, the first wafer W1 is manufactured by forming the transistor layer TL and the plurality of wiring layers M'0, M'1, M'2, M'3, M'4 disposed above the transistor layer TL on the semiconductor substrate layer Sb before dicing by the known method.

Next, with reference to FIG. 8 to FIG. 20, a method for manufacturing the second wafer W2 will be described. FIG. 8, FIG. 10, FIG. 12, FIG. 14, and FIG. 15 are schematic cross-sectional views corresponding to the part indicated by the line A-A' in the plan views illustrated in FIG. 9, FIG. 11, FIG. 13, and FIG. 16. FIG. 17, FIG. 18, FIG. 19, and FIG. 20 are schematic cross-sectional views corresponding to the part indicated by the line B-B' in the plan view illustrated in FIG. 16.

Figure 8:
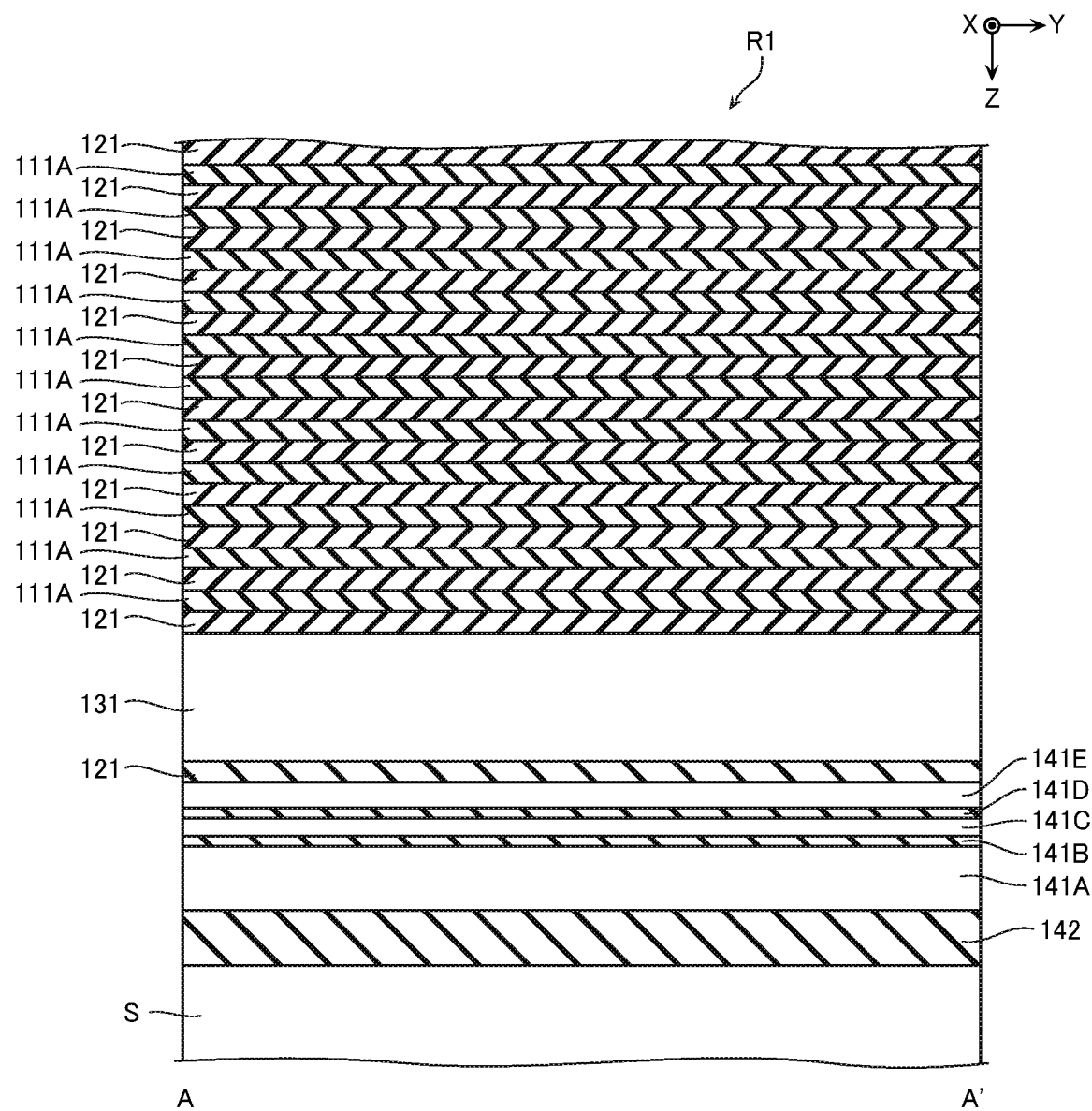
FIG. 8 is a schematic cross-sectional view illustrating a method for manufacturing the semiconductor memory device.

As illustrated in FIG. 8, in manufacturing the second wafer W2, an insulating layer 142, the semiconductor layer 141A, an insulating layer 141B, a semiconductor layer 141C, an insulating layer 141D, and the semiconductor layer 141E are formed on a substrate S. The insulating layer 121 and the conductive layer 131 are formed above these layers. The plurality of insulating layers 121 and sacrifice layers 111A are formed above these layers in alternation. The insulating layer 142, the insulating layer 141B, the insulating layer 141D, and the insulating layer 121 are, for example, insulating layers, such as silicon oxide. The semiconductor layer 141A, the semiconductor layer 141C, and the semiconductor layer 141E are, for example, semiconductor layers, such as polysilicon, to which phosphorus (P) is doped. The sacrifice layer 111A is, for example, an insulating layer, such as silicon nitride (SiN). For example, this step is performed by a method, such as Chemical Vapor Deposition (CVD).

Figure 9:
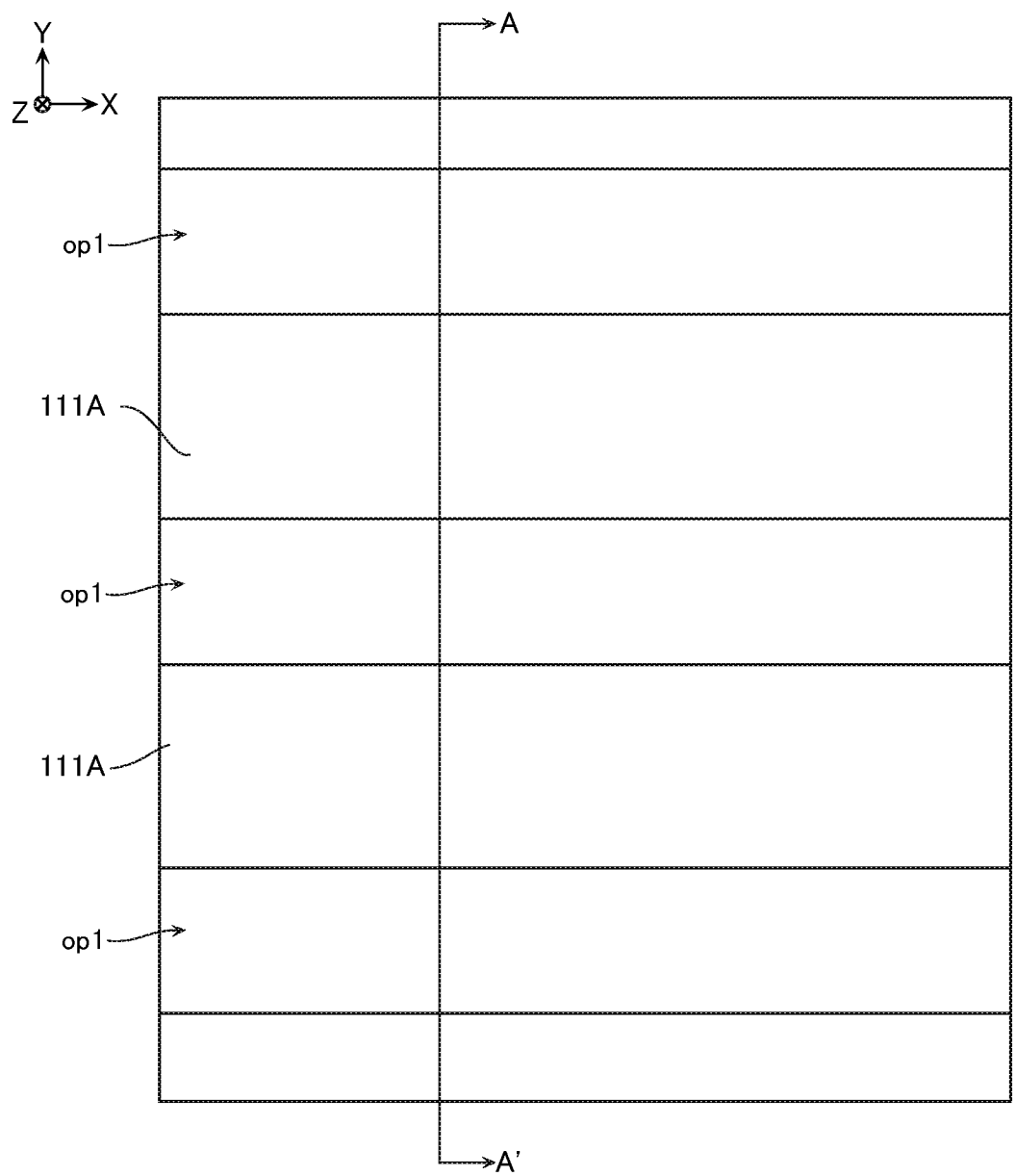
FIG. 9 is a schematic plan view illustrating the manufacturing method.
Figure 10:
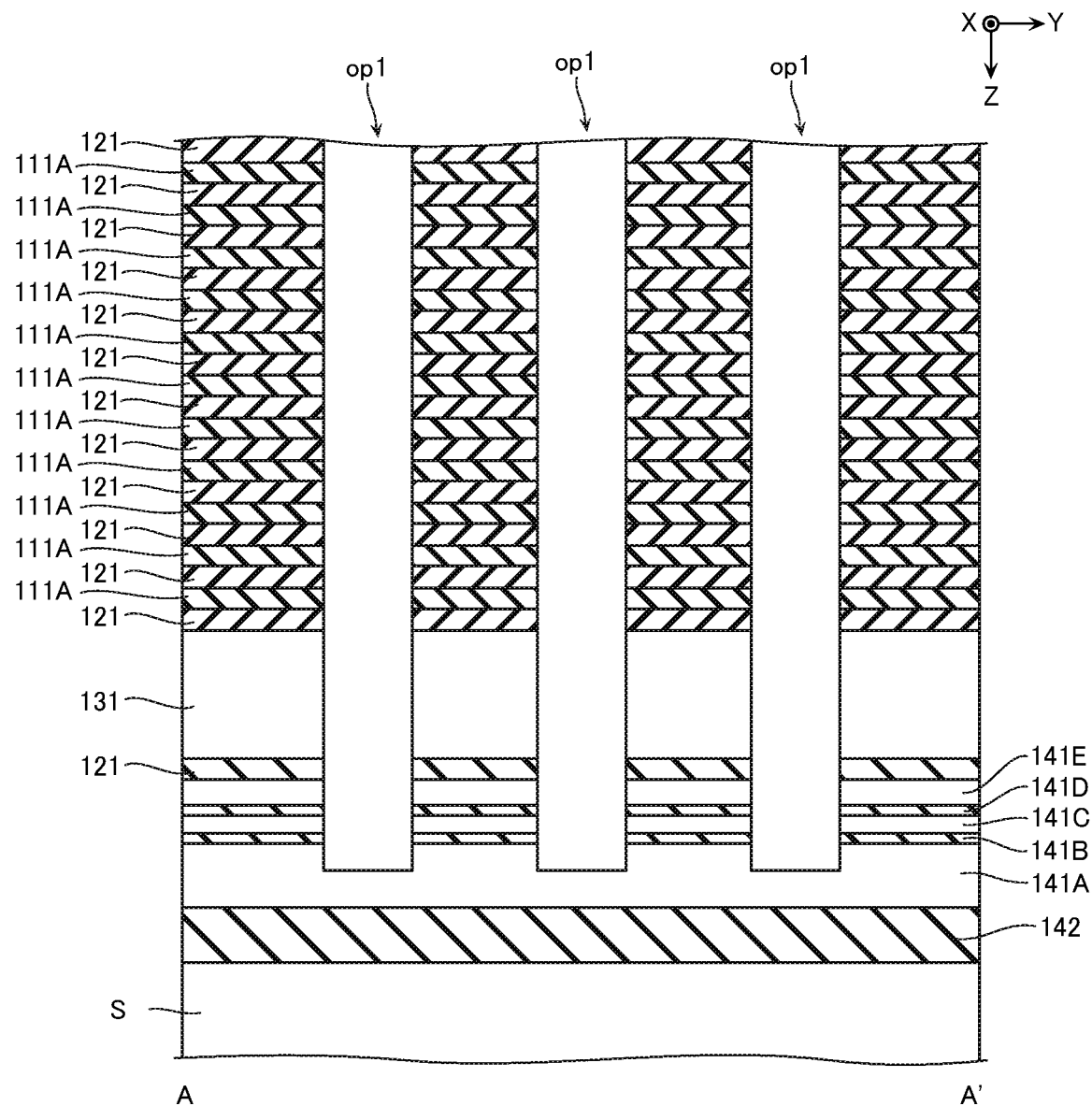
FIG. 10 is a schematic cross-sectional view illustrating the manufacturing method.

Next, as illustrated in FIG. 9 and FIG. 10, openings op1 are formed. The opening op1 is an opening that extends in the X-direction and the Z-direction and penetrates the insulating layers 121, the sacrifice layers 111A, the conductive layer 131, the insulating layer 121, the semiconductor layer 141E, the insulating layer 141D, the semiconductor layer 141C, and the insulating layer 141B to expose the semiconductor layer 141A. For example, this step forms an insulating layer having openings at parts corresponding to the openings op1 on the top surface of the structure illustrated in FIG. 8 and performs Reactive Ion Etching (RIE) or the like using the insulating layer as a mask to form the openings op1.

Figure 11:
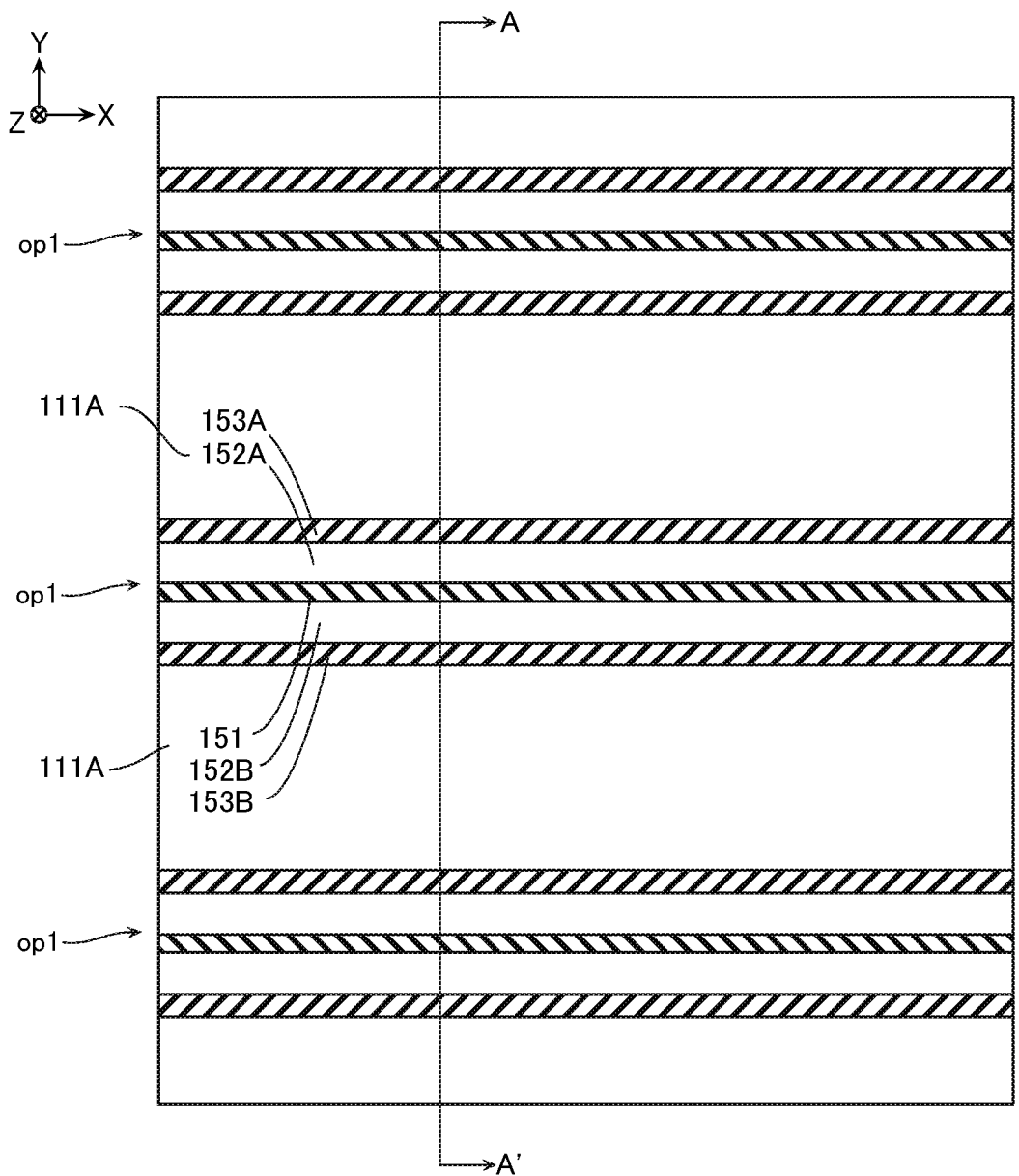
FIG. 11 is a schematic plan view illustrating the manufacturing method.
Figure 12:
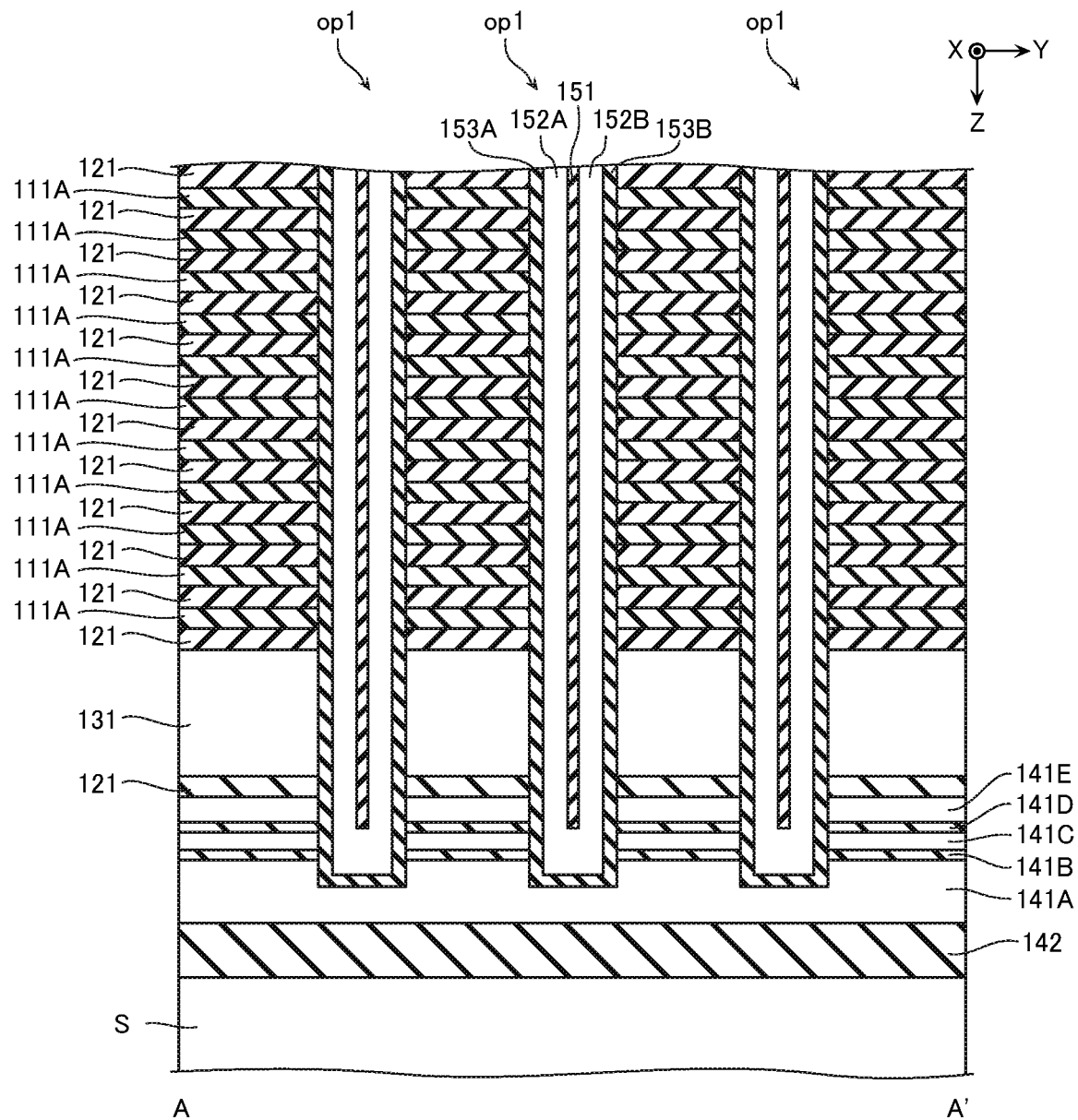
FIG. 12 is a schematic cross-sectional view illustrating the manufacturing method.

Next, as illustrated in FIG. 11 and FIG. 12, the gate insulating layers 153A, 153B, the semiconductor layers 152A, 152B, and the insulating layer 151 are formed on an inner peripheral surface of the opening op1. For example, this step is performed by a method, such as CVD. In this step, for example, a heat treatment or the like to modify crystalline structures of the semiconductor layers 152A, 152B is performed.

Figure 13:
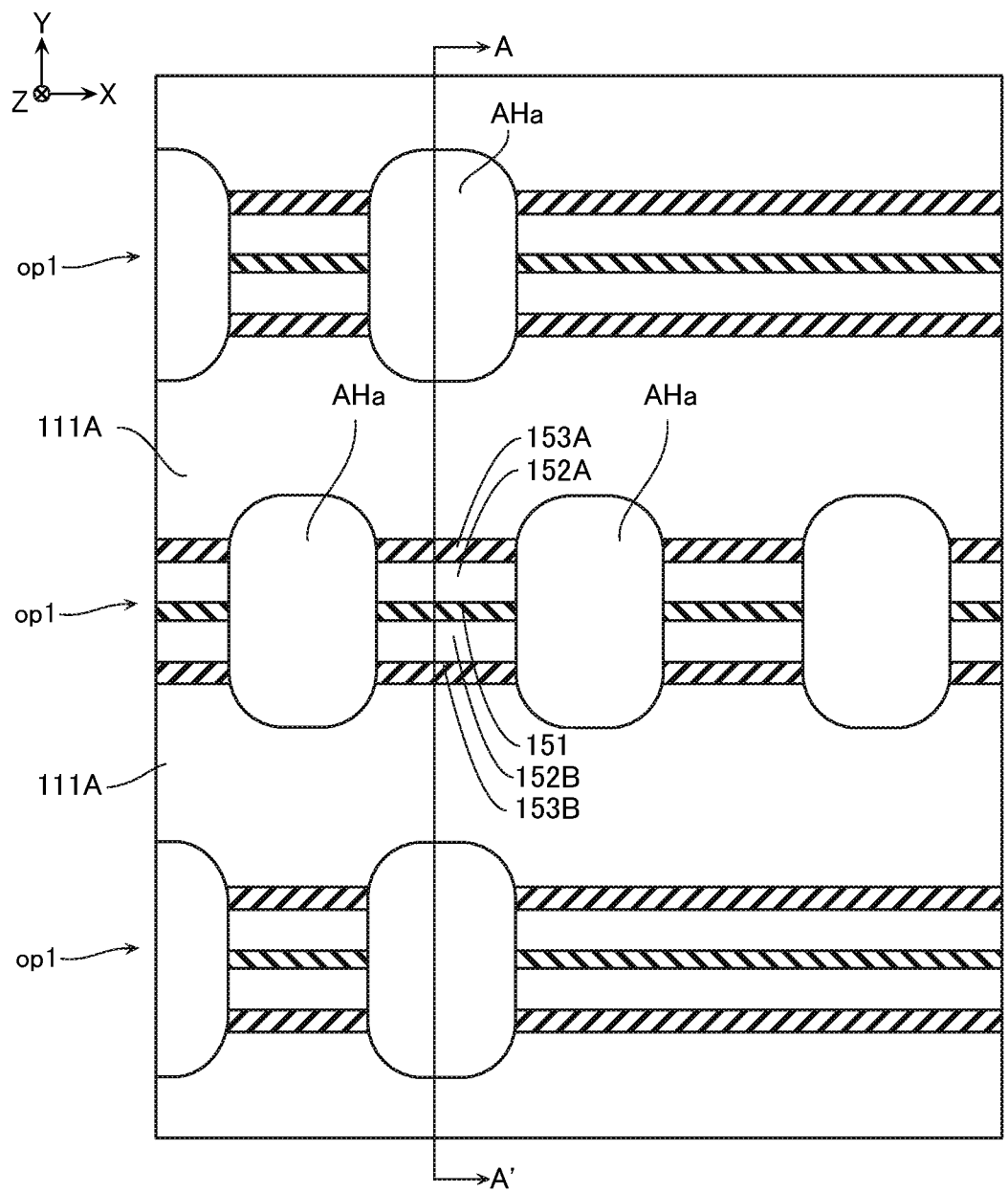
FIG. 13 is a schematic plan view illustrating the manufacturing method.
Figure 14:
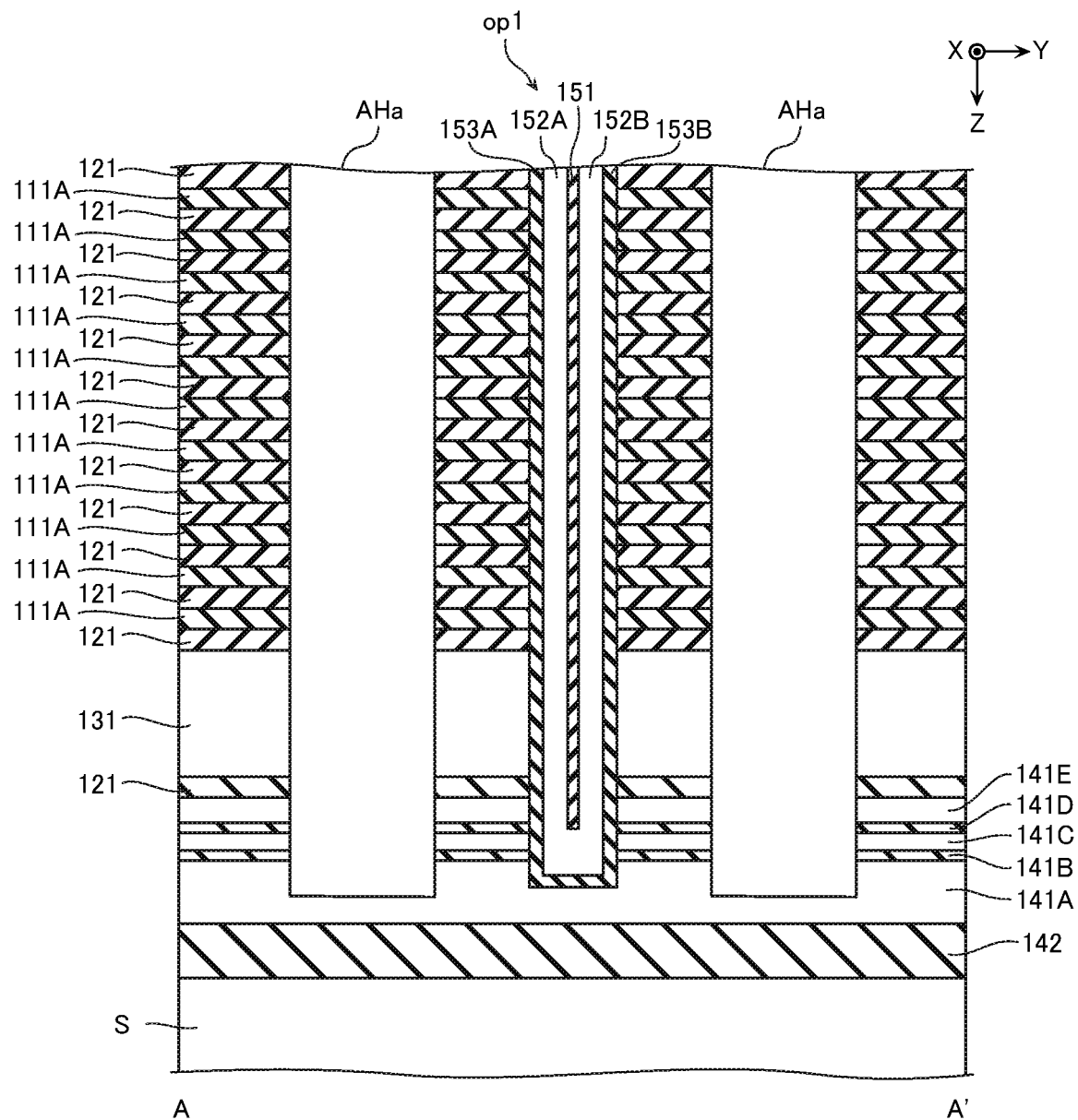
FIG. 14 is a schematic cross-sectional view illustrating the manufacturing method.

Next, as illustrated in FIG. 13 and FIG. 14, holes AHa as openings are formed. Similarly to the above-described opening op1, the hole AHa is an opening that extends in the Z-direction to expose the semiconductor layer 141A. Similarly to the step corresponding to that of the opening op1, for example, this step is performed by a method, such as RIE.

Figure 15:
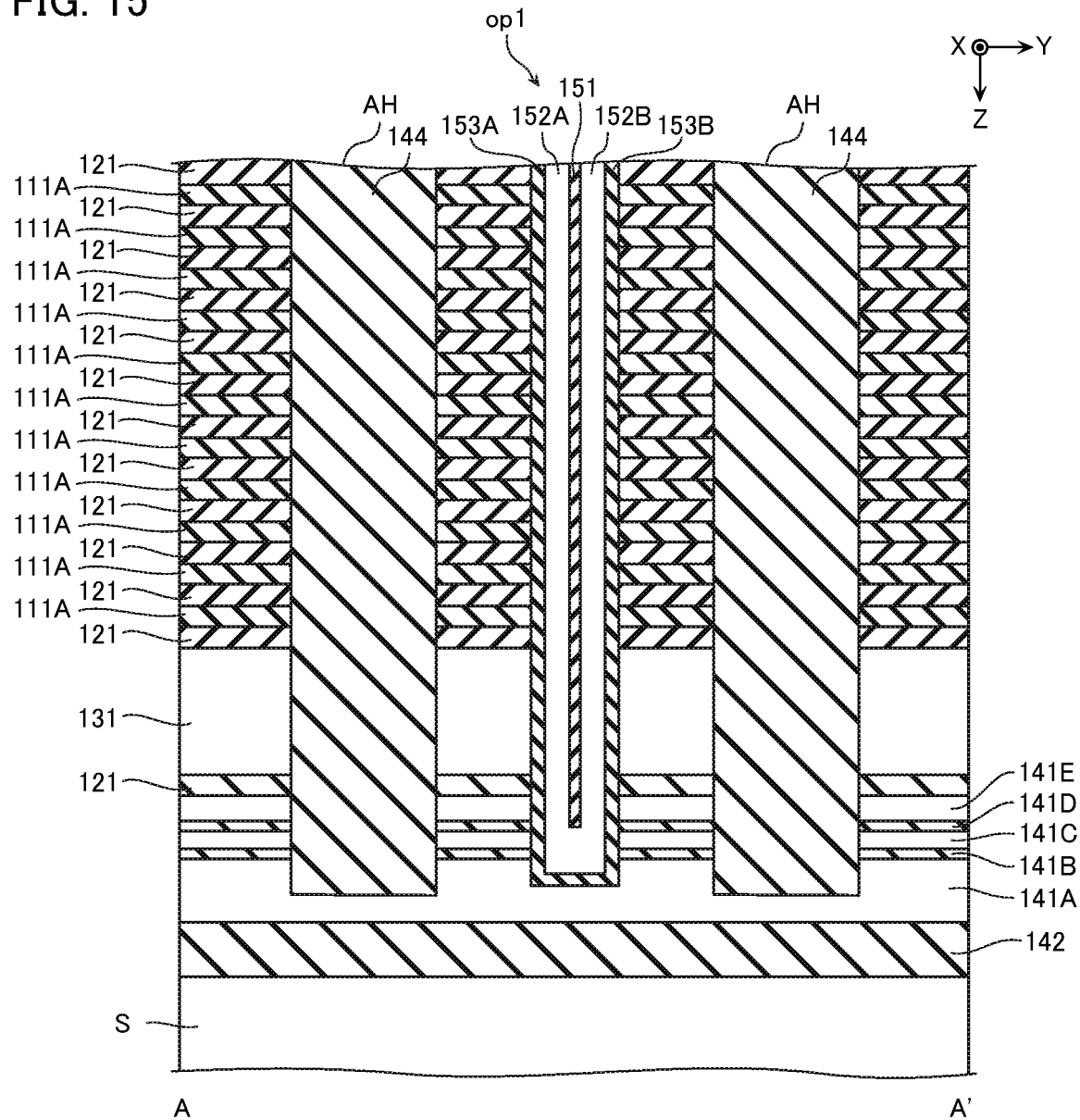
FIG. 15 is a schematic cross-sectional view illustrating the manufacturing method.

Next, as illustrated in FIG. 15, insulating layers 144 are formed inside the holes AHa. The insulating layer 144 is, for example, an insulating layer, such as silicon oxide. For example, this step is performed by a method, such as CVD.

Figure 16:
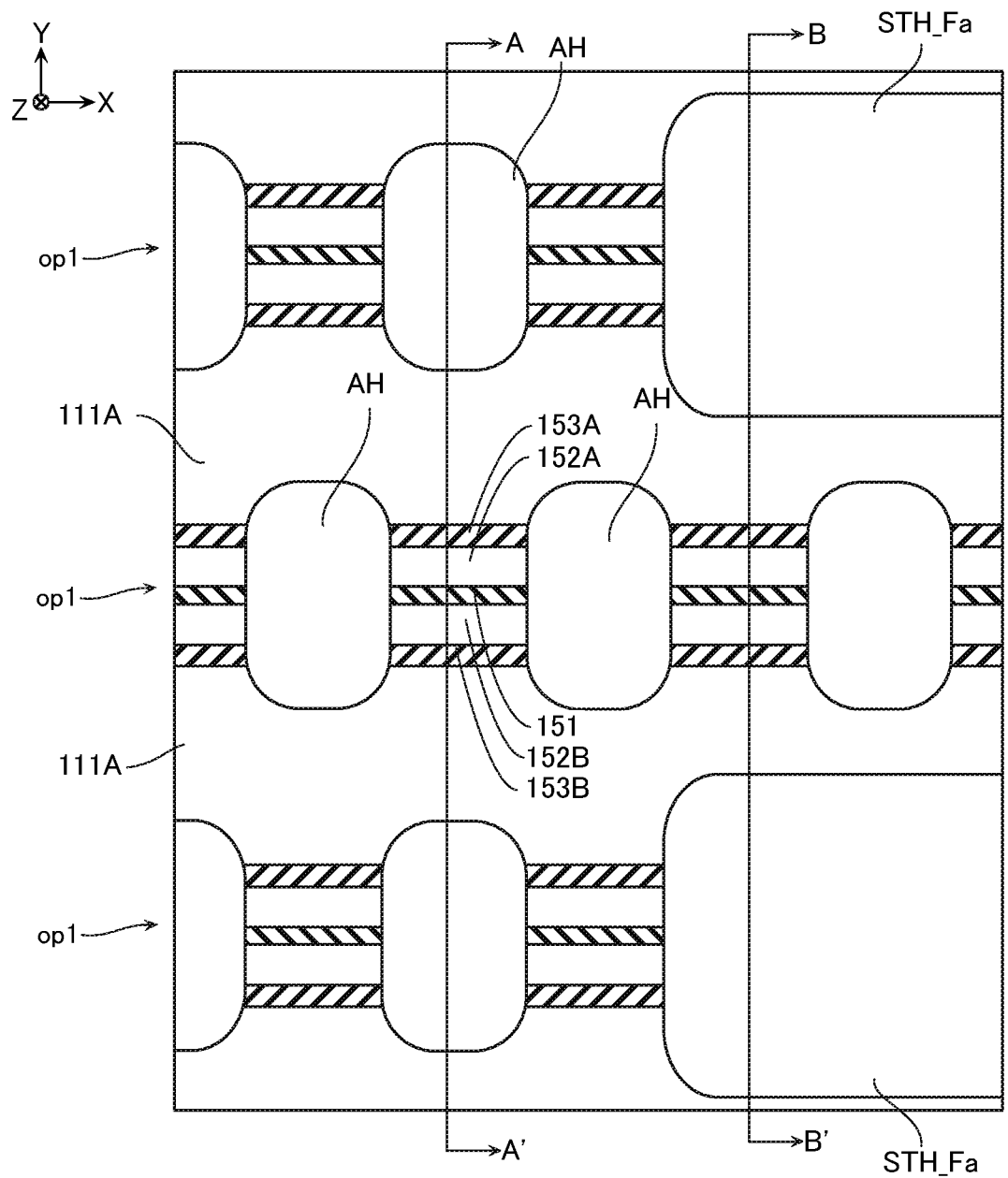
FIG. 16 is a schematic plan view illustrating the manufacturing method.
Figure 17:
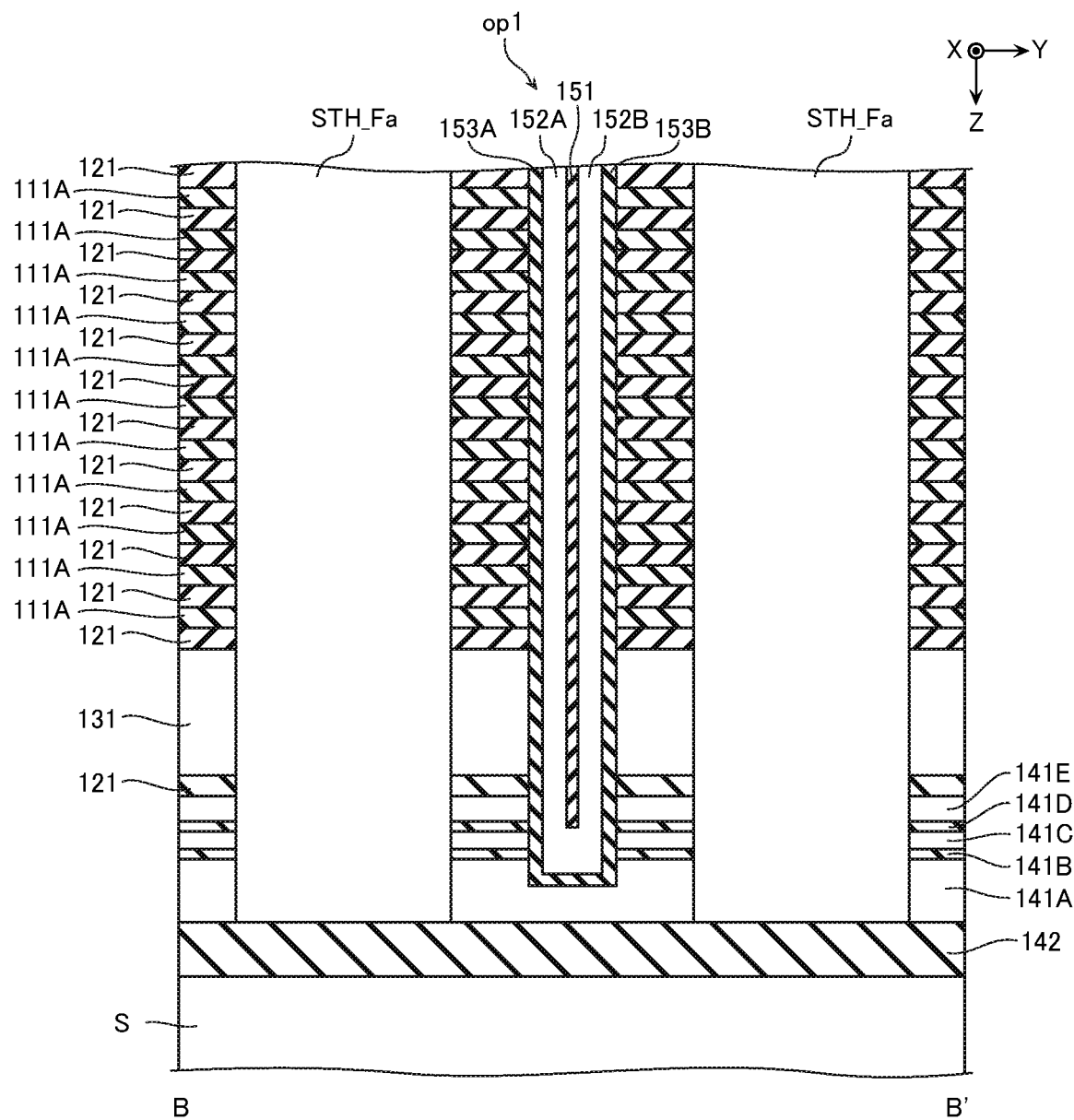
FIG. 17 is a schematic cross-sectional view illustrating the manufacturing method.

Next, as illustrated in FIG. 16 and FIG. 17, holes STH_Fa as openings are formed. The hole STH_Fa is an opening that extends in the Z-direction and penetrates the insulating layers 121, the sacrifice layers 111A, the conductive layer 131, the insulating layer 121, the semiconductor layer 141E, the insulating layer 141D, the semiconductor layer 141C, the insulating layer 141B, and the semiconductor layer 141A to expose the insulating layer 142. For example, similarly to the opening op1, this step is performed by a method, such as RIE.

Figure 18:
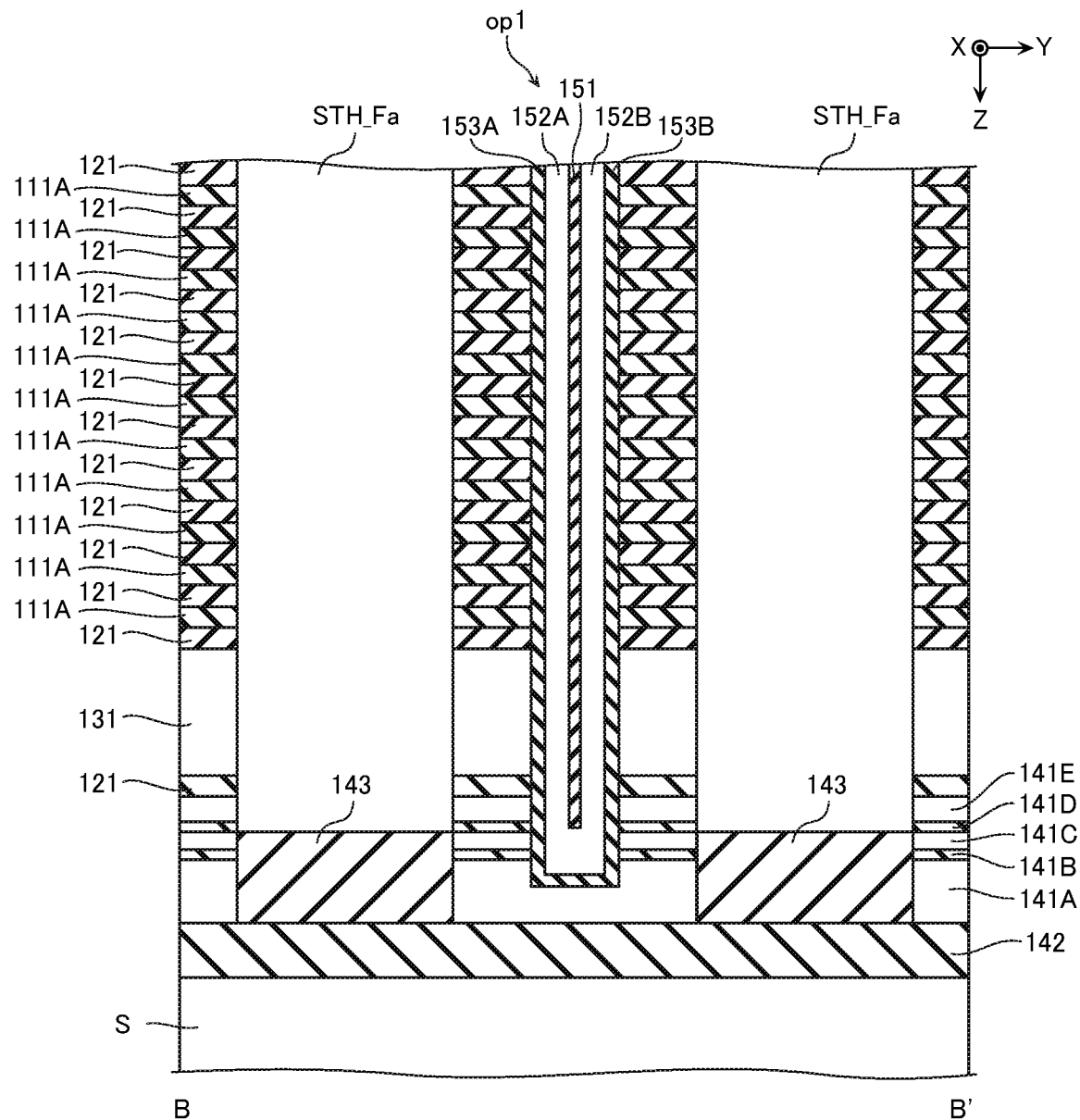
FIG. 18 is a schematic cross-sectional view illustrating the manufacturing method.

Next, as illustrated in FIG. 18, insulating layers 143 are formed inside the holes STH_Fa. The insulating layer 143 is, for example, an insulating layer, such as silicon oxide. For example, this step is performed by a method, such as CVD. For example, this step is performed under a condition in which the insulating layer 143 is selectively formed on the insulating layer 142. This step is performed such that, for example, a position of an upper end of the insulating layer 142 reaches a position of a lower surface of the insulating layer 141D.

Figure 19:
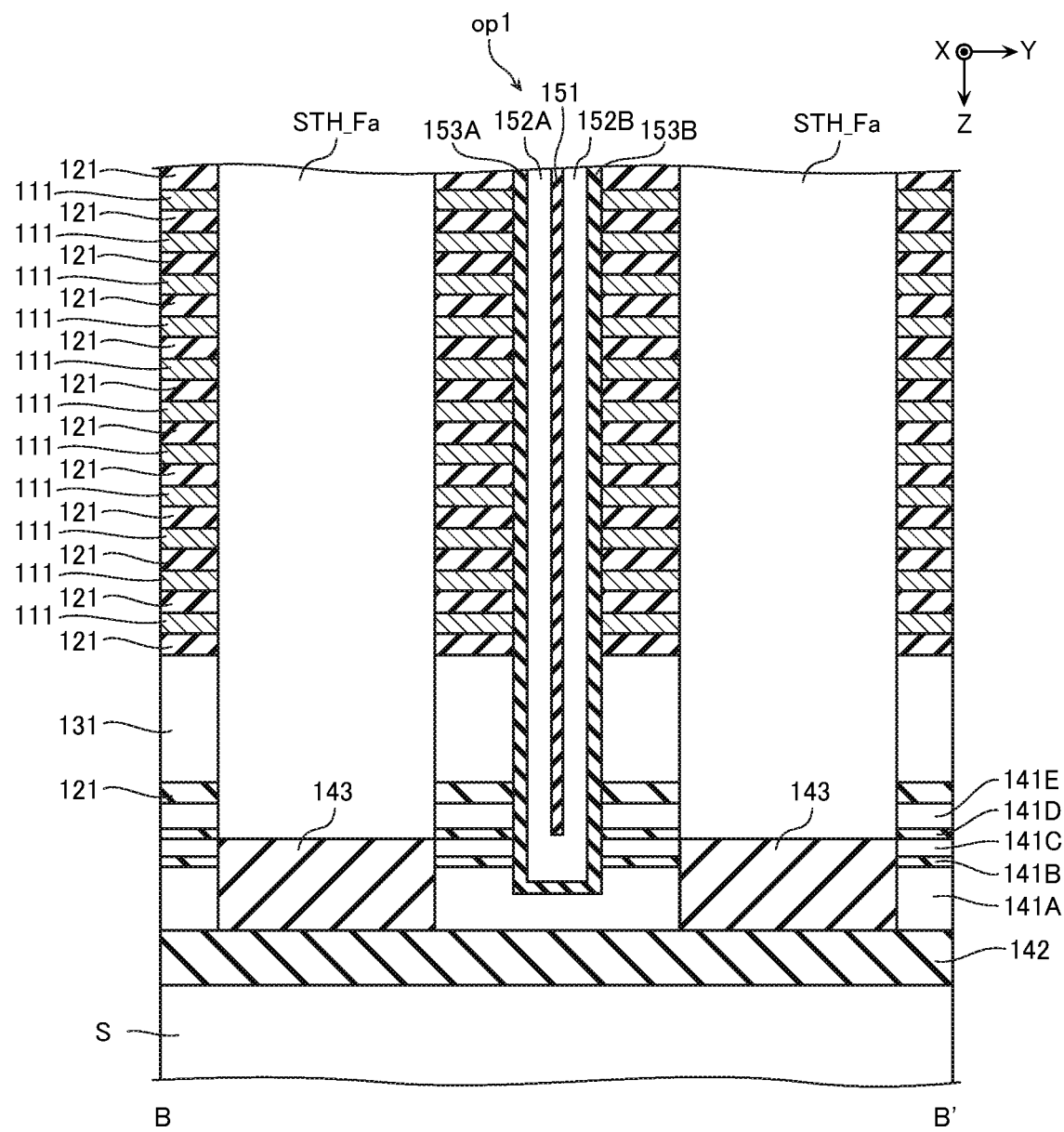
FIG. 19 is a schematic cross-sectional view illustrating the manufacturing method.

Next, the sacrifice layers 111A are removed via the holes STH_Fa and subsequently, as illustrated in FIG. 19, the conductive layers 111 are formed in cavities where the sacrifice layers 111A have been disposed. For example, the step of removing the sacrifice layers 111A is performed by a method, such as wet etching. For example, the step of forming the conductive layers 111 is performed by a method, such as CVD.

Figure 20:
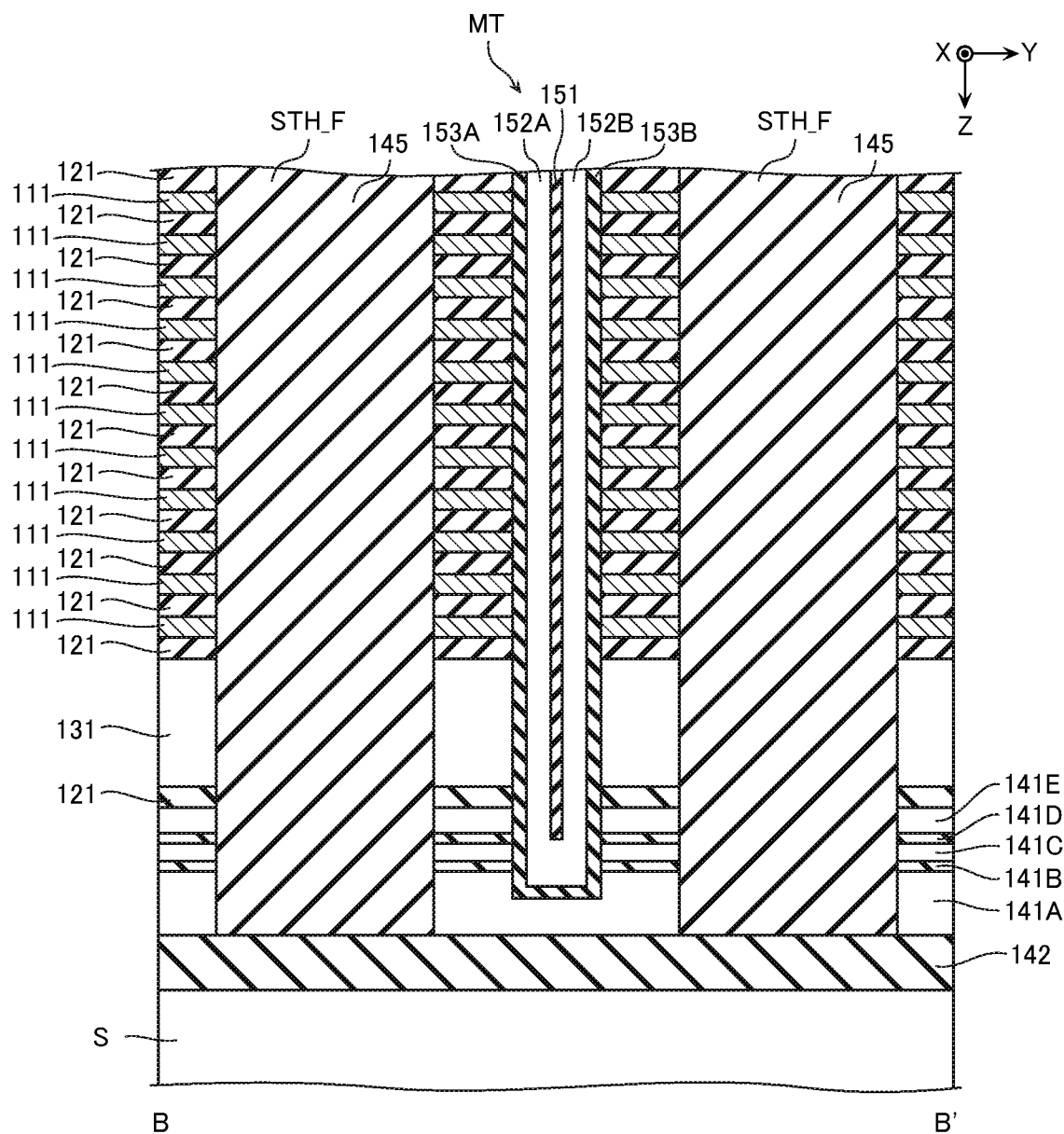
FIG. 20 is a schematic cross-sectional view illustrating the manufacturing method.

Next, as illustrated in FIG. 20, insulating layers 145 are formed inside the holes STH_Fa. The insulating layer 145 is, for example, an insulating layer, such as silicon oxide. For example, this step is performed by a method, such as CVD.

Next, with reference to FIG. 21 and FIG. 22, the bonding step of the first wafer W1 and the second wafer W2 will be described.

Figure 21:
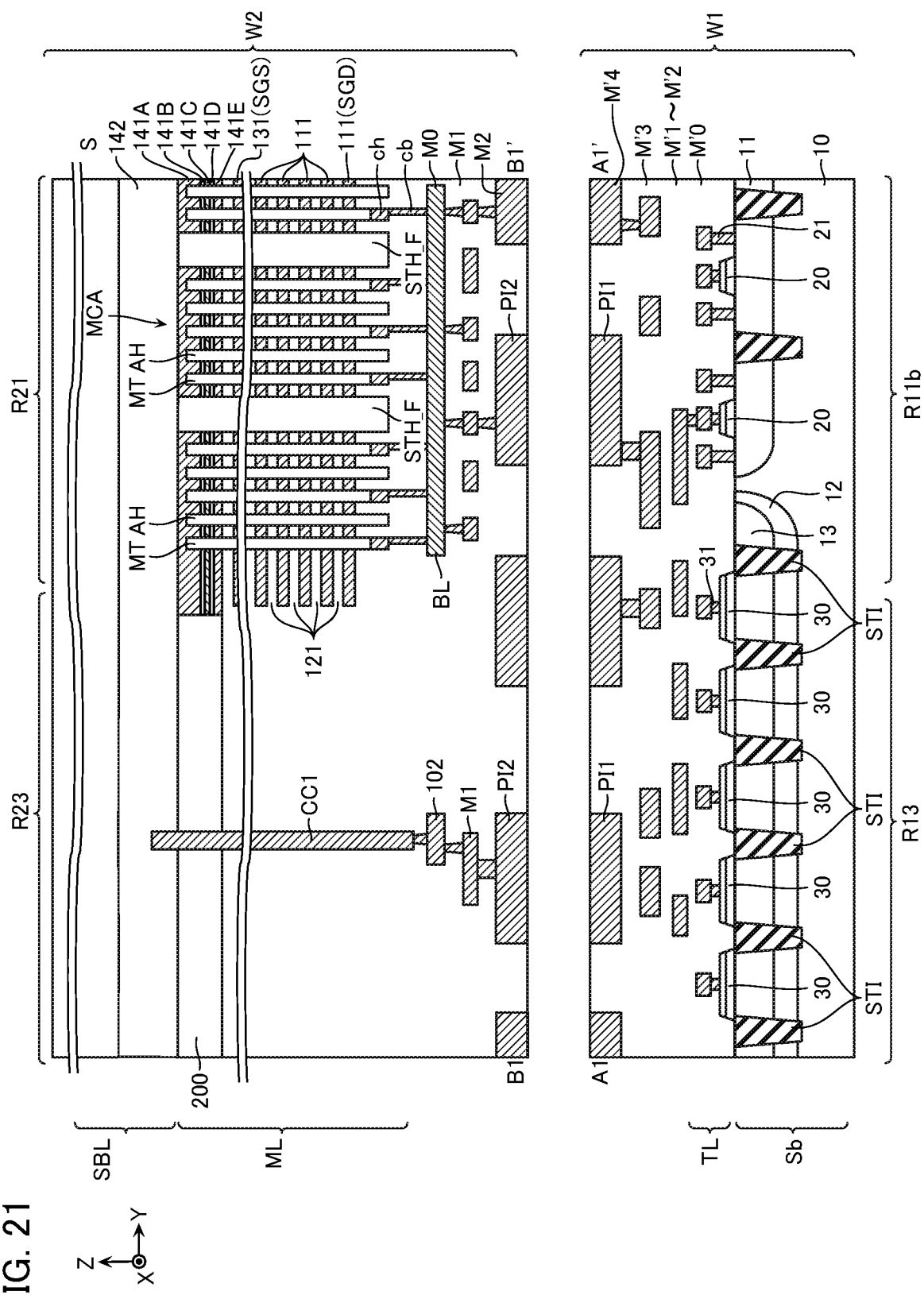
FIG. 21 is a schematic cross-sectional view illustrating the manufacturing method.

As illustrated in FIG. 21, in the bonding step of the first wafer W1 and the second wafer W2, the semiconductor substrate layer Sb and the substrate S are disposed such that the front surface side of the first wafer W1 is opposed to the front surface side of the second wafer W2. Subsequently, as illustrated in FIG. 22, the first bonding electrodes PI1 and the second bonding electrodes PI2 are bonded together to bond the first wafer W1 and the second wafer W2 together. The bonding step is performed by, for example, direct bonding method.

Next, with reference to FIG. 22 to FIG. 31, the back surface process on the second wafer W2 will be described.

Figure 22:
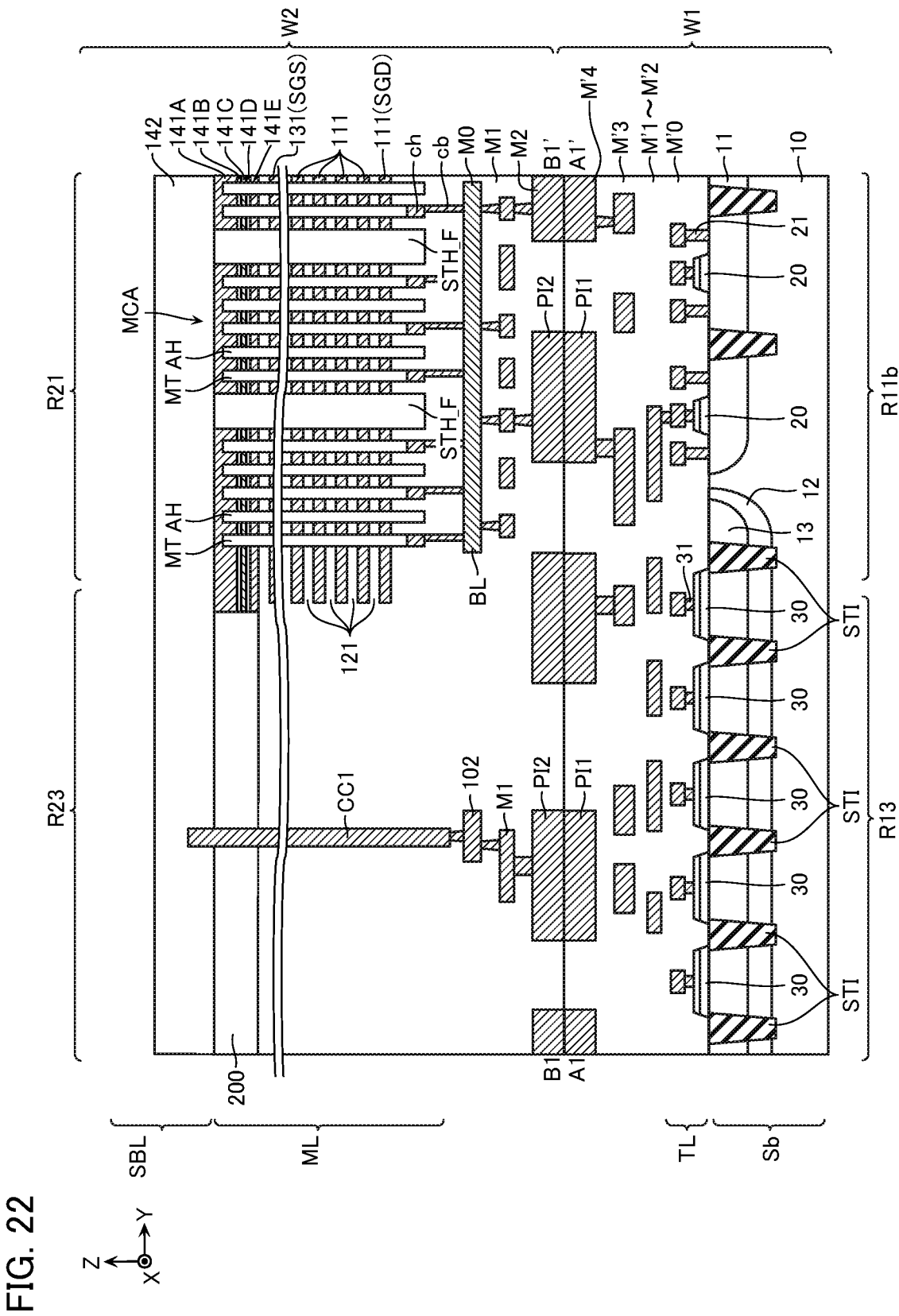
FIG. 22 is a schematic cross-sectional view illustrating the manufacturing method.

As illustrated in FIG. 22, in the back side process on the second wafer W2, the substrate S on the back side of the second chip C2 is removed. In this step, the substrate S may be completely removed or a part of the substrate S may be left. This step is performed by, for example, a grinding process, a Chemical Mechanical Polishing method, or a method of using these methods together.

Figure 23:
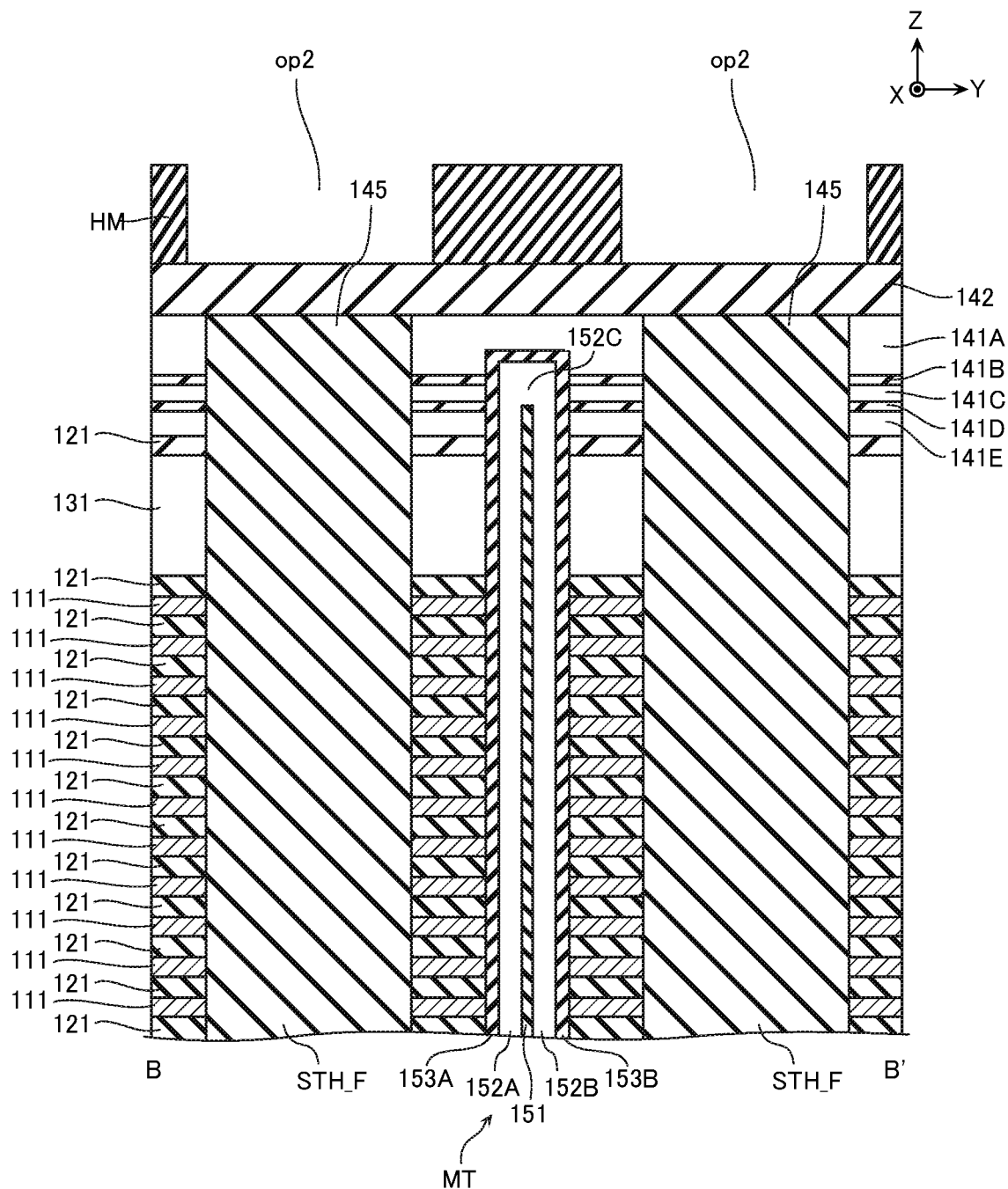
FIG. 23 is a schematic cross-sectional view illustrating the manufacturing method.

Next, as illustrated in FIG. 23, a hard mask HM is formed on the back surface of the second wafer W2 (the top surface in the memory die MD) and openings op2 are formed in the hard mask HM.

Figure 24:
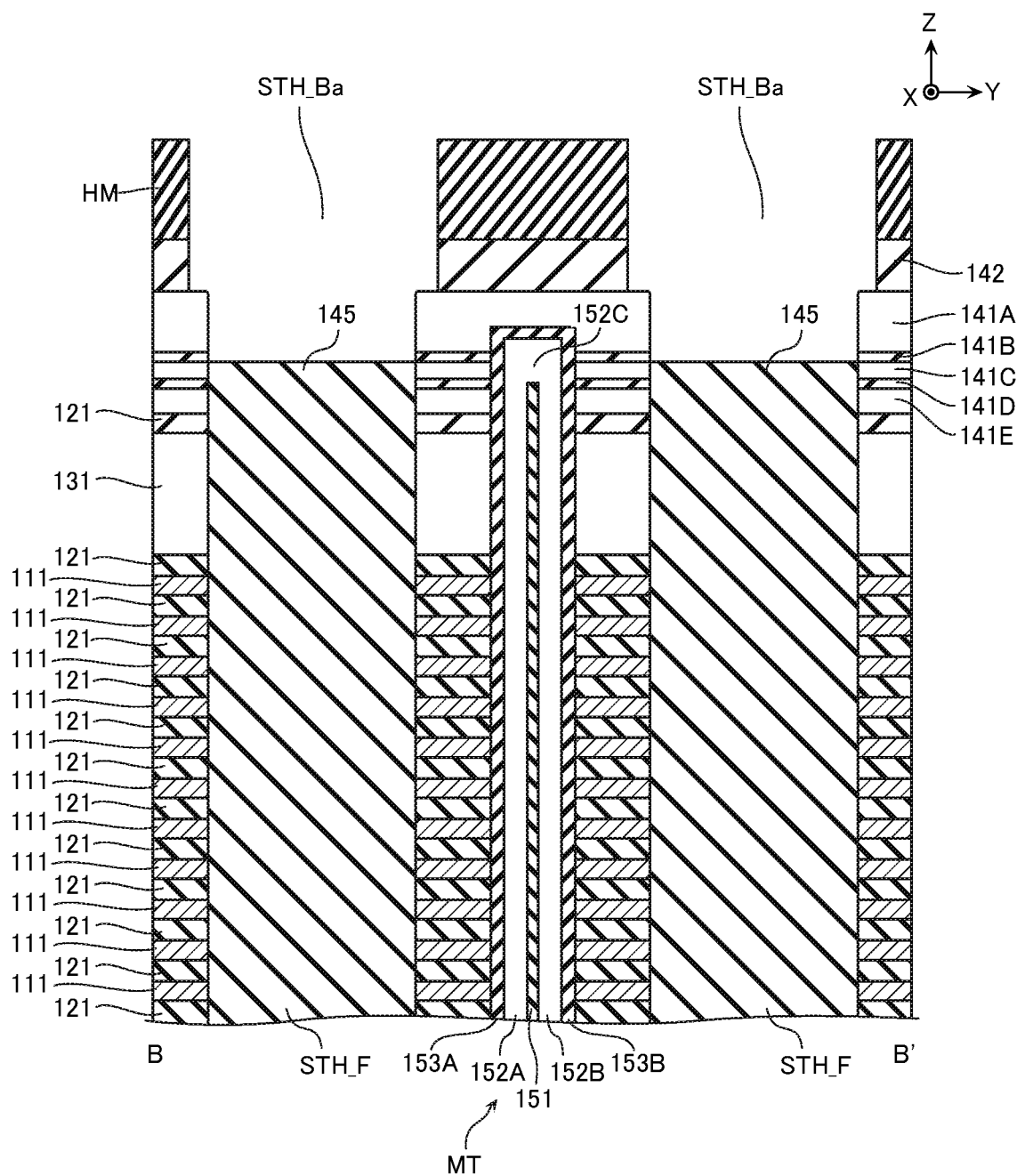
FIG. 24 is a schematic cross-sectional view illustrating the manufacturing method.

Next, as illustrated in FIG. 24, a part of the insulating layer 142 and the insulating layers 145 are removed at the positions corresponding to the openings op2 in the hard mask HM to expose a part of the insulating layers 141B and the holes STH_Ba are formed. For example, this step is performed by a method, such as RIE. This step is performed under a condition in which, for example, an etching rate of silicon oxide or the like becomes larger than an etching rate of silicon. Note that a depth width in the Z-direction of the hole STH_Ba is sufficiently smaller than a depth width in the Z-direction of the hole structure STH_F.

Figure 25:
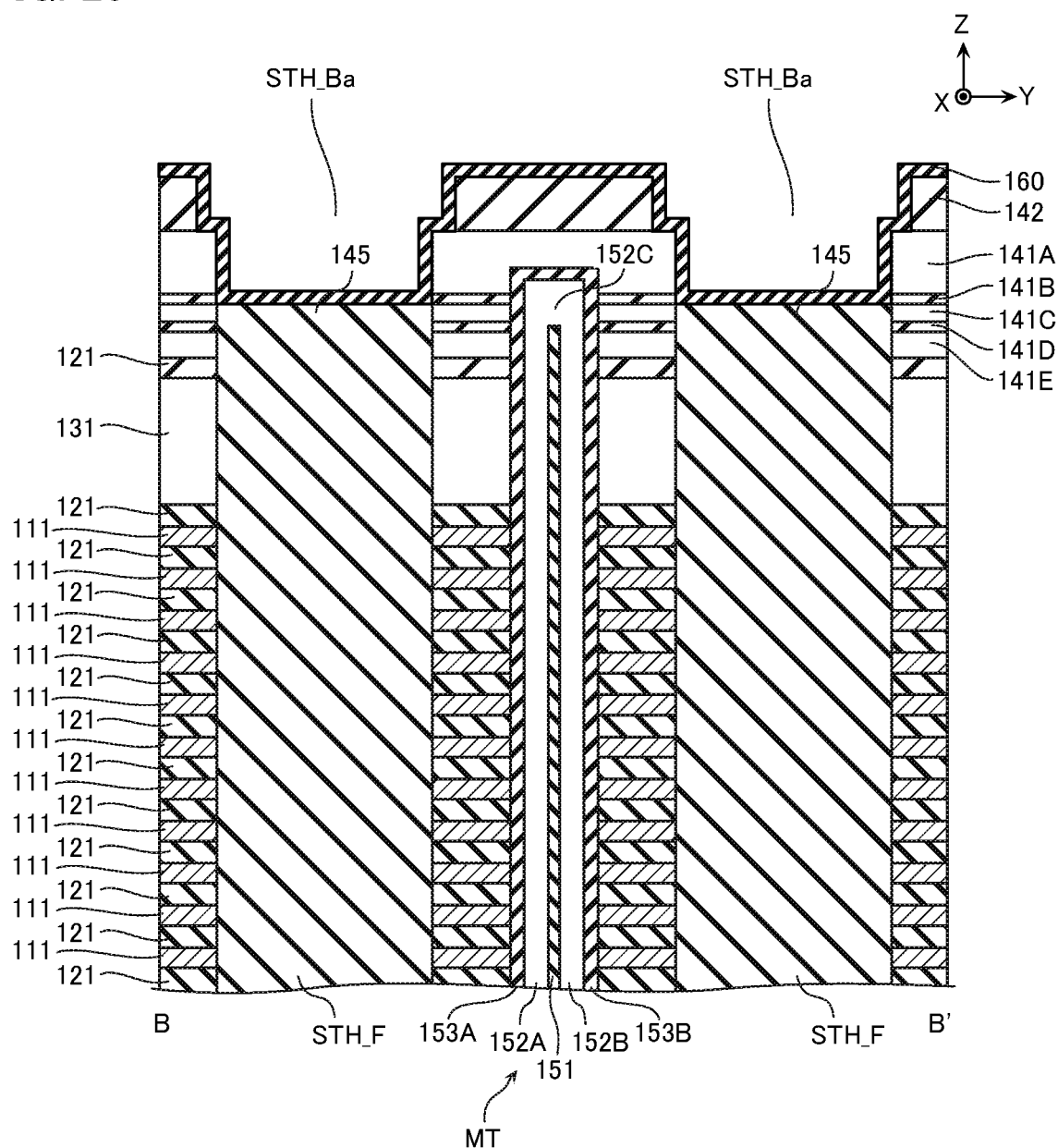
FIG. 25 is a schematic cross-sectional view illustrating the manufacturing method.

Next, as illustrated in FIG. 25, the hard masks HM are removed and a protecting layer 160 is formed on surfaces of the insulating layers 142, the semiconductor layers 141A, and the insulating layers 145. The protecting layer 160 is, for example, an insulating material, such as silicon nitride. For example, this step is performed by a method, such as CVD.

Figure 26:
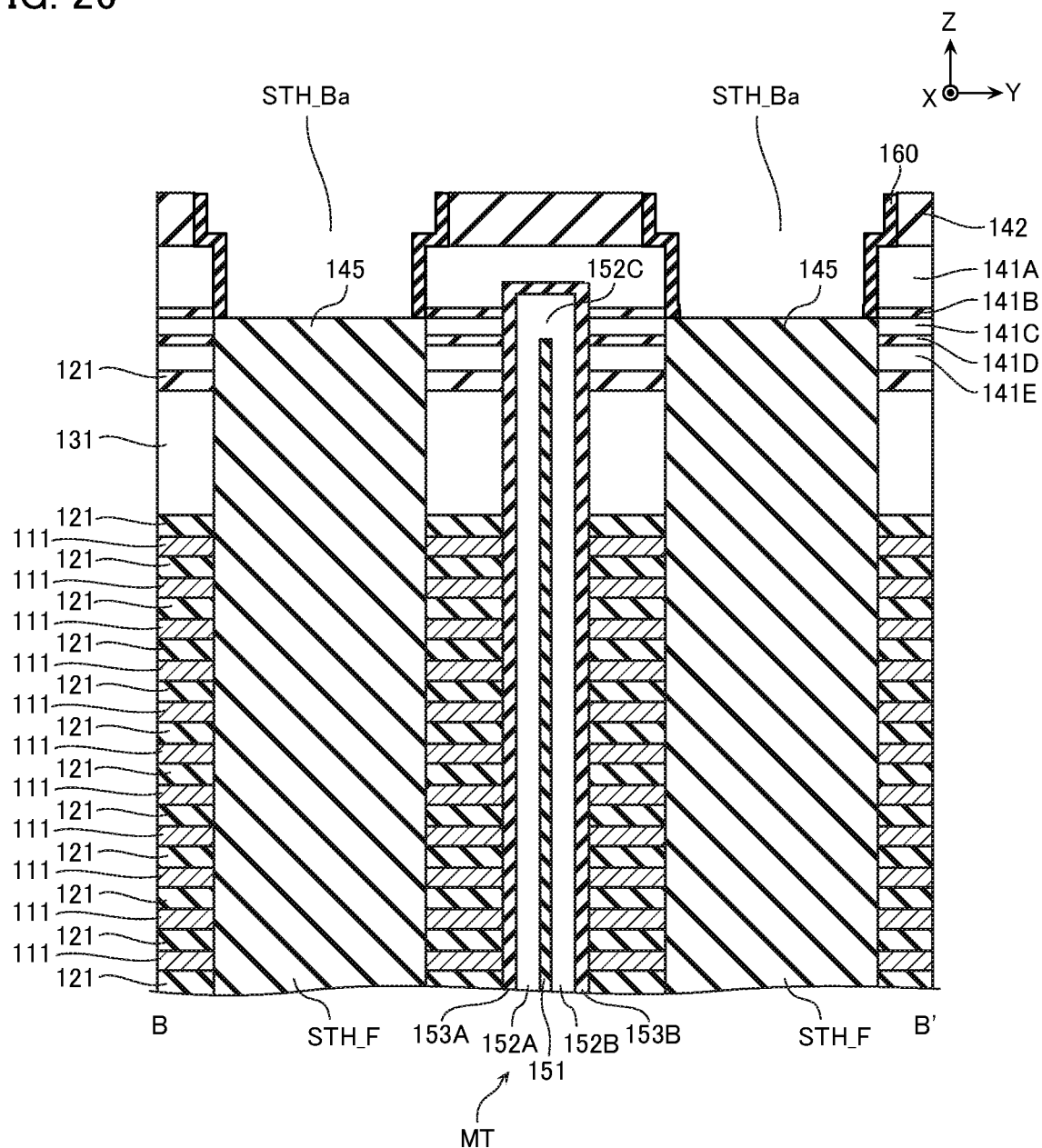
FIG. 26 is a schematic cross-sectional view illustrating the manufacturing method.

Next, as illustrated in FIG. 26, parts of the protecting layer 160 that cover the top surfaces of the insulating layers 142 and the top surfaces of the insulating layers 145 are removed. For example, this step is performed by a method, such as RIE.

Figure 27:
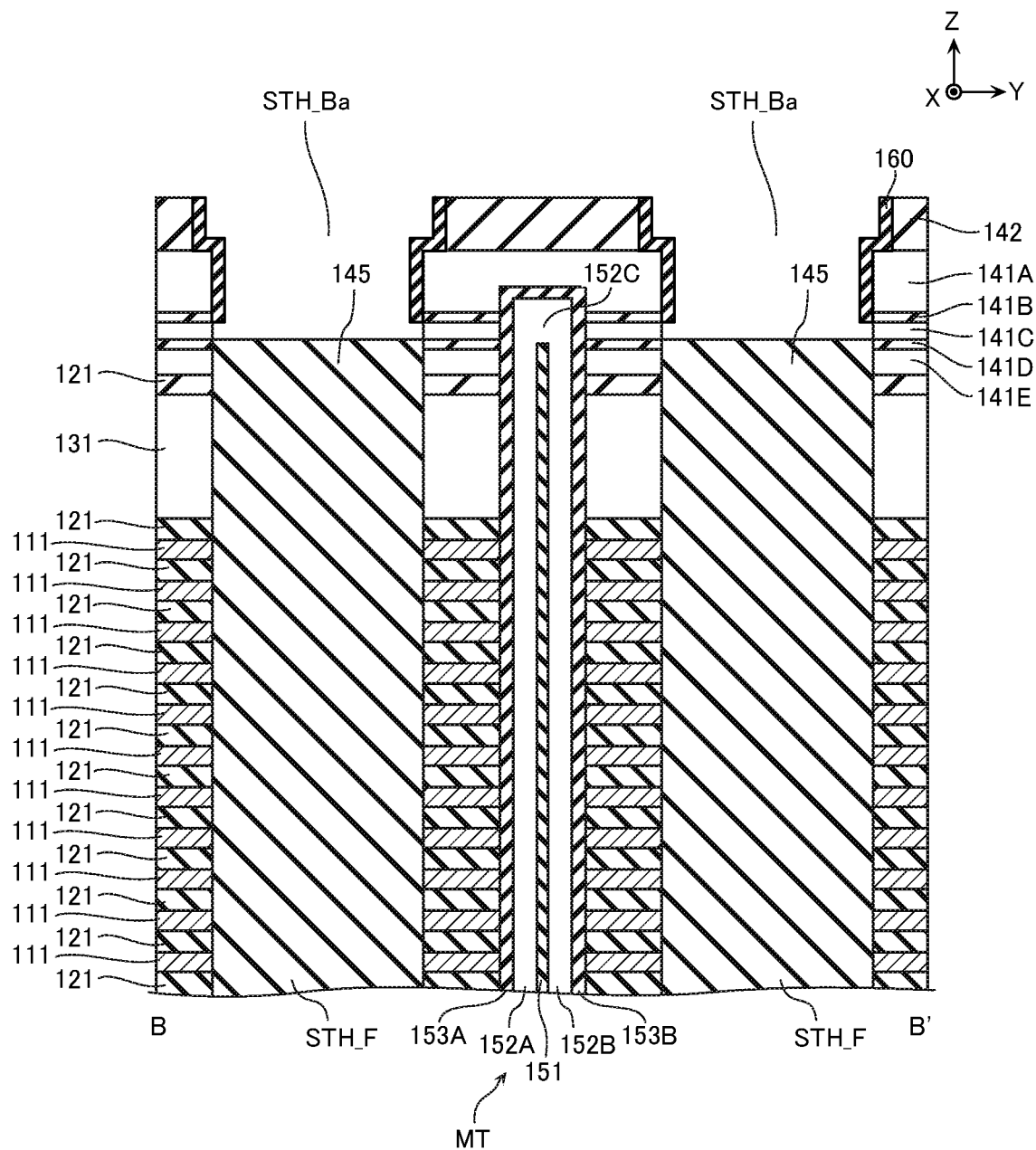
FIG. 27 is a schematic cross-sectional view illustrating the manufacturing method.

Next, as illustrated in FIG. 27, a part of the insulating layers 145 is removed. For example, this step is performed by a method, such as RIE. For example, this step is performed such that a position of the upper end of the insulating layer 145 becomes above the lower surface of an insulating layer 140D and becomes below the insulating layer 141B.

Figure 28:
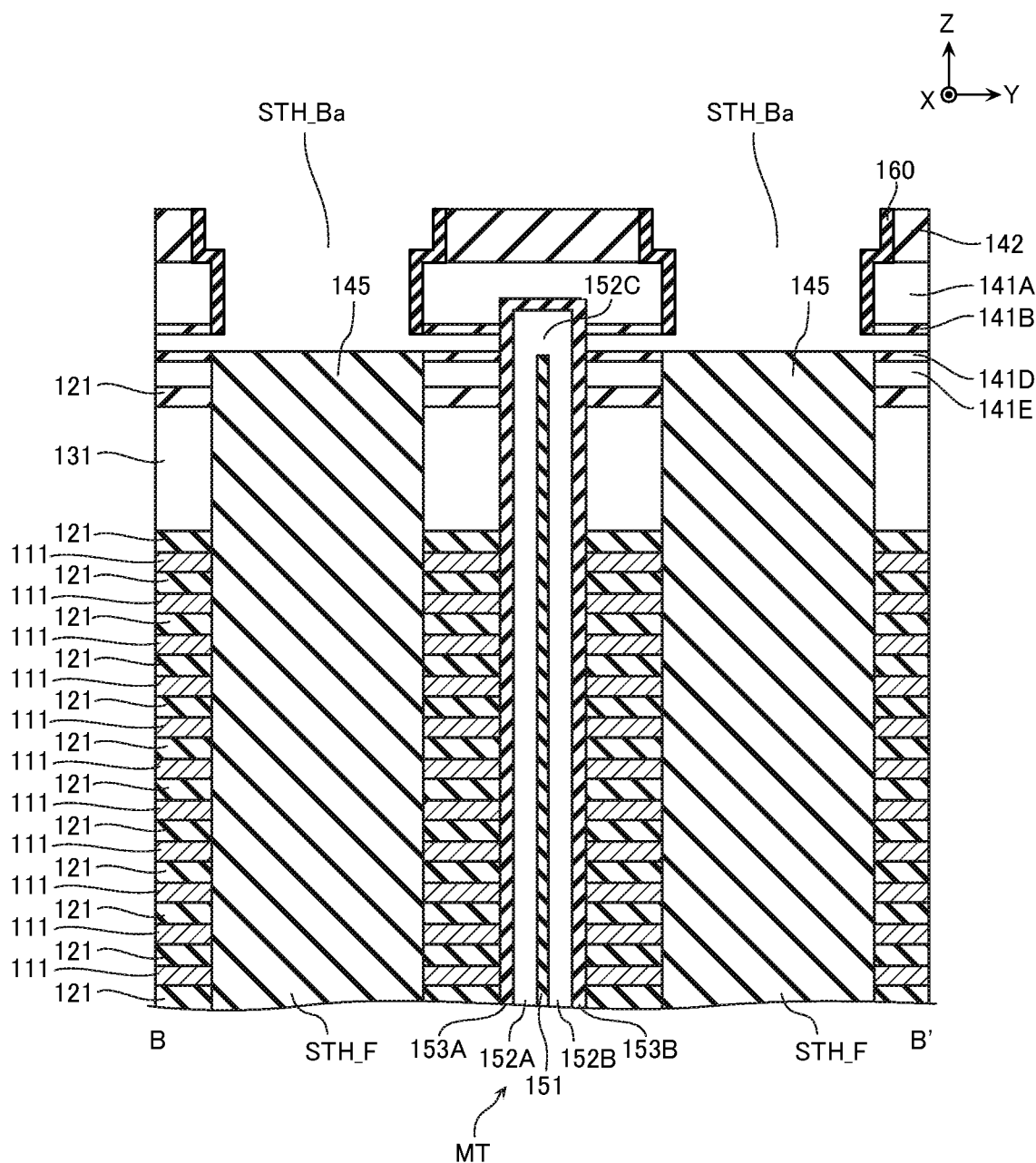
FIG. 28 is a schematic cross-sectional view illustrating the manufacturing method.

Next, as illustrated in FIG. 28, via the holes STH_Ba, the semiconductor layers 141C are removed to expose a part of sidewalls of the gate insulating layers 153A, 153B. For example, this step is performed by a method, such as wet etching. In this step, the semiconductor layer 141A, which is formed of the material same kind as that of the semiconductor layer 141C, is protected by the protecting layer 160.

Figure 29:
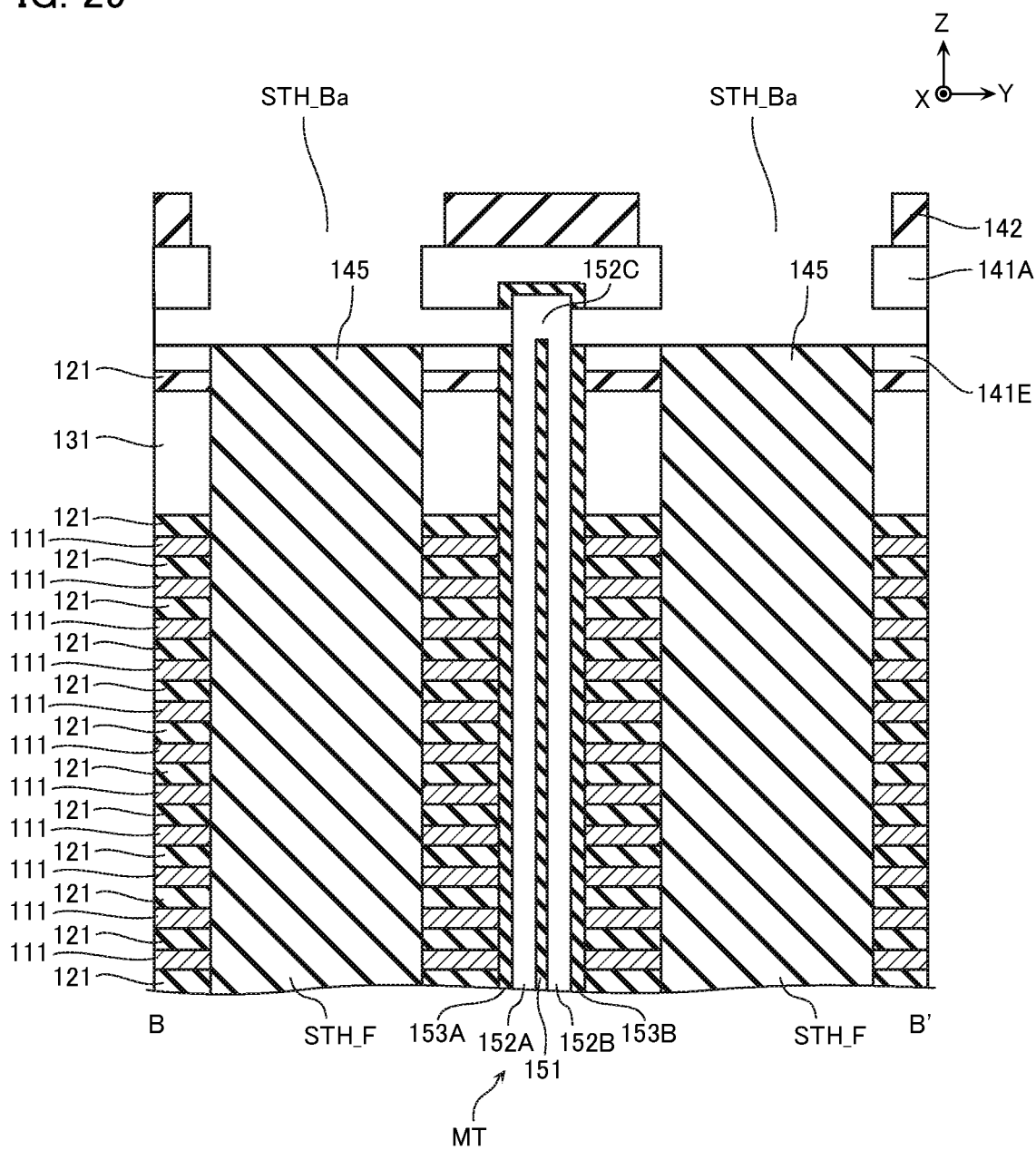
FIG. 29 is a schematic cross-sectional view illustrating the manufacturing method.

Next, as illustrated in FIG. 29, a part of the gate insulating layers 153A, 153B is removed via the holes STH_Ba and the cavities where the semiconductor layers 141C have been disposed to expose side surfaces of the semiconductor layer 152C. In this step, the insulating layers 141B, 141D containing the materials same kind as those of the gate insulating layers 153A, 153B and the protecting layer 160 are also simultaneously removed to expose a part of the side surfaces and the lower surfaces of the semiconductor layers 141A and the top surfaces of the semiconductor layers 141E. For example, this step is performed by a method, such as chemical dry etching.

Figure 30:
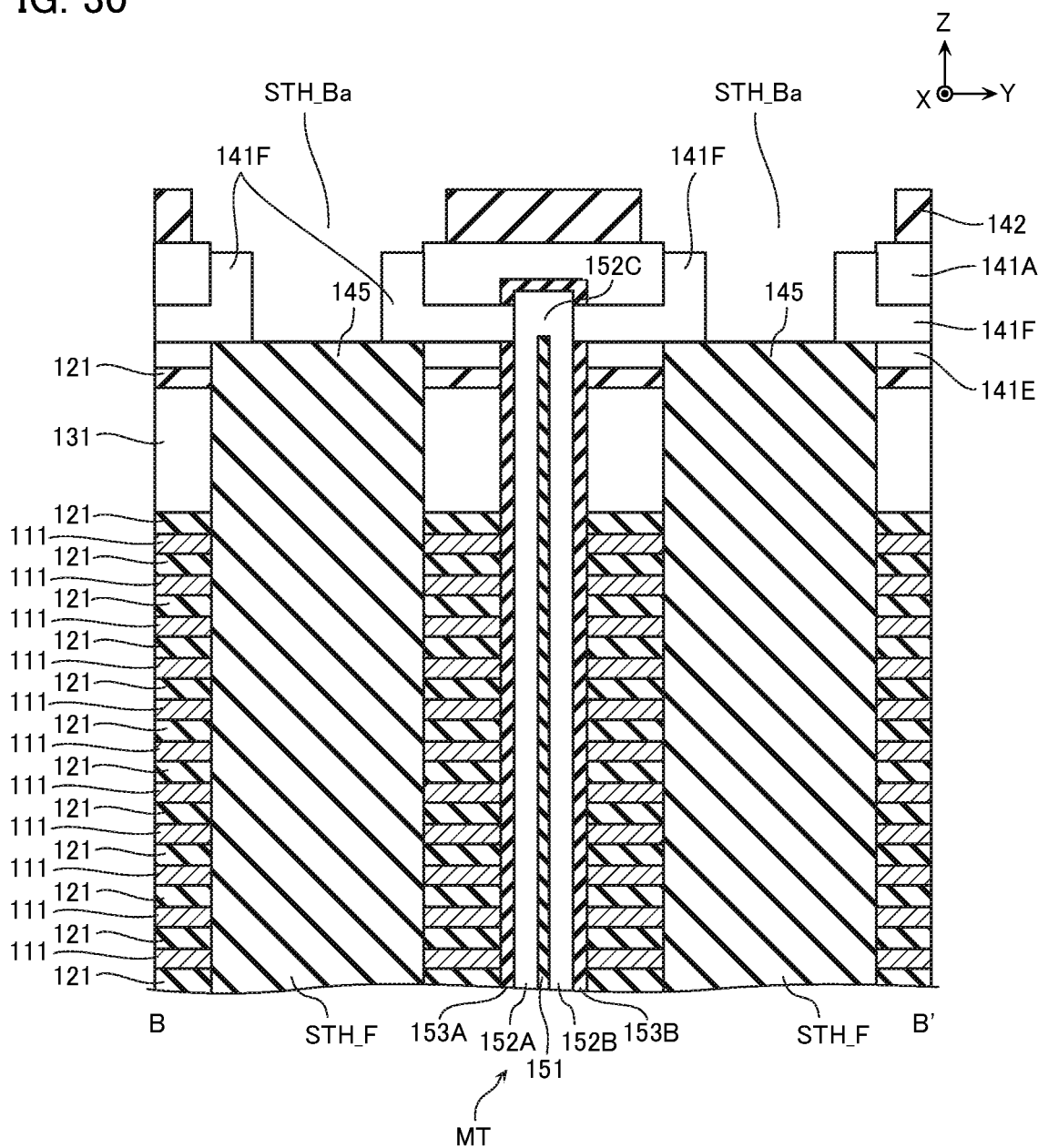
FIG. 30 is a schematic cross-sectional view illustrating the manufacturing method.

Next, as illustrated in FIG. 30, the semiconductor layers 141F are formed on the side surfaces of the semiconductor layer 152C, the top surfaces of the semiconductor layers 141E, and the side surfaces and the lower surfaces of the semiconductor layers 141A. For example, this step is performed by a method, such as epitaxial growth.

Figure 31:
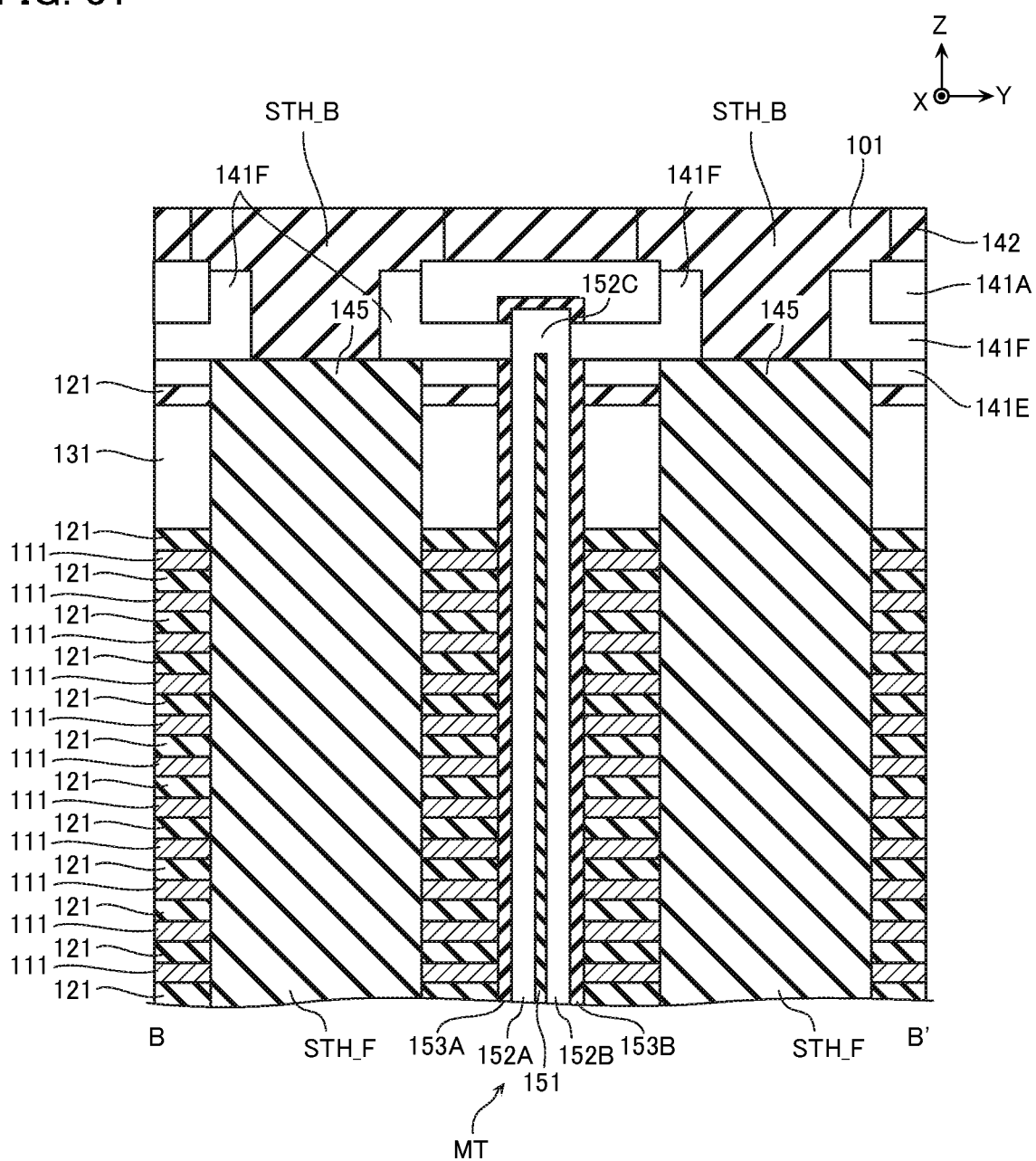
FIG. 31 is a schematic cross-sectional view illustrating the manufacturing method.

Next, as illustrated in FIG. 31, the insulating layer 101 is formed on the top surface of the structure illustrated in FIG. 30. For example, this step is performed by a method, such as CVD.

Next, as illustrated in FIG. 5C, the back side wiring MZ and the insulating layer 100 are formed on the insulating layer 101, the opening TV is formed in the insulating layer 100, and a part of the back side wiring MZ is configured as the external pad electrode PX. For example, this step is performed by film formation by CVD and by formation by etching or the like. By the above-described steps, the structure as illustrated in FIG. 5C is formed.

[Method for Manufacturing Semiconductor Memory Device according to Comparative Example]

Next, with reference to FIG. 32A to FIG. 32D, the method for manufacturing the semiconductor memory device according to the comparative example will be described.

In the comparative example, for example, the steps that have been described with reference to FIG. 8 to FIG. 15 are performed.

Figure 32A:
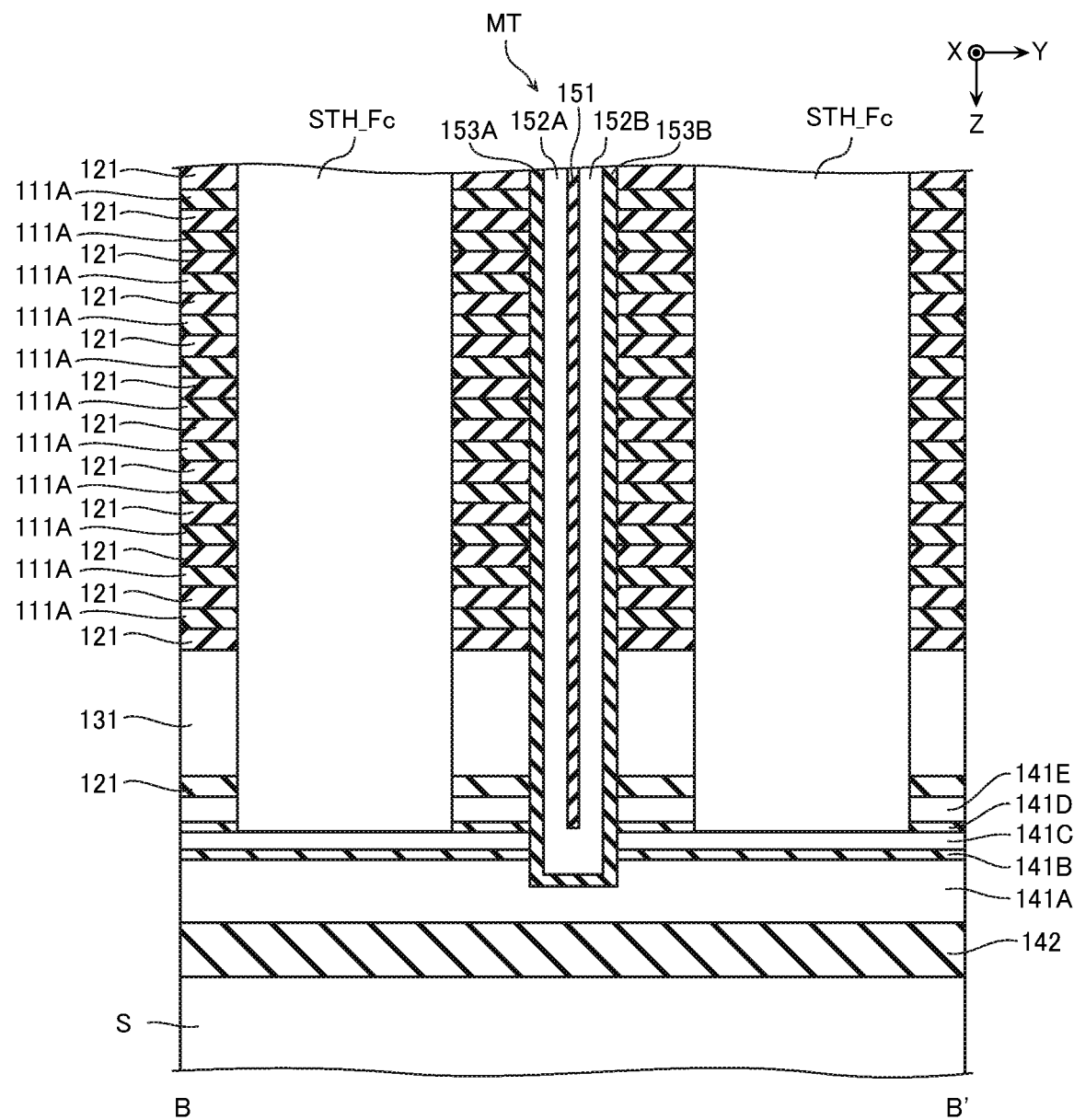
FIG. 32A is a schematic cross-sectional view illustrating a manufacturing method according to a comparative example.

Next, as illustrated in FIG. 32A, holes STH_Fc are formed. The hole STH_Fc is formed basically similarly to the hole STH_Fa that has been described with reference to FIG. 16 and FIG. 17. However, the hole STH_Fc does not penetrate the semiconductor layer 141C, the insulating layer 141B, or the semiconductor layer 141A.

Figure 32B:
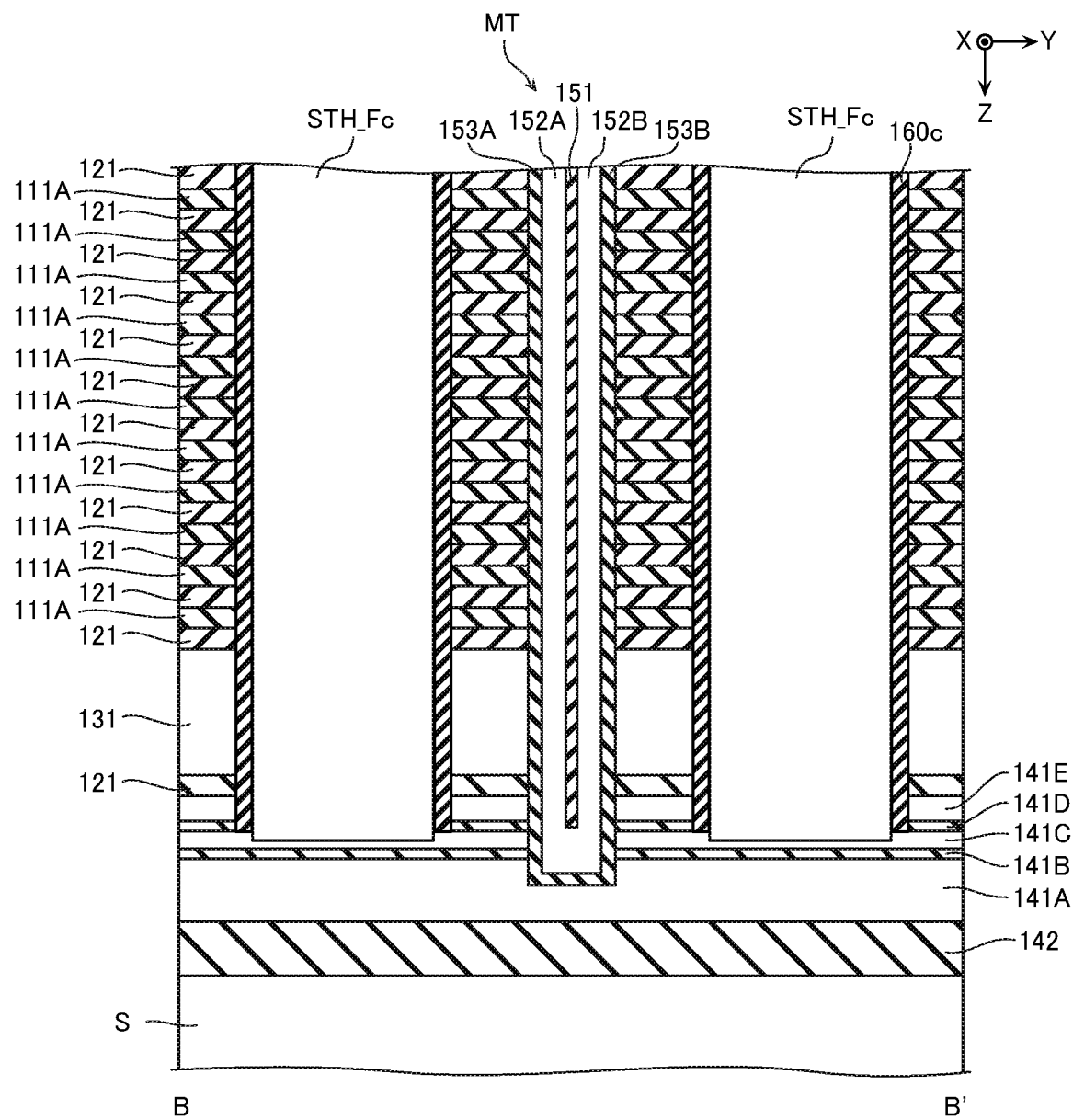
FIG. 32B is a schematic cross-sectional view illustrating a manufacturing method according to the comparative example.

Next, as illustrated in FIG. 32B, protecting layers 160c are formed on inner walls of the holes STH_Fc. For example, this step is performed by a method, such as CVD. As illustrated in FIG. 32B, the protecting layers 160c on the bottom surfaces of the holes STH_Fc are removed to expose semiconductor layers 140C. For example, this step is performed by a method, such as RIE.

Figure 32C:
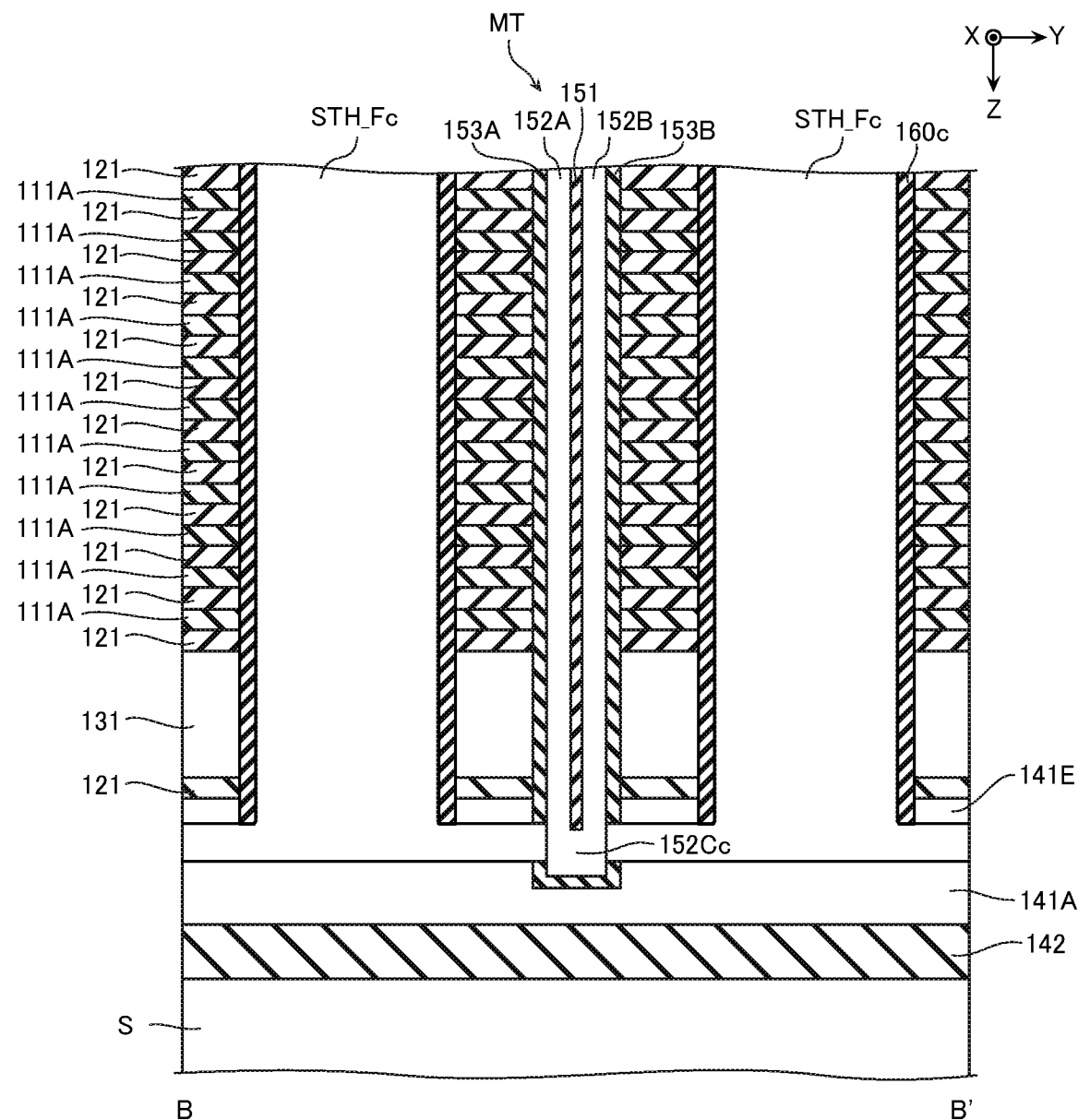
FIG. 32C is a schematic cross-sectional view illustrating a manufacturing method according to the comparative example.

Next, as illustrated in FIG. 32C, via the holes STH_Fc, the semiconductor layers 141C, the insulating layers 141B, the insulating layers 141D, and a part of the gate insulating layers 153A, 153B are removed to expose side surfaces of a semiconductor layer 152Cc.

Figure 32D:
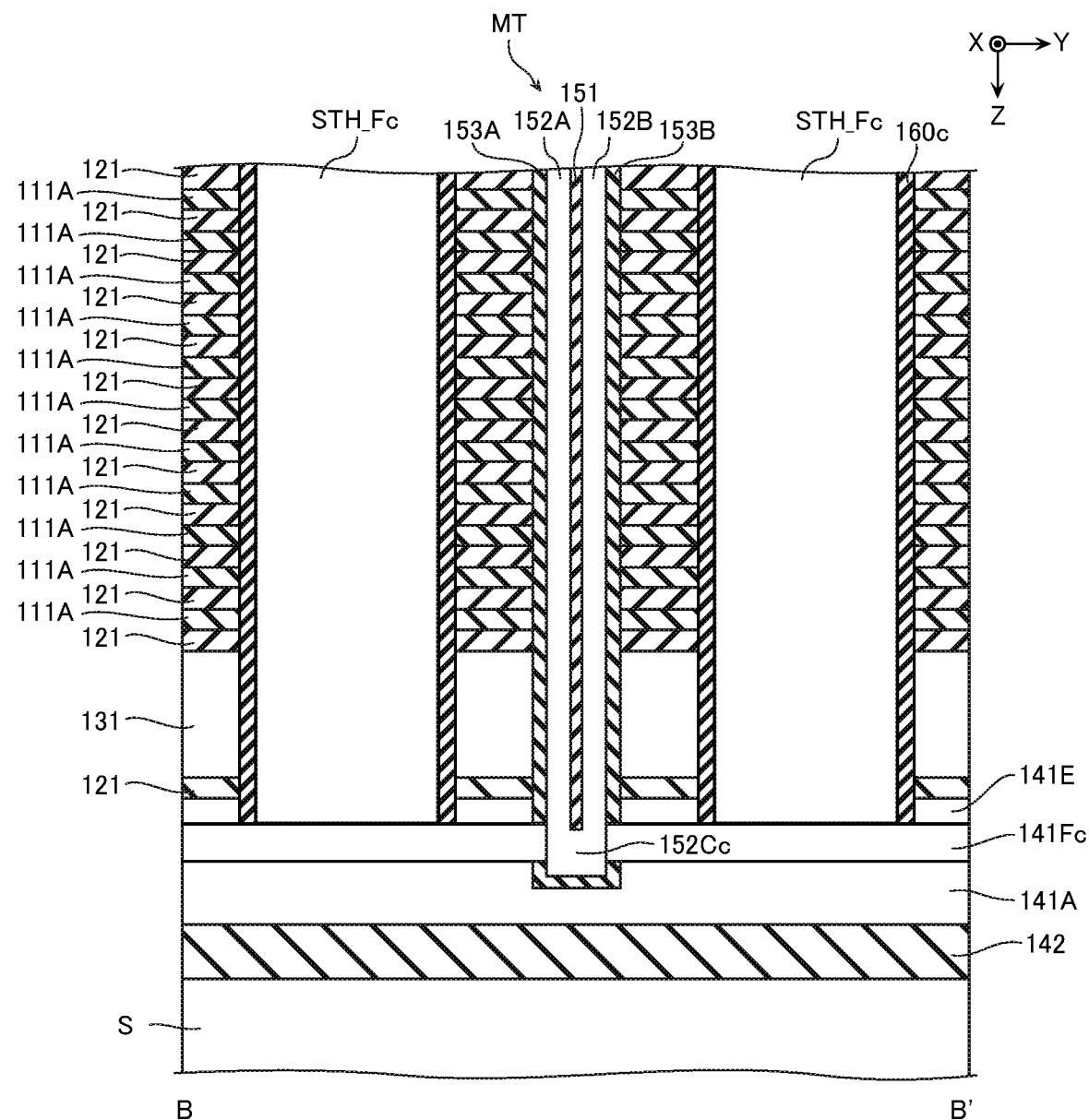
FIG. 32D is a schematic cross-sectional view illustrating a manufacturing method according to the comparative example.

Next, as illustrated in FIG. 32D, a semiconductor layer 141Fc is formed on the side surfaces of the exposed semiconductor layer 152Cc, the lower surfaces of the semiconductor layers 141E, and the semiconductor layer 141A. For example, this step is performed by a method, such as epitaxial growth.

[Effects of First Embodiment]

In the method for manufacturing the semiconductor memory device according to the comparative example, in the step illustrated in FIG. 32A, the hole STH_Fc need to have a depth equivalent to that of the opening op1 (FIG. 10). To form the deep hole, an inner diameter near the bottom portion of the hole becomes small in some cases. Additionally, in a process, such as dry etching and film formation, there may be a case where a gas or the like for the process is less likely to reach an intended position. In the case, for example, in the step illustrated in FIG. 32C, there may be a case where the semiconductor layers 141C, the insulating layers 141B, the insulating layers 141D, and a part of the gate insulating layers 153A, 153B cannot be preferably removed. Additionally, in the step illustrated in FIG. 32D, there may be a case where poor embedment or the like occurs and the semiconductor layers 141Fc cannot be preferably formed.

To solve the problems, for example, it is considered that a hole diameter of the hole STH_Fc is increased and the holes STH_Fc are formed at high density in the memory cell array MCA. However, in the case, the number of stacked structures MTi (FIG. 6A) functioning as the memory cells MC relatively decreases, and there may be a case where high integration of the memory cell array MCA becomes difficult.

Therefore, in the first embodiment, in the step that has been described with reference to FIG. 24, the holes STH_Ba are formed on the back surface of the second wafer W2. In the step that has been described with reference to FIG. 28 and FIG. 29, the semiconductor layers 141C, the insulating layers 141B, the insulating layers 141D, and the gate insulating layers 153A, 153B are removed via the holes STH_Ba. In the step that has been described with reference to FIG. 30, the semiconductor layers 141F are formed via the holes STH_Ba.

Here, while the hole STH_Fc (FIG. 32A) is the deep hole penetrating the plurality of sacrifice layers 111A and insulating layers 121, the hole STH_Ba (FIG. 24) is the shallow hole penetrating the insulating layer 142 and the semiconductor layer 141A. The holes STH_Ba allow forming the semiconductor layers 141F more preferably.

Second Embodiment

[Configuration]

Figure 33:
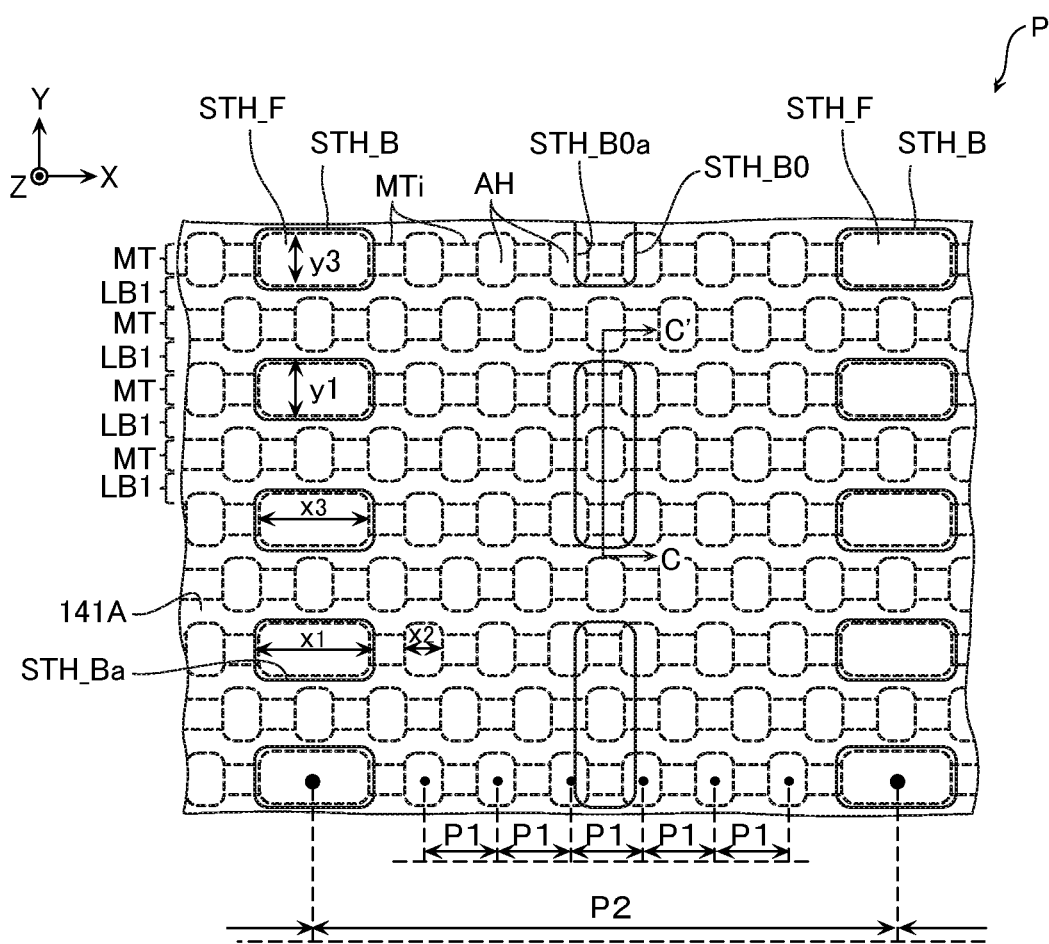
FIG. 33 is a schematic plan view of a semiconductor memory device according to a second embodiment.
Figure 34:
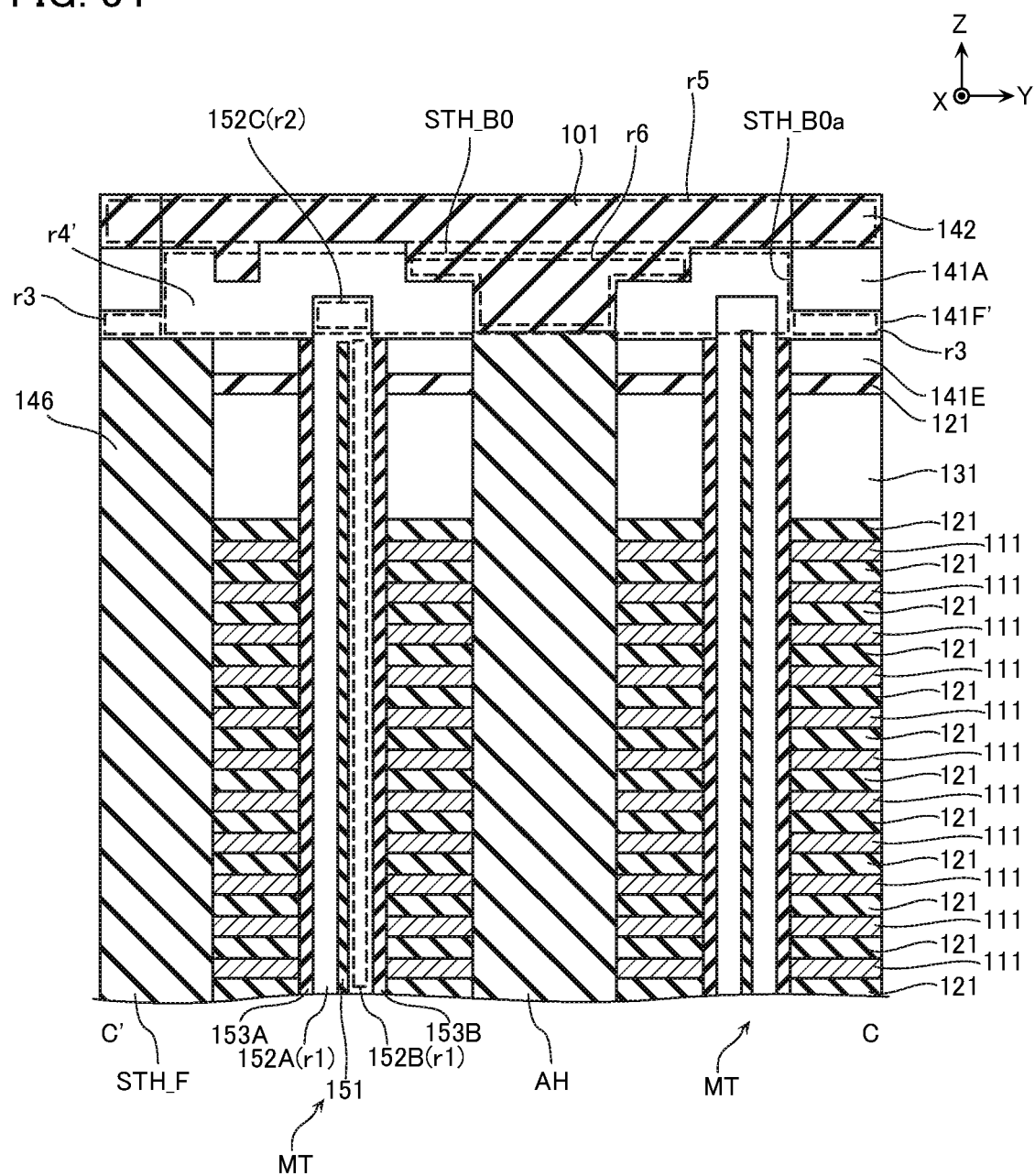
FIG. 34 is a schematic cross-sectional view of the semiconductor memory device.

Next, with reference to FIG. 33 and FIG. 34, the configuration of the semiconductor memory device according to the second embodiment will be described. FIG. 33 is a schematic plan view illustrating a part of a configuration of the semiconductor memory device according to the second embodiment. FIG. 34 is a schematic cross-sectional view taking the structure illustrated in FIG. 33 along the line C-C' and viewed in the arrow direction.

As illustrated in FIG. 33, the semiconductor memory device according to the embodiment is configured basically similarly to the semiconductor memory device according to the first embodiment. However, the semiconductor memory device according to the embodiment includes holes STH_B0a in addition to the holes STH_Ba. In addition to the hole structures STH_B, hole structures STH_B0 are included. The hole structure STH_B0 is configured basically similarly to the hole structure STH_B. However, the hole structures STH_B0 are disposed at positions not overlapping with the hole structures STH_F when viewed in the Z-direction. Therefore, a part of the stacked structure LB1 and the memory trench structure MT are disposed in the region where the hole structure STH_B0 is disposed.

As illustrated in FIG. 34, semiconductor layers 141F' according to the embodiment are configured basically similarly to the semiconductor layer 141F according to the first embodiment. However, the semiconductor layer 141F' according to the embodiment includes a region r4' disposed at a position corresponding to the hole STH_B0a, in addition to the regions r3, r4. The region r4' is in contact with an inner peripheral surface of the hole STH_B0a. The region r4' is connected to the top surfaces of the semiconductor layers 141E and the top surface and the outer peripheral surface of a part of the semiconductor layers 152C.

[Manufacturing Method]

Next, with reference to FIG. 35 to FIG. 41, the method for manufacturing the semiconductor memory device according to the embodiment will be described. FIG. 35 to FIG. 41 are schematic cross-sectional views corresponding to the part corresponding to FIG. 34.

The manufacturing method according to the embodiment performs, for example, the steps that have been described with reference to FIG. 8 to FIG. 22. However, in the step that has been described with reference to FIG. 14, the semiconductor layer 141A or the insulating layer 141B is not exposed but the semiconductor layer 141C is exposed.

Figure 35:
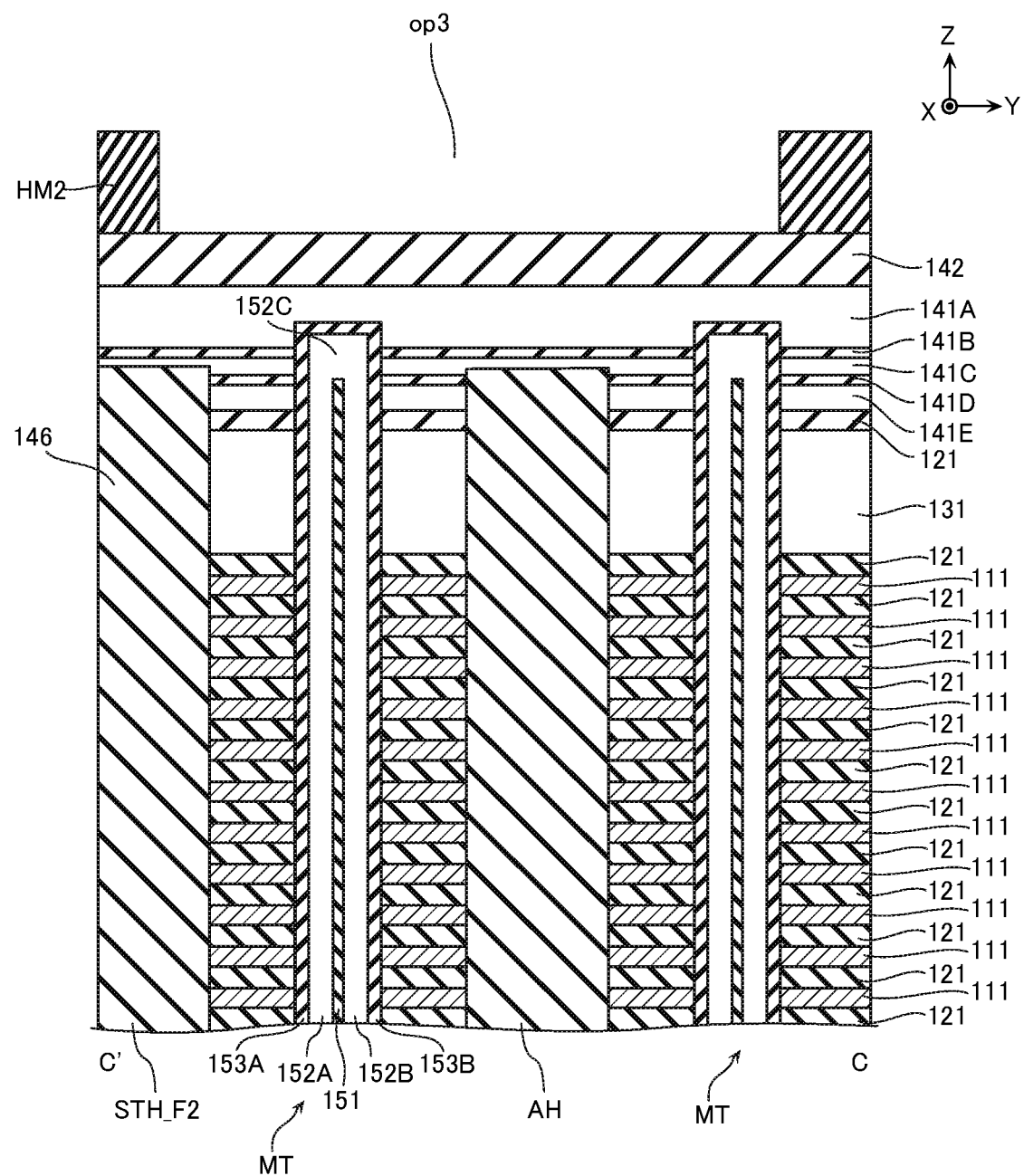
FIG. 35 is a schematic cross-sectional view illustrating the manufacturing method.

Next, as illustrated in FIG. 35, a hard mask HM2 is formed on the back surface of the second wafer W2 and an opening op3 is formed in the hard mask HM.

Figure 36:
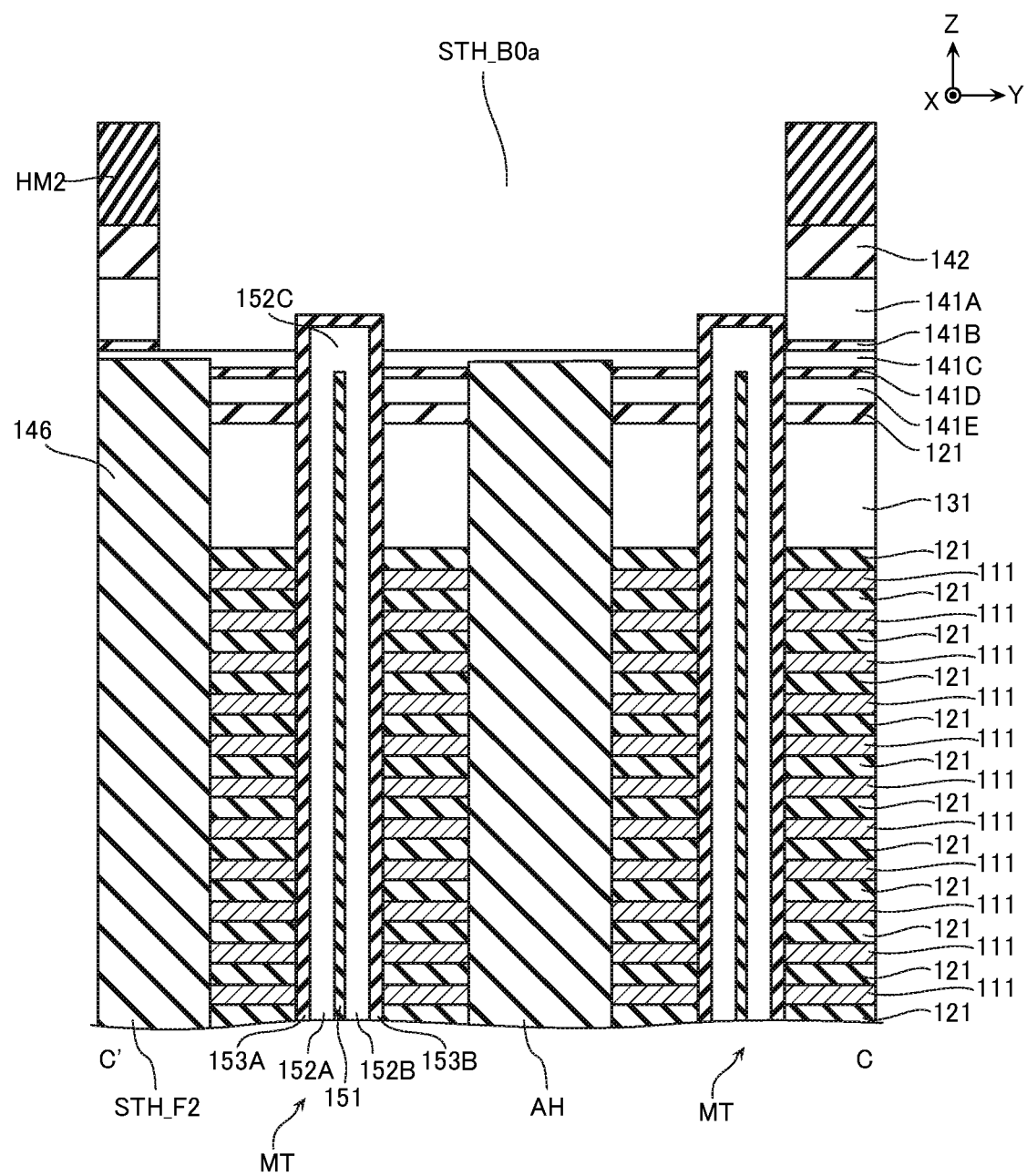
FIG. 36 is a schematic plan view illustrating the manufacturing method.

Next, as illustrated in FIG. 36, at the position corresponding to the opening op3, the insulating layer 142 is removed, subsequently the semiconductor layer 141A is removed, and then the insulating layer 141B is removed to form the hole STH_B0a. Since a film thickness of the insulating layer 141B is thinner than film thicknesses of the gate insulating layers 153A, 153B, in this step, the gate insulating layers 153A, 153B remain on the upper end portion of the memory trench structure MT. For example, this step is performed by a method, such as RIE.

Figure 37:
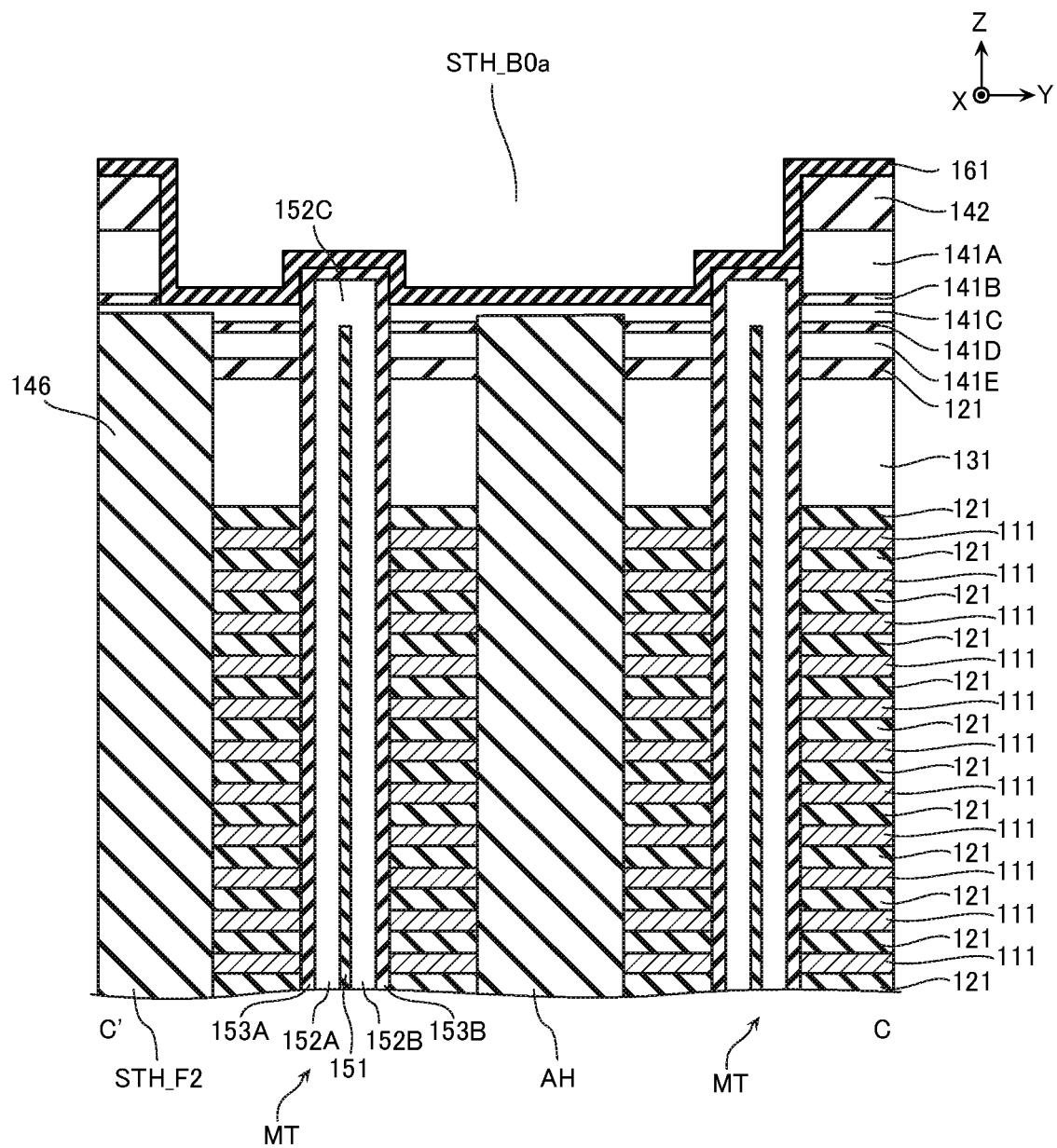
FIG. 37 is a schematic cross-sectional view illustrating the manufacturing method.

Next, as illustrated in FIG. 37, the hard masks HM2 are removed and a protecting layer 161 is formed on surfaces of the insulating layers 142, the semiconductor layers 141A, the semiconductor layers 141C, and the gate insulating layers 153A, 153B. The protecting layer 161 is, for example, an insulating material, such as silicon nitride.

Figure 38:
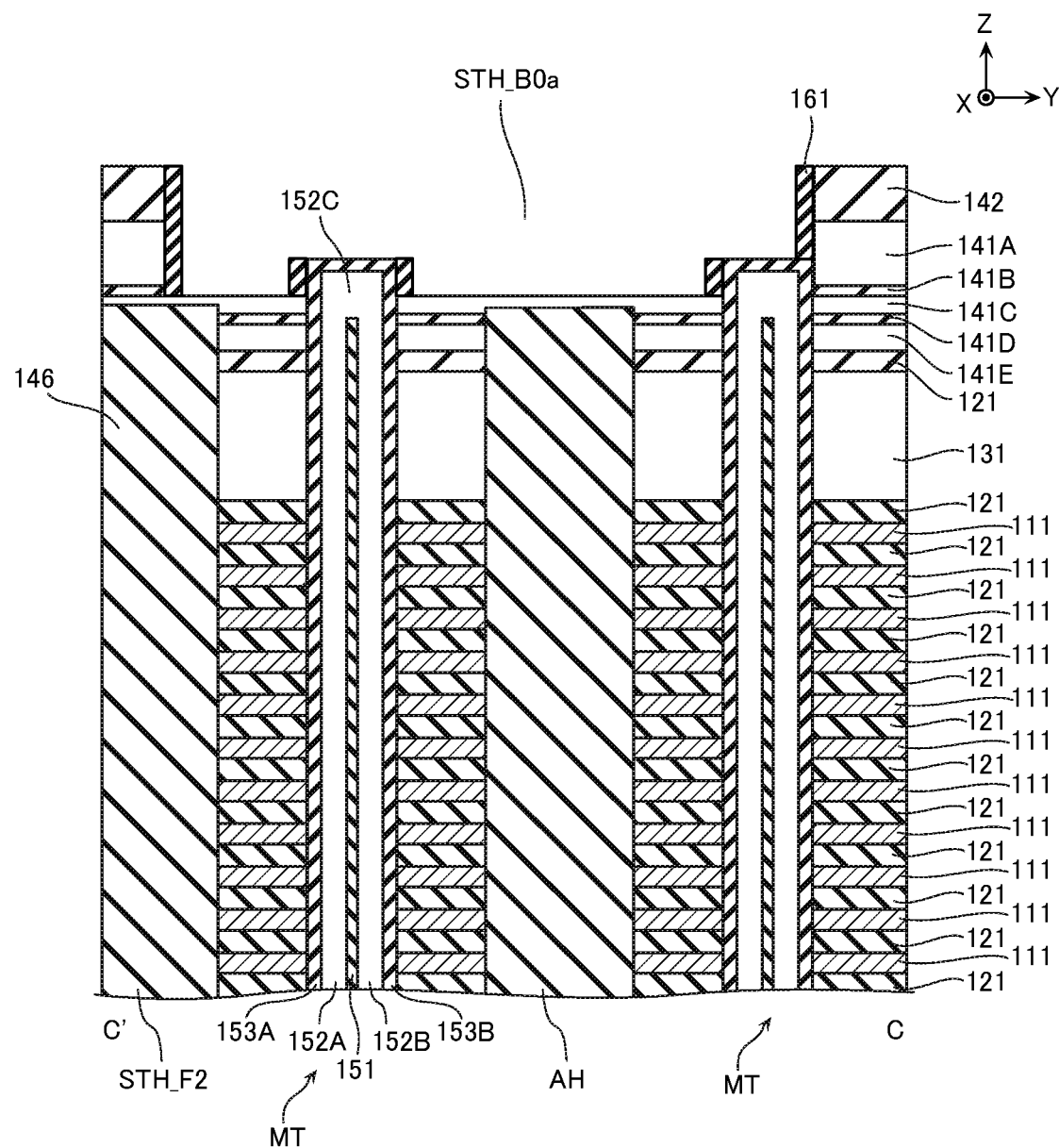
FIG. 38 is a schematic cross-sectional view illustrating the manufacturing method.

Next, as illustrated in FIG. 38, a part of the protecting layer 161 covering the top surfaces of the insulating layers 142, the semiconductor layers 141C, and the gate insulating layers 153A, 153B is removed.

Figure 39:
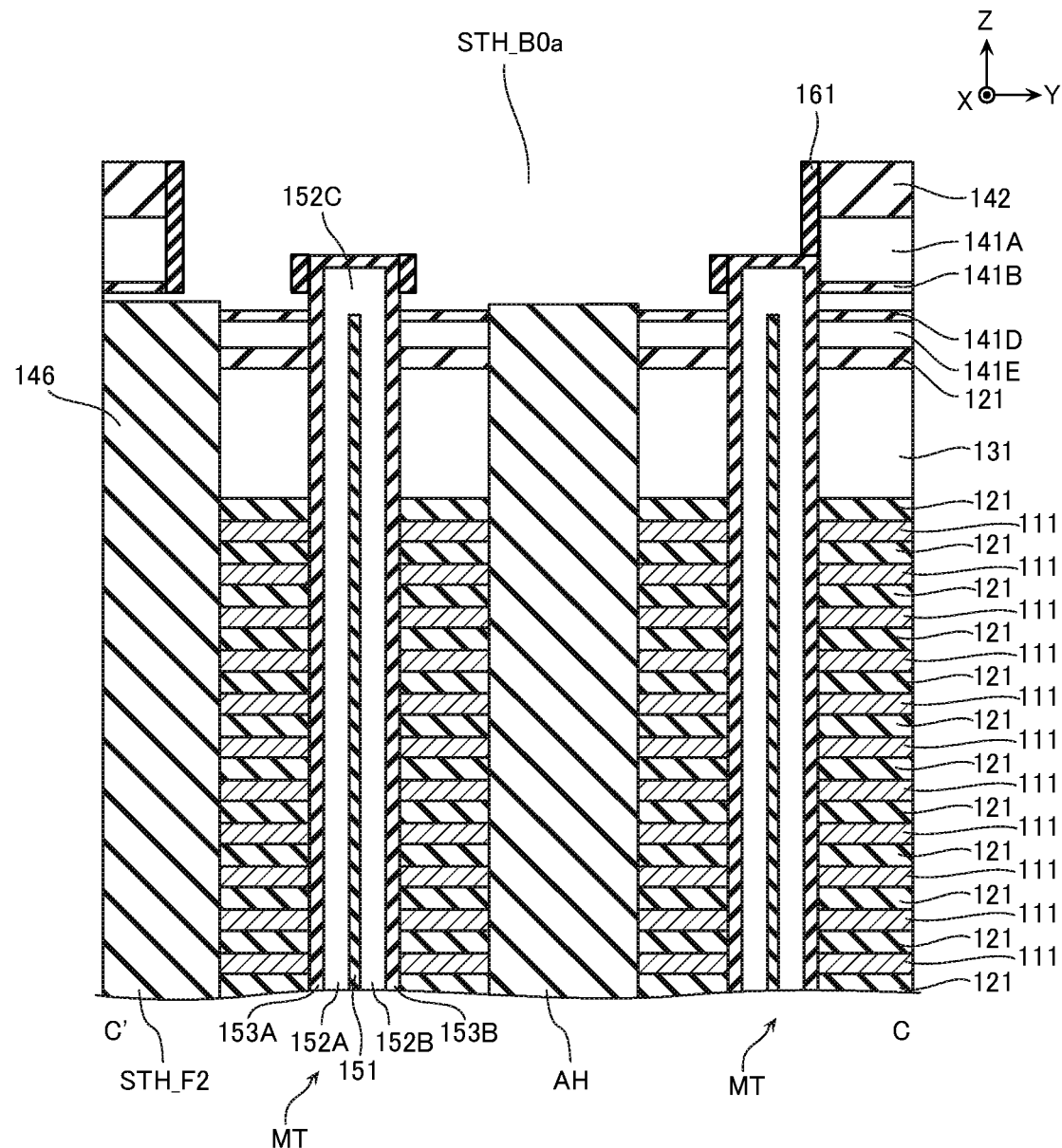
FIG. 39 is a schematic cross-sectional view illustrating the manufacturing method.

Next, as illustrated in FIG. 39, the semiconductor layers 141C are removed via the hole STH_B0a to expose a part of the gate insulating layers 153A, 153B on the upper portion of the memory trench structure MT.

Figure 40:
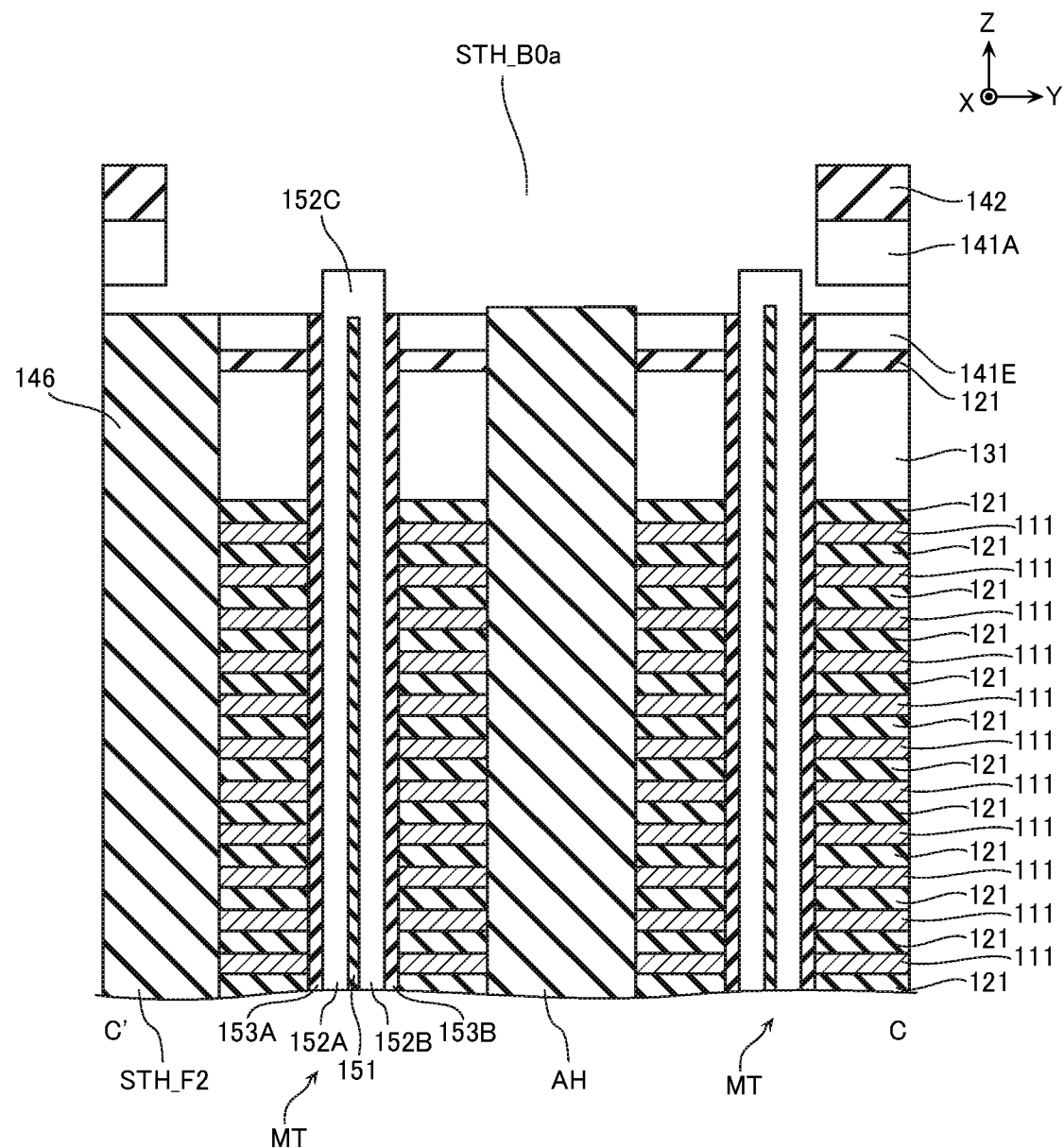
FIG. 40 is a schematic cross-sectional view illustrating the manufacturing method.

Next, as illustrated in FIG. 40, a part of the gate insulating layers 153A, 153B is removed via the hole STH_B0a and the cavities where the semiconductor layers 141C have been disposed to expose the surfaces of the semiconductor layers 152C. In this step, the insulating layers 141B, 141D, and the protecting layer 161 are also simultaneously removed to expose a part of the side surfaces and the lower surfaces of the semiconductor layers 141A and the top surfaces of the semiconductor layers 141E.

Figure 41:
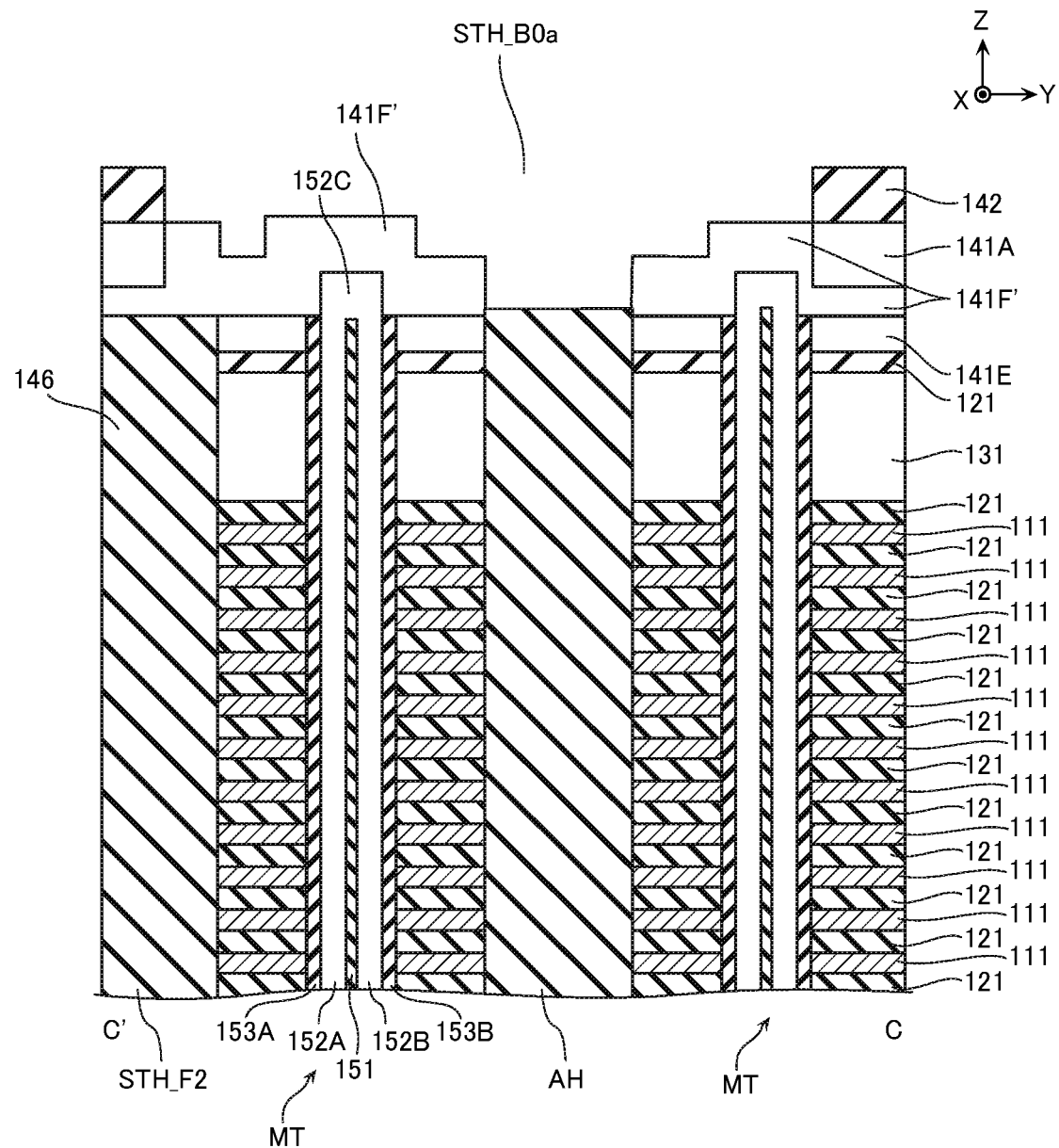
FIG. 41 is a schematic cross-sectional view illustrating the manufacturing method.

Next, as illustrated in FIG. 41, the semiconductor layers 141F' are formed on the side surfaces and the upper portions of the exposed semiconductor layers 152C, the top surfaces of the semiconductor layers 141E, and the side surfaces and the lower surfaces of the semiconductor layers 141A. For example, this step is performed by a method, such as epitaxial growth.

Next, as illustrated in FIG. 34, the insulating layer 101 is formed on the top surface of the structure illustrated in FIG. 41.

Next, as illustrated in FIG. 5C, the back side wiring MZ and the insulating layer 100 are formed on the insulating layer 101, the opening TV is formed in the insulating layer 100, and a part of the back side wiring MZ is configured as the external pad electrode PX. For example, this step is performed by film formation by CVD and by formation by etching or the like. By the above-described steps, the semiconductor memory device according to the second embodiment is formed.

[Effects of Second Embodiment]

The above-described holes STH_Fc (FIG. 32A) according to the comparative example are disposed in the layer same as the stacked structure MTi (FIG. 6A) that functions as the memory cell MC. Therefore, when the diameter of the hole STH_Fc is increased and the holes STH_Fc are disposed at high density, the number of stacked structures MTi (FIG. 6A) functioning as the memory cells MC relatively decreases, and there may be a case where high integration of the memory cell array MCA becomes difficult.

On the other hand, the hole STH_Ba (FIG. 24) according to the first embodiment is disposed above the stacked structure MTi (FIG. 6A). Therefore, even when the diameter of the hole STH_Ba is increased or the holes STH_Ba are disposed at high density, the number of stacked structures MTi does not decrease.

Therefore, in the second embodiment, the holes STH_B0a are disposed not only at the positions overlapping with the hole structures STH_F when viewed in the Z-direction but also at the positions not overlapping with the hole structure STH_F when viewed in the Z-direction. With this method, the semiconductor layers 141F can be further preferably formed.

Example of Arrangement of Hole Structures STH_B or the Like

As illustrated as an example in the second embodiment, the holes STH_B0a (FIG. 33) and the hole structures STH_B0 (FIG. 33), which are formed inside the holes STH_B0a, can be arranged in a various kinds of aspects regardless of the arrangements of the hole structures STH_F, the stacked structures MTi, and the like. The size and the shape of the hole STH_Ba and the hole structure STH_B0 are adjustable in various kinds of aspects.

Figure 42:
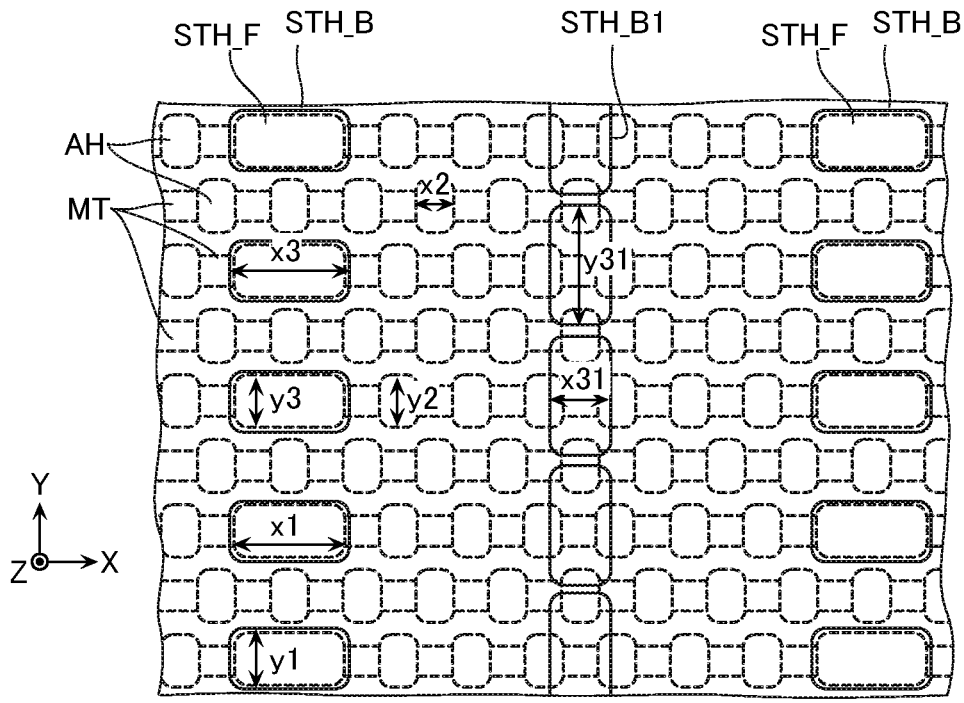
FIG. 42 is a schematic plan view illustrating a part of a configuration of a first modification of the semiconductor memory device according to the second embodiment.

For example, the semiconductor memory device illustrated in FIG. 42 as an example includes the hole structures STH_B and hole structures STH_B1. The hole structure STH_B1 is one aspect of the hole structure STH_B0 according to the second embodiment. The hole structures STH_B1 are each disposed between the two hole structures STH_B adjacent in the X-direction and arrayed in the Y-direction. Widths x31, y31 in the X-direction and the Y-direction of the hole structure STH_B1 have sizes similar to the widths y1, x1 in the Y-direction and the X-direction of the hole structure STH_F, respectively.

Figure 43:
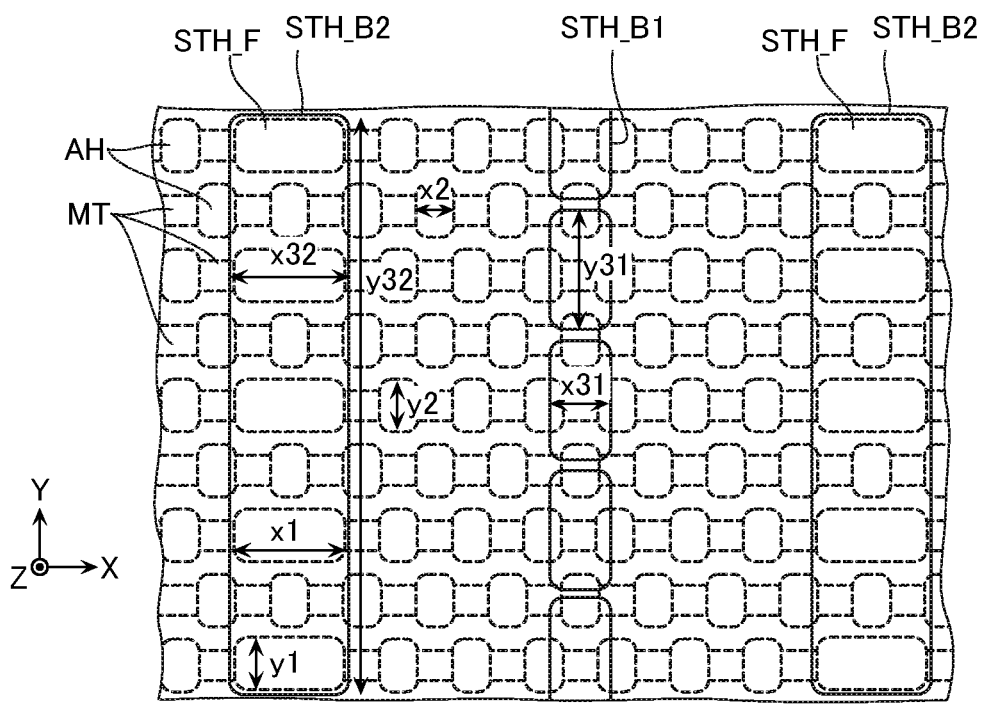
FIG. 43 is a schematic plan view illustrating a part of a configuration of a second modification of the semiconductor memory device according to the second embodiment.

For example, a semiconductor memory device illustrated in FIG. 43 as an example includes the hole structures STH_B1 and hole structures STH_B2. The hole structure STH_B2 is one aspect of the hole structure STH_B0 according to the second embodiment. The plurality of hole structures STH_B2 are arrayed in the X-direction. The hole structures STH_B2 extend in the Y-direction and are disposed at regions corresponding to the plurality of hole structures STH_F arranged in the Y-direction. That is, when viewed in the Z-direction, the hole structures STH_B2 are disposed in the regions overlapping with the plurality of hole structure STH_F arranged in the Y-direction. A width x32 in the X-direction of the hole structure STH_B2 has a size similar to the width x1 in the X-direction of the hole structure STH_F. A width y32 in the Y-direction of the hole structure STH_B2 has a size about several times of the width x1 in the X-direction of the hole structure STH_F.

Figure 44:
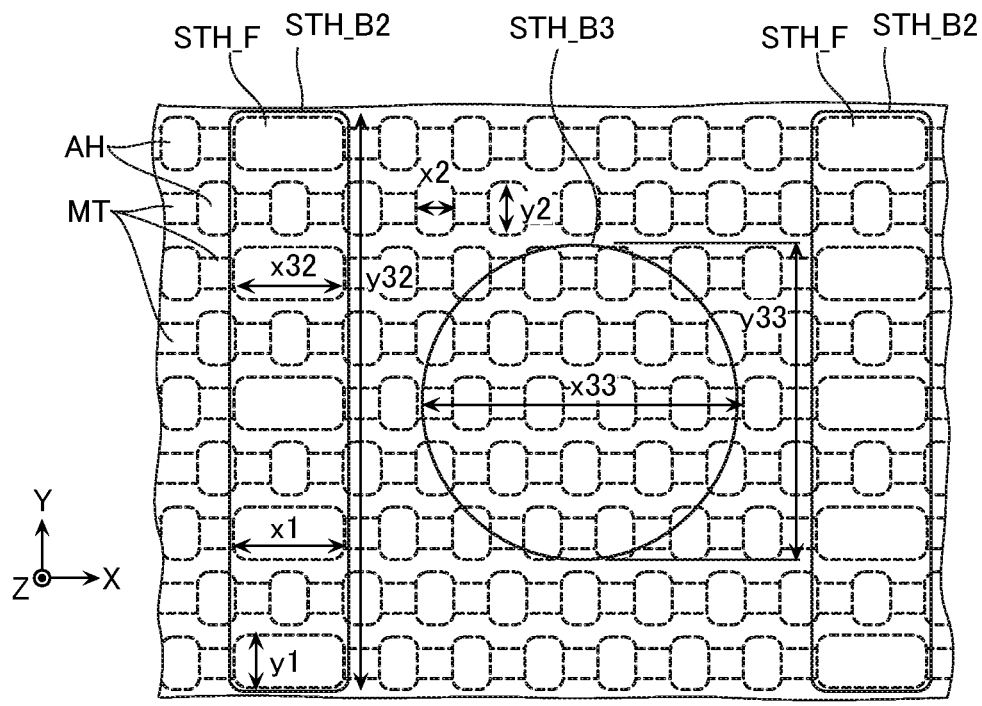
FIG. 44 is a schematic plan view illustrating a part of a configuration of a third modification of the semiconductor memory device according to the second embodiment.

For example, a semiconductor memory device illustrated in FIG. 44 as an example includes the hole structures STH_B2 and a hole structure STH_B3. The hole structure STH_B3 is one aspect of the hole structure STH_B0 according to the second embodiment. The hole structure STH_B3 has a substantially circular shape and is disposed in a region corresponding to a part of the plurality of memory trench structures MT arranged in the Y-direction. That is, when viewed in the Z-direction, the hole structure STH_B3 is disposed at the position overlapping with the plurality of memory trench structures MT arranged in the Y-direction. A width x33 in the X-direction of the hole structure STH_B3 has a size around several times of the width x1 in the X-direction of the hole structure STH_F. A width y33 in the Y-direction of the hole structure STH_B3 has a size around several times of the width x1 in the X-direction of the hole structure STH_F.

Figure 45:
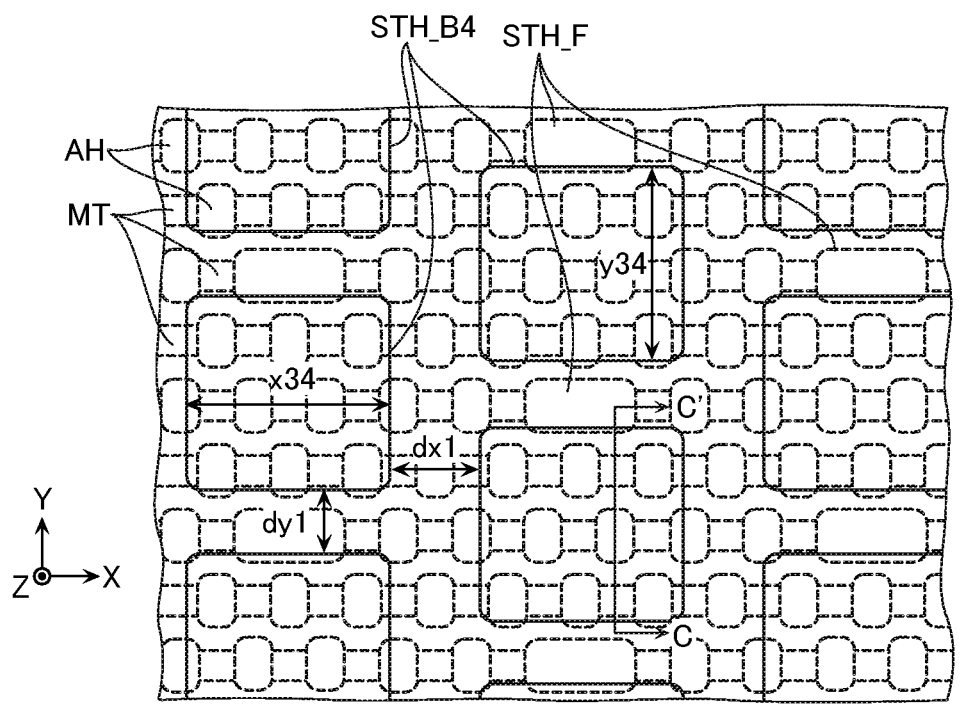
FIG. 45 is a schematic plan view illustrating a part of a configuration of a fourth modification of the semiconductor memory device according to the second embodiment.

For example, a semiconductor memory device illustrated in FIG. 45 as an example includes a plurality of hole structures STH_B4 arranged in a staggered pattern. The hole structure STH_B4 has a substantially rectangular shape. A width x34 in the X-direction of the hole structure STH_B4 is larger than the width x1 in the X-direction of the hole structure STH_F. The width x34 is larger than a shortest distance dx1 between the two hole structures STH_B4 adjacent in the X-direction. A width y34 in the Y-direction of the hole structure STH_B4 is larger than the width x1 in the X-direction of the hole structure STH_F. The width y34 is larger than a shortest distance dy1 between the two hole structures STH_B4 adjacent in the Y-direction.

The structures illustrated in FIG. 42 to FIG. 45 as examples are merely examples, and the specific aspects are appropriately adjustable. For example, the structure in the X-Y cross-sectional surface of the hole structure STH_B can be adjusted in various shapes, for example, a circular shape, a rectangular shape, a square shape, an oval shape, a race track shape, or the like.

Other Embodiments

The semiconductor memory devices according to the first embodiment and the second embodiment have been exemplified above. However, the above-described configurations are merely examples, and the specific configurations are appropriately adjustable.

Figure 46:
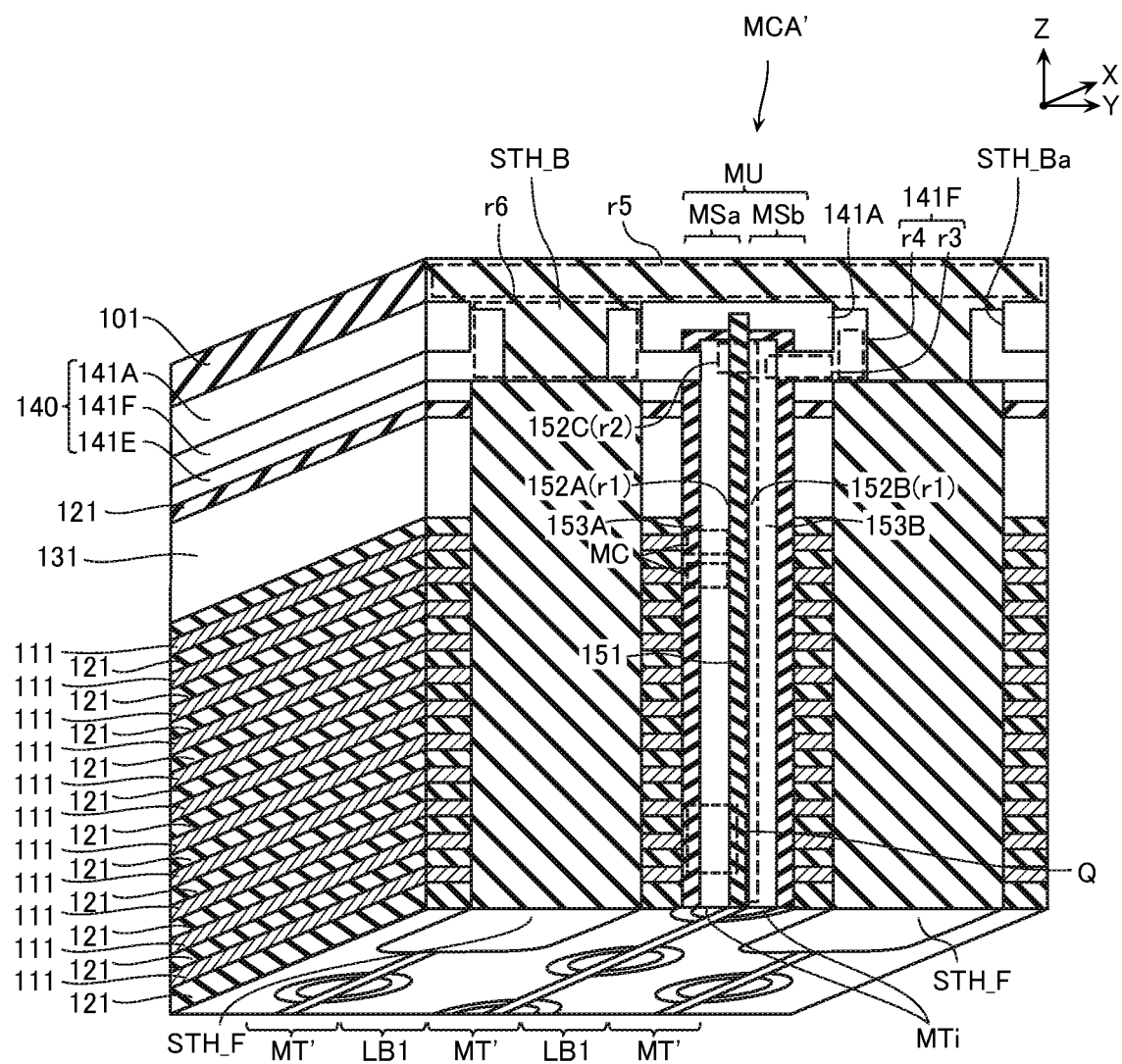
FIG. 46 is a schematic plan view of a semiconductor memory device according to another embodiment.

For example, in the memory cell array MCA illustrated in FIG. 6A as an example, the memory trench structure MT includes a plurality of wide-width portions and narrow-width portions arranged in the X-direction, and the memory cells MC (stacked structures MTi) are disposed in the narrow-width portions. However, the configuration is merely an example, and the specific configuration is appropriately adjustable. For example, in a memory cell array MCA' illustrated in FIG. 46 as an example, a memory trench structure MT' includes a plurality of wide-width portions and narrow-width portions arranged in the X-direction, and the wide-width portion include the memory cells MC (stacked structures MTi).

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising a first chip and a second chip connected to one another, wherein
the first chip includes:
a semiconductor substrate; and
a plurality of transistors disposed on a surface of the semiconductor substrate, wherein
the second chip includes:
a plurality of first conductive layers arranged in a first direction intersecting with the surface of the semiconductor substrate, the plurality of first conductive layers extending in a second direction intersecting with the first direction;
a plurality of first semiconductor layers arranged in the second direction and extending in the first direction, the plurality of first semiconductor layers including a first region and a second region, the first region being opposed to the plurality of first conductive layers, the second region being farther from the semiconductor substrate than the plurality of first conductive layers;
a plurality of memory cells disposed in intersection portions of the plurality of first conductive layers and the respective first regions of the plurality of first semiconductor layers;
a second semiconductor layer that is farther from the semiconductor substrate than the plurality of first conductive layers, the second semiconductor layer being connected to the respective second regions of the plurality of first semiconductor layers and extending in the second direction; and
a first insulating layer that includes a first part and a second part, the first part being farther from the semiconductor substrate than a surface on a side opposite to the semiconductor substrate of the second semiconductor layer, the second part being closer to the semiconductor substrate than the surface on the side opposite to the semiconductor substrate of the second semiconductor layer.

2. The semiconductor memory device according to claim 1, wherein
the second semiconductor layer includes:
a third semiconductor layer that is farther from the semiconductor substrate than the plurality of first conductive layers, the third semiconductor layer being connected to the respective second regions of the plurality of first semiconductor layers and extending in the second direction; and
a fourth semiconductor layer that is farther from the semiconductor substrate than the third semiconductor layer, the fourth semiconductor layer being connected to the second semiconductor layer and extending in the second direction, wherein
the first part of the first insulating layer is connected to the fourth semiconductor layer, and
the second part of the first insulating layer is connected to the third semiconductor layer.

3. The semiconductor memory device according to claim 2, wherein
- a part of the plurality of first semiconductor layers is disposed at a position overlapping with the fourth semiconductor layer when viewed in the first direction, and
- another part of the plurality of first semiconductor layers is disposed at a position not overlapping with the fourth semiconductor layer when viewed in the first direction.

4. The semiconductor memory device according to claim 3, further comprising
- a gate insulating film disposed between the first semiconductor layer and the plurality of first conductive layers, wherein
- a part of the gate insulating film is disposed on an end portion on a side opposite to the semiconductor substrate in the first direction of the first semiconductor layer, and the first semiconductor layer is disposed at the position overlapping with the fourth semiconductor layer when viewed in the first direction among the plurality of first semiconductor layers, and
- a part of the gate insulating film is not disposed on an end portion on a side opposite to the semiconductor substrate in the first direction of the first semiconductor layer, and the first semiconductor layer is disposed at the position not overlapping with the fourth semiconductor layer when viewed in the first direction among the plurality of first semiconductor layers.

5. The semiconductor memory device according to claim 2, further comprising:
- a second insulating layer extending in the first direction, the second insulating layer being connected to the plurality of first conductive layers; and
- a third insulating layer extending in the first direction, the third insulating layer being connected to the plurality of first conductive layers, wherein
- the third insulating layer has a width in the second direction larger than a width in the second direction of the second insulating layer, and
- at least a part of the third insulating layer is disposed at a position not overlapping with the fourth semiconductor layer when viewed in the first direction.

6. The semiconductor memory device according to claim 2, further comprising:
- a second insulating layer extending in the first direction, the second insulating layer being connected to the plurality of first conductive layers; and
- a third insulating layer extending in the first direction, the third insulating layer being connected to the plurality of first conductive layers, wherein
- the third insulating layer has a width in the second direction larger than a width in the second direction of the second insulating layer, and
- the third insulating layer is disposed at a position overlapping with the fourth semiconductor layer when viewed in the first direction.

7. The semiconductor memory device according to claim 1, wherein
- the second chip includes a plurality of second conductive layers, the plurality of second conductive layers being arranged in the first direction and extending in the second direction, the plurality of second conductive layers being separated from the plurality of first conductive layers in a third direction intersecting with the first direction and the second direction,
- the plurality of first semiconductor layers include a third region opposed to the plurality of second conductive layers, and
- a plurality of second memory cells are disposed in intersecting portions of the plurality of second conductive layers and the respective third regions of the plurality of first semiconductor layers.

8. The semiconductor memory device according to claim 7, further comprising
- a plurality of second insulating layers that extend in the first direction, the respective plurality of second insulating layers being disposed between the plurality of first semiconductor layers arranged in the second direction between the plurality of first conductive layers and the plurality of second conductive layers, wherein
- a part of the plurality of second insulating layers is disposed at a position overlapping with the second part of the first insulating layer when viewed in the first direction, and
- another part of the plurality of second insulating layers is disposed at a position not overlapping with the second part of the first insulating layer when viewed in the first direction.

9. The semiconductor memory device according to claim 8, wherein
- a part of the plurality of second insulating layers is not connected to the second part of the first insulating layer, and
- another part of the plurality of second insulating layers is connected to the second part of the first insulating layer.

10. The semiconductor memory device according to claim 7, wherein
the second semiconductor layer includes:
- a third semiconductor layer that is farther from the semiconductor substrate than the plurality of first conductive layers, the third semiconductor layer being connected to the respective second regions of the plurality of first semiconductor layers and extending in the second direction; and
- a fourth semiconductor layer that is farther from the semiconductor substrate than the third semiconductor layer, the fourth semiconductor layer being connected to the second semiconductor layer and extending in the second direction, wherein
the first part of the first insulating layer is connected to the fourth semiconductor layer, and
the second part of the first insulating layer is connected to the third semiconductor layer.

11. The semiconductor memory device according to claim 10, wherein
- a part of the plurality of first semiconductor layers is disposed at a position overlapping with the fourth semiconductor layer when viewed in the first direction, and
- another part of the plurality of first semiconductor layers is disposed at a position not overlapping with the fourth semiconductor layer when viewed in the first direction.

12. The semiconductor memory device according to claim 11, further comprising
- a gate insulating film disposed between the first semiconductor layer and the plurality of first conductive layers, the gate insulating film being disposed between the first semiconductor layer and the plurality of second conductive layers wherein
- a part of the gate insulating film is disposed on an end portion on a side opposite to the semiconductor substrate in the first direction of the first semiconductor layer, and the first semiconductor layer is disposed at the position overlapping with the fourth semiconductor layer when viewed in the first direction among the plurality of first semiconductor layers, and a part of the gate insulating film is not disposed on an end portion on a side opposite to the semiconductor substrate in the first direction of the first semiconductor layer, and the first semiconductor layer is disposed at the position not overlapping with the fourth semiconductor layer when viewed in the first direction among the plurality of first semiconductor layers.

13. The semiconductor memory device according to claim 10, further comprising a plurality of second insulating layers that extend in the first direction, the respective plurality of second insulating layers being disposed between the plurality of first semiconductor layers arranged in the second direction between the plurality of first conductive layers and the plurality of second conductive layers, wherein a part of the plurality of second insulating layers is disposed at a position overlapping with the fourth semiconductor layer when viewed in the first direction, and another part of the plurality of second insulating layers is disposed at a position not overlapping with the fourth semiconductor layer when viewed in the first direction.

14. The semiconductor memory device according to claim 1, further comprising a gate insulating film disposed between the first semiconductor layer and the plurality of first conductive layers, wherein a part of the gate insulating film is disposed on an end portion on a side opposite to the semiconductor substrate in the first direction of a part of the plurality of first semiconductor layers, and a part of the gate insulating film is not disposed on an end portion on a side opposite to the semiconductor substrate in the first direction of a part of the plurality of first semiconductor layers.

* * * * *